United States Patent
Iwata et al.

(10) Patent No.: US 12,249,616 B2
(45) Date of Patent: Mar. 11, 2025

(54) PHOTOELECTRIC CONVERSION APPARATUS, PHOTOELECTRIC CONVERSION SYSTEM, AND MOVABLE BODY

(71) Applicant: CANON KABUSHIKI KAISHA, Tokyo (JP)

(72) Inventors: Junji Iwata, Tokyo (JP); Kazuhiro Morimoto, Kanagawa (JP); Yu Maehashi, Hokkaido (JP); Yoshiyuki Hayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/762,207

(22) Filed: Jul. 2, 2024

(65) Prior Publication Data

US 2024/0355856 A1    Oct. 24, 2024

Related U.S. Application Data

(63) Continuation of application No. PCT/JP2022/000055, filed on Jan. 5, 2022.

(51) Int. Cl.
*H01L 27/146* (2006.01)
*H04N 25/705* (2023.01)
*H04N 25/76* (2023.01)

(52) U.S. Cl.
CPC .. *H01L 27/14634* (2013.01); *H01L 27/14636* (2013.01); *H04N 25/705* (2023.01); *H04N 25/7795* (2023.01)

(58) Field of Classification Search
CPC ......... H01L 27/14634; H01L 27/14636; H01L 27/146; H04N 25/705; H04N 25/7795
See application file for complete search history.

(56) References Cited

U.S. PATENT DOCUMENTS

| | | | |
|---|---|---|---|
| 10,944,933 B2* | 3/2021 | Kobayashi | H04N 25/772 |
| 11,658,197 B2* | 5/2023 | Iwata | G01S 17/931 |
| | | | 257/186 |
| 2015/0115131 A1 | 4/2015 | Webster | |

FOREIGN PATENT DOCUMENTS

| | | |
|---|---|---|
| JP | 2016040847 A | 3/2016 |
| JP | 2017174994 A | 9/2017 |
| JP | 2021002542 A | 1/2021 |
| WO | 2018186192 A1 | 10/2018 |
| WO | 2019146723 A1 | 8/2019 |
| WO | 2020045122 A1 | 3/2020 |

* cited by examiner

*Primary Examiner* — Seung C Sohn
(74) *Attorney, Agent, or Firm* — Canon U.S.A., Inc. I.P. Division

(57) ABSTRACT

A photoelectric conversion apparatus includes a first substrate including a plurality of avalanche photodiodes, a second substrate including a plurality of pixel circuits, and a third substrate including a signal processing circuit, wherein the second substrate and the third substrate are stacked in such a manner that a third wiring structure is disposed between two semiconductor layers included in the second substrate and the third substrate, with a first through wire penetrating through the semiconductor layer included in the third substrate is disposed.

20 Claims, 48 Drawing Sheets

FIG.45B
FRONT VIEW
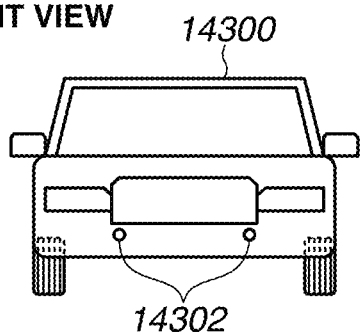
TOP VIEW
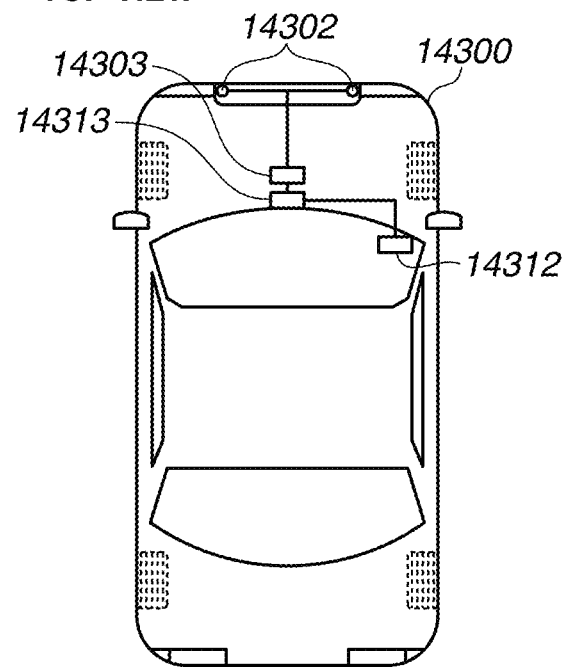
REAR VIEW
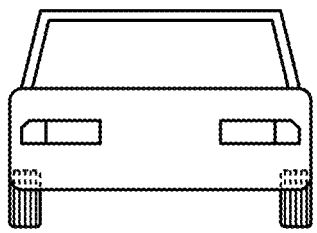

PHOTOELECTRIC CONVERSION APPARATUS, PHOTOELECTRIC CONVERSION SYSTEM, AND MOVABLE BODY

CROSS-REFERENCE TO RELATED APPLICATIONS

This application is a Continuation of International Patent Application No. PCT/JP2022/000055, filed Jan. 5, 2022, which is hereby incorporated by reference herein in its entirety.

BACKGROUND

Field of the Disclosure

The present disclosure relates to a photoelectric conversion apparatus, a photoelectric conversion system, and a movable body.

Background Art

Some photoelectric conversion apparatuses include a pixel array in which pixels including a plurality of avalanche photodiodes (hereinafter, will be referred to as APDs) are planarly arranged in a two-dimensional array. In each pixel, a reverse bias voltage is applied to a P-N junction diode, which causes avalanche multiplication of photoinduced charges caused by single photons. The APDs have at least two operation modes. Under a situation where reverse bias voltages are supplied, the photoelectric conversion apparatus are operated in Geiger mode in which an anode-cathode potential difference is larger than a breakdown voltage, or Linear mode in which an anode-cathode potential difference is near a breakdown voltage or smaller than or equal to the breakdown voltage. Among the APDs, an APD operated in Geiger mode will be referred to as a single photon avalanche diode (SPAD).

FIG. 3B of United States Patent Application Publication No. 2015/0115131 illustrates a photoelectric conversion apparatus in which a first substrate includes an SPAD array, a second substrate includes a counter, and a third substrate includes a storage, and the first substrate, the second substrate, and the third substrate are stacked.

CITATION LIST

Patent Literature

PTL 1: United States Patent Application Publication No. 2015/0115131

Although the photoelectric conversion apparatus discussed in United States Patent Application Publication No. 2015/0115131 has the configuration in which the first substrate, the second substrate, and the third substrate are stacked, a wiring structure that electrically connects the second substrate and the third substrate has not been considered.

SUMMARY

In view of the foregoing, the present disclosure is directed to proposing a specific configuration of a photoelectric conversion apparatus including three or more substrates including avalanche photodiodes. According to an aspect of the present disclosure, a photoelectric conversion apparatus includes a first substrate including a first semiconductor layer including a plurality of photoelectric conversion units and a first wiring structure, a second substrate including a second semiconductor layer including a plurality of pixel circuits disposed to respectively correspond to the plurality of photoelectric conversion units, and a second wiring structure, and a third substrate including a third semiconductor layer including a signal processing circuit configured to process output signals from the plurality of pixel circuits, and a third wiring structure, wherein the plurality of photoelectric conversion units each includes an avalanche photodiode, wherein the first substrate and the second substrate are stacked in such a manner that the first wiring structure and the second wiring structure are disposed between the first semiconductor layer and the second semiconductor layer, wherein the second substrate and the third substrate are stacked in such a manner that the third wiring structure is disposed between the second semiconductor layer and the third semiconductor layer, and wherein a first through wire penetrating through the third semiconductor layer and a semiconductor element overlapping the first through wire in a planar view are disposed.

Further features of the present disclosure will become apparent from the following description of exemplary embodiments with reference to the attached drawings.

BRIEF DESCRIPTION OF THE DRAWINGS

FIG. 45B is a diagram of the photoelectric conversion system and the movable body according to the twenty-first exemplary embodiment.

DESCRIPTION OF THE EMBODIMENTS

Figure 1:
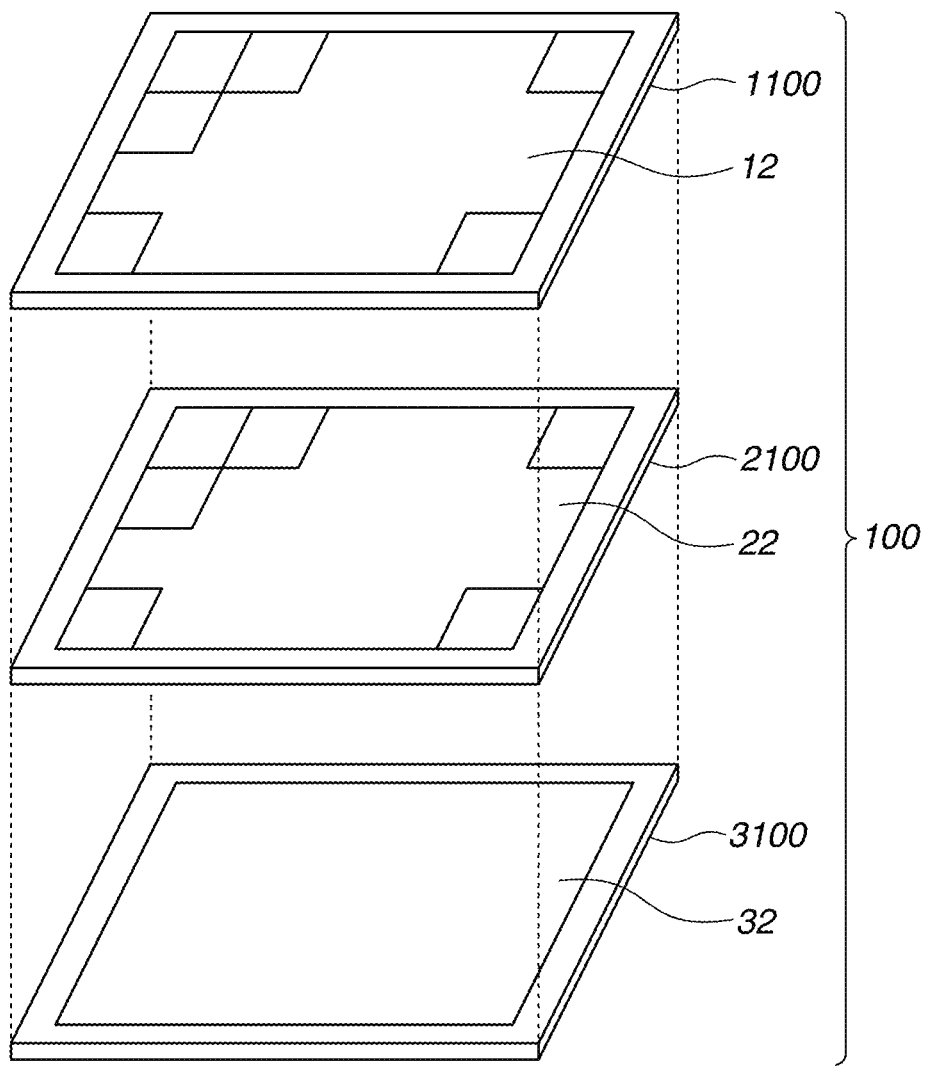
FIG. 1 is a block diagram of a photoelectric conversion apparatus.

Exemplary embodiments described below are intended to embody the technical idea of the present disclosure, and do not limit the present disclosure. The size and positional relationship of members shown in each drawing may be exaggerated for the sake of clarity. In the following description, the same components are denoted by the same reference numerals, and the description thereof may be omitted.

The following configuration relates particularly to a photoelectric conversion apparatus including a single photon avalanche diode (SPAD) that counts the number of photons entering an avalanche diode. The photoelectric conversion apparatus at least includes an avalanche diode.

In the following description, the anode of an avalanche diode is at a fixed potential, and a signal is extracted from the cathode side. Thus, a semiconductor region of a first conductivity type in which charges having the same conductivity type as that of signal charges are majority carriers is an N-type semiconductor region, and a semiconductor region of a second conductivity type is a P-type semiconductor region. Even in a case where a cathode of an avalanche diode is at a fixed potential, and a signal is extracted from an anode side, the present disclosure can be realized. In this case, the semiconductor region of the first conductivity type in which charges of the same conductivity type as that of signal charges are a majority carrier is the P-type semiconductor region, and the semiconductor region of the second conductivity type is the N-type semiconductor region. While a description will be given of a case where one of the nodes of an avalanche diode is at a fixed potential, the potentials of both nodes may be variable.

In this specification, a planar view refers to a view from a direction vertical to a light incidence surface of a semiconductor layer. In addition, a cross section refers to a surface in the direction vertical to the light incidence surface of the semiconductor layer. In a case where the light incidence surface of the semiconductor layer is a rough surface when viewed microscopically, a planar view is defined based on a light incidence surface of a semiconductor layer that is viewed macroscopically.

First Exemplary Embodiment

FIG. 1 is a diagram illustrating an entire view of a photoelectric conversion apparatus 100. A first substrate 1100 is also called a sensor chip in which a pixel region 12 where pixels including photoelectric conversion units are two-dimensionally arranged is disposed. A region between the pixel region 12 and a chip end of the photoelectric conversion apparatus 100 is a peripheral region 13. A second substrate 2100 is also called a pixel circuit chip in which a pixel circuit region 22 where pixel circuits that process signals from the photoelectric conversion units are arranged is disposed. A third substrate 3100 is also called a signal processing chip in which a signal processing circuit region 32 where signal processing circuits for processing signals from the pixel circuits are arranged is disposed. The first substrate 1100, the second substrate 2100, and the third substrate 3100 are stacked, so that the photoelectric conversion apparatus 100 is formed.

(First Substrate)

Figure 2:
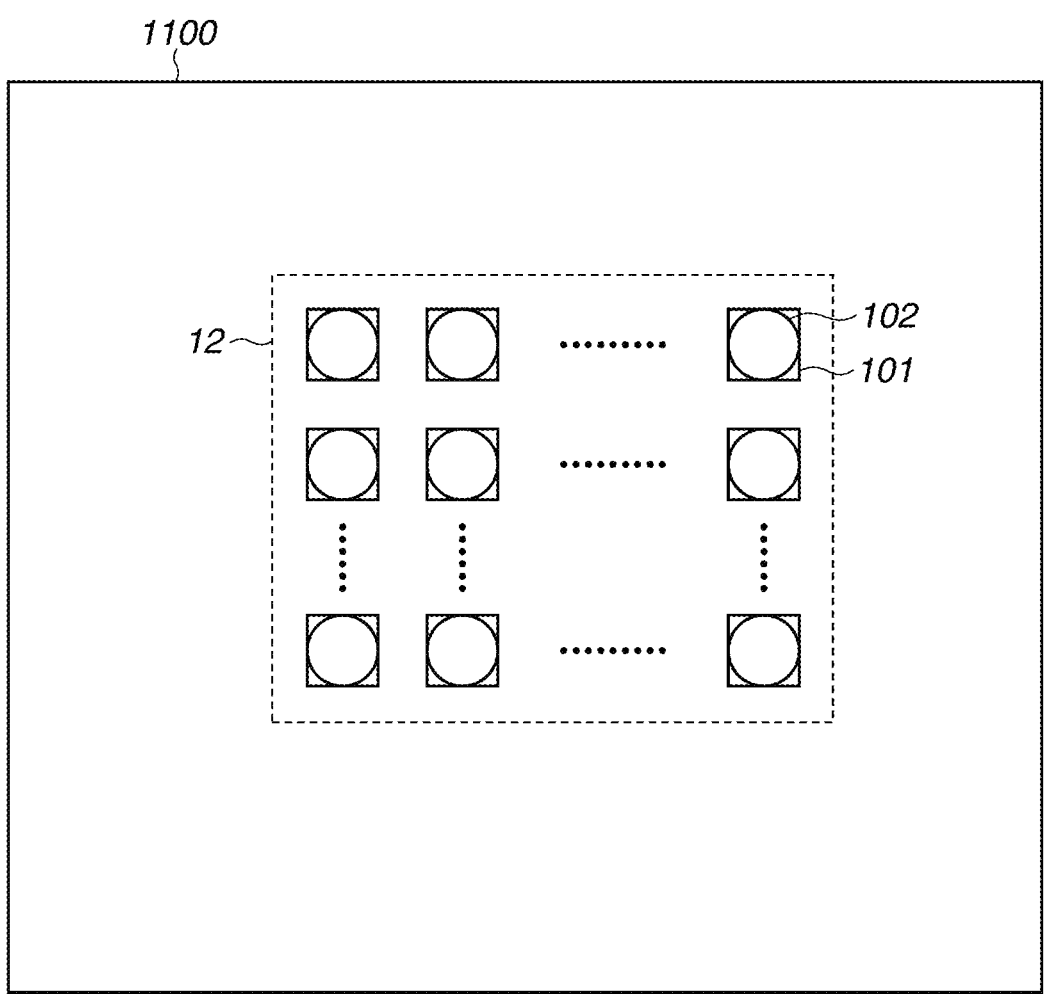
FIG. 2 is a functional block diagram illustrating functions included in a first substrate.

FIG. 2 is a configuration diagram of the first substrate 1100. In the first substrate 1100, the pixel region 12 where pixels 101 each including a photoelectric conversion unit 102 including an avalanche photodiode (hereinafter, APD) are two-dimensionally arranged. The pixels 101 in the pixel region 12 may be one-dimensionally arranged. The details of the photoelectric conversion unit 102 will be described below.

Typical examples of the pixel 101 is a pixel for forming an image. In a case where the pixel 101 is used in a time of flight (TOF) sensor, an image may not be formed. That is, the pixel 101 may be an element for measurement of a time when light reaches the pixel 101, and the amount of the light.

(Second Substrate)

Figure 3:
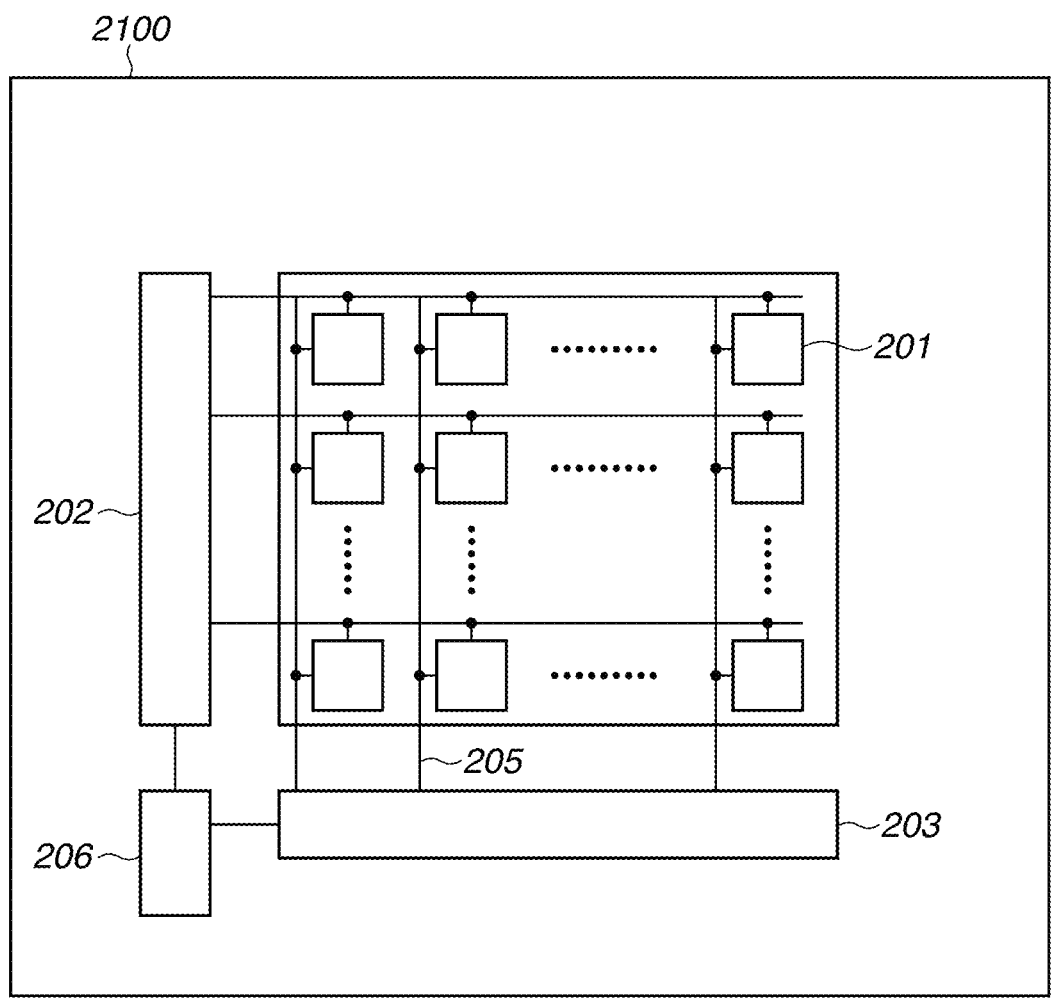
FIG. 3 is a functional block diagram illustrating functions included in a second substrate.

FIG. 3 is a configuration diagram of the second substrate 2100. The second substrate 2100 includes pixel circuit units 201 that process a charge photoelectrically-converted by the photoelectric conversion unit 102, a control pulse generation unit 206, a horizontal scanning circuit unit 203, signal lines 205, and a vertical scanning circuit unit 202. The pixel circuit region 22 illustrated in FIG. 2 is a region in which at least the pixel circuit unit 201 is disposed.

The photoelectric conversion unit 102 illustrated in FIG. 2 and the pixel circuit units 201 illustrated in FIG. 3 are electrically connected via a connection wire disposed for each pixel.

The vertical scanning circuit unit 202 receives a control pulse supplied from the control pulse generation unit 206 and supplies the control pulse to each pixel. A logic circuit, such as a shift register or an address decoder, is used as the vertical scanning circuit unit 202.

A signal output from the photoelectric conversion unit 102 of each pixel is processed by the pixel circuit unit 201.

A counter and a memory are disposed in the pixel circuit unit 201, and a digital value is stored in the memory.

The horizontal scanning circuit unit 203 inputs control pulses to the pixel circuit units 201 to sequentially select columns, and reads out a signal from the memory of each pixel that stores a digital signal.

In a selected column, signals are output to the signal line 205 from the pixel circuit units 201 of pixels selected by the vertical scanning circuit unit 202.

In FIGS. 2 and 3, the pixel circuit units 201 are disposed to respectively correspond to the respective pixels 101. Nevertheless, one pixel circuit unit 201 may be shared by a plurality of pixels 101, for example, and signal processing may be sequentially performed. This configuration leads to space saving of the pixel circuit region 22.

(Third Substrate)

Figure 4:
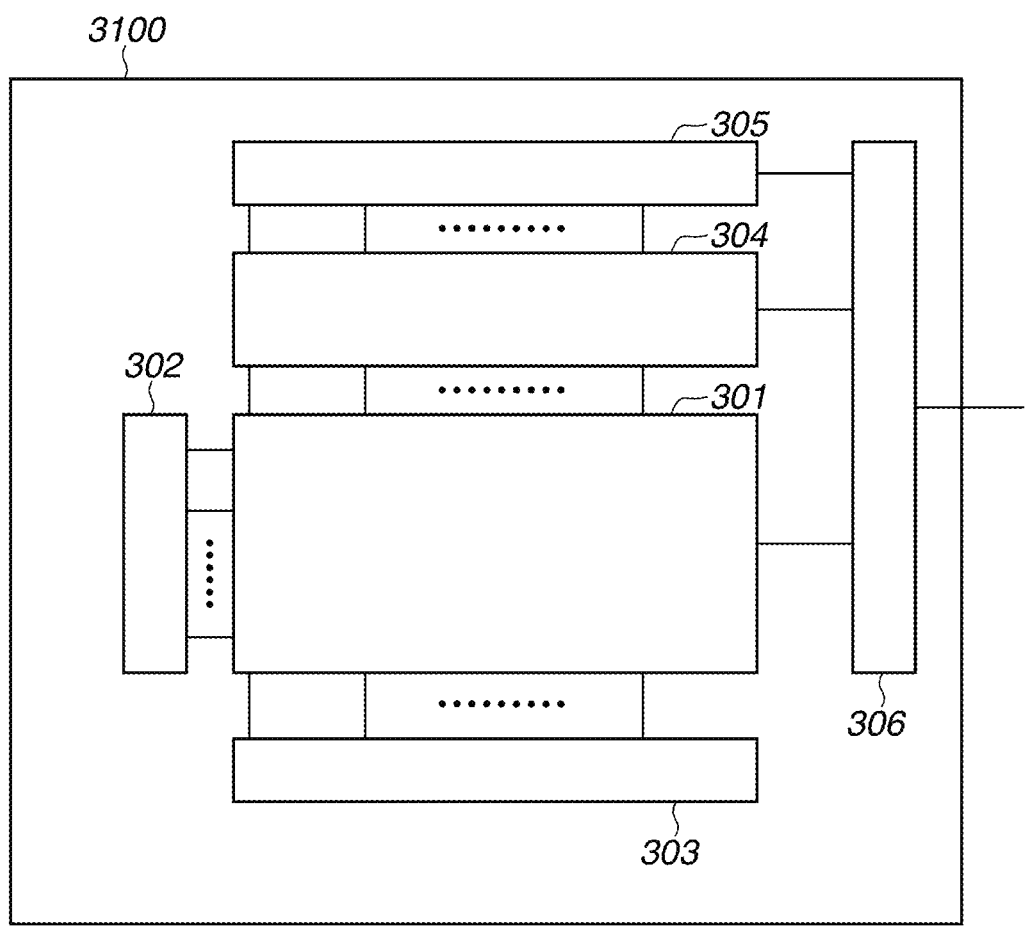
FIG. 4 is a functional block diagram illustrating functions included in a third substrate.

FIG. 4 is a configuration diagram of the third substrate 3100. The third substrate 3100 includes a memory 301, a first signal processing unit 304, a second signal processing unit 305, and control circuit units 302 and 303.

The memory 301 records therein, for example, image data output from the horizontal scanning circuit unit 203 and the like. The memory 301 is a static random access memory (SRAM) or a dynamic RAM (DRAM), for example.

The control circuit units 302 and 303 controls recording and readout of information from the memory 301.

The first signal processing unit 304 executes various types of signal processing on image data (processing target image data) read out from the memory 301. For example, in a case where the processing target image data is a color image, the first signal processing unit 304 converts the format of the image data into a format of YUV image data or RGB image data.

The first signal processing unit 304 executes processing, such as noise removal or white balance adjustment, on the processing target image data as necessary. The first signal processing unit 304 further executes various types of signal processing (also called preprocessing) to process the processing target image data into image data processable by the second signal processing unit 305.

In a case where the photoelectric conversion apparatus 100 is used as a distance measurement apparatus, the first signal processing unit 304 also functions as a distance measurement processing unit, for example. For example, a histogram is created based on information obtained from a time to digital converter (TDC) circuit to be described below, distance calculation is performed, and a distance is output to the second signal processing unit 305. In the histogram, a horizontal axis indicates a class (bin) related to a time, and a vertical axis indicates a frequency in each class. The frequency indicates the number of light receiving times during a predetermined light receiving time. Data in the histogram includes both a count that is based on reflected light and a count that is based on environmental light. Thus, a predetermined threshold value is set to separate the counts into the count of reflected light components and the count of environmental light components. A distance between the distance measurement apparatus and a measured object is calculated from a light arrival time corresponding to the reflected light components.

The first signal processing unit 304 can generate three-dimensional distance image data from a distance obtained by calculation. The three-dimensional distance image data can be generated only from information obtained by the distance measurement processing unit, or may be three-dimensional distance image data generated by adding calculation data acquired by the distance measurement processing unit to two-dimensional surface image data.

The second signal processing unit 305 is a digital signal processor (DSP), for example. The second signal processing unit 305 executes a program stored in the memory 301 to function as a processing unit that executes various types of processing using a learned model created by machine learning. For example, the learned model is created by machine learning that uses a deep neural network (DNN). Such a learned model is also called a neural network calculation model.

This learned model may be designed based on a parameter generated by inputting, an input signal corresponding to an output from the pixel region 12 and learning data associated with a label corresponding to this input signal to a predetermined machine learning model. The predetermined machine learning model may be a learning model that uses a multilayer neural network. Such a learned model is also called a multilayered neural network.

For example, the second signal processing unit 305 executes calculation processing that is based on a learned model stored in the memory 301. A result (calculation result) obtained by such calculation processing is output to the memory 301 or the like.

The calculation result includes image data obtained by calculation processing using a learned model and various types of information (metadata) obtained from the image data. In addition, a memory controller that controls access to a memory may be incorporated into a DSP.

Image data to be processed by the second signal processing unit 305 may be image data normally read out from the pixel region 12 or may be image data with a data size reduced by thinning out pixels of the image data. The image data may be image data read out in a data size smaller than a normal data size by executing readout from the pixel region 12 while thinning out pixels.

The image data to be processed by the second signal processing unit 305 may also be three-dimensional distance image data. Because an information amount of the three-dimensional distance information data is larger than that of two-dimensional image data, object recognition is performed highly accurately, and position information on an object is acquired highly accurately.

In this manner, image data output from the horizontal scanning circuit unit 203, image data signal-processed by the first signal processing unit 304, a calculation result obtained by the second signal processing unit 305, and the like are recorded in the memory 301 as necessary. The memory 301 also stores an algorithm of a learned model that is to be executed by the second signal processing unit 305.

By changing weights of various parameters in a learning model by using learning data, the second signal processing unit 305 learns the learning model, and by preparing a plurality of learning models, the second signal processing unit 305 changes a learning model to be used, in accordance with the a result of calculation processing. The second signal processing unit 305 can also acquire a learned learning model from an external apparatus, and execute the above-described calculation processing.

FIG. 4 illustrates an example in which the memory 301, the first signal processing unit 304, and the second signal processing unit 305 are arranged in this order. As described above, since the memory 301 stores information output from or information input to the first signal processing unit 304 and the second signal processing unit 305, the memory 301 may be disposed between the first signal processing unit 304 and the second signal processing unit 305. Alternatively, the second signal processing unit 305 may be disposed between the memory 301 and the first signal processing unit 304.

An output unit 306 outputs image data output from the second signal processing unit 305 and image data and calculation results that are recorded in the memory 301.

The image data and calculation results that have been output from the output unit 306 are input to an application processor (not illustrated) that processes a display and a user interface. The application processor includes a central processing unit (CPU), for example and executes an operating system and various types of application software. This application processor may have functions of a graphics processing unit (GPU) and a baseband processor. The application processor executes various types of as-needed processing on input image data and calculation results, executes display to the user, and transmits the input image data and calculation results to an external cloud server via a predetermined network.

As the network, various networks such as the Internet, a wired local area network (LAN) or a wireless LAN, a mobile communication network, or Bluetooth®, for example, can be applied. The transmission destination of image data and calculation results is not limited to the cloud server, and may be various information processing apparatuses (systems) having a communication function, including a server operating alone, a file server storing various types of data, and a communication terminal such as a mobile phone.

(APD and Pixel Circuit)

Figure 5:
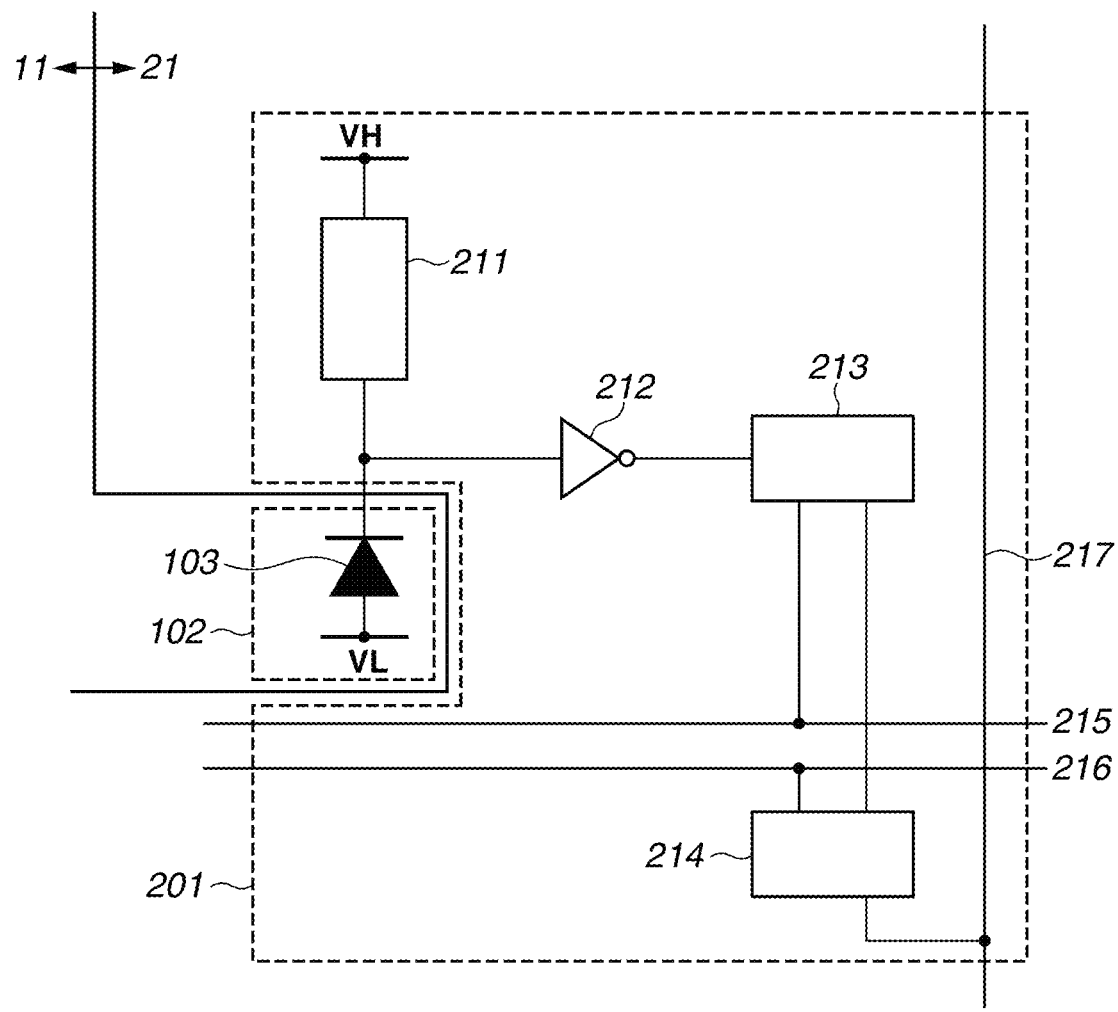
FIG. 5 is a circuit diagram and a functional block diagram of a pixel.

FIG. 5 is a diagram illustrating, in more detail, the block diagrams illustrated in FIGS. 2 and 3.

In FIG. 2, the photoelectric conversion unit 102 including an APD 103 is disposed in the first substrate 1100, and other members are disposed in the second substrate 2100.

In response to light entering the APD 103, a charge pair is generated by photoelectric conversion. A voltage VL (first voltage) is supplied to an anode of the APD 103. A voltage VH (second voltage) higher than the voltage VL supplied to the anode is supplied to a cathode of the APD 103.

Inversely-biased voltages for causing the APD 103 to perform an avalanche multiplication operation are supplied to the anode and the cathode of the APD 103. By bringing the APD 103 into a state in which such voltages are supplied, charges generated by incident light cause avalanche multiplication, and an avalanche current is generated.

In a state in which reverse bias voltages are supplied, APDs are operated in Geiger mode or Linear mode. In Geiger mode, APDs are operated with an anode-cathode potential difference larger than the breakdown voltage. In Linear mode, APDs are operated with an anode-cathode potential difference near the breakdown voltage or smaller than or equal to the breakdown voltage. Among APDs, an APD that is operated in Geiger mode is referred to as an SPAD. For example, the voltage VL (first voltage) is −30 V and the voltage VH (second voltage) is 1 V. In this case, for example, a potential difference between 0 V being the ground voltage and the voltage VL (first voltage) is larger than a potential difference between the ground voltage and the voltage VH (second voltage). Thus, the voltage VL (first voltage) will be sometimes represented as a high voltage.

A quench element 211 is connected to the APD 103 and a power source that supplies the voltage VH. The quench element 211 has a function of replacing a change in avalanche current generated in the APD 103 into a voltage signal. The quench element 211 functions as a load circuit (quench circuit) when a signal is multiplied by avalanche multiplication, and has a function of suppressing avalanche multiplication by reducing a voltage to be supplied to the APD 103 (quench operation).

The signal processing unit (pixel circuit unit) 201 includes a waveform shaping unit 212, a circuit (counter circuit) 213, and a selection circuit 214. In this specification, a configuration of the signal processing unit 201 is not limited as long as the signal processing unit 201 includes any one of the waveform shaping unit 212, the circuit (counter circuit) 213, and the selection circuit 214.

The waveform shaping unit 212 shapes a change in the potential of the cathode of the APD 103 obtained at the time of photon detection, and outputs a pulse signal. As the waveform shaping unit 212, for example, an inverter circuit is used. While FIG. 5 illustrates an example in which a single inverter is used as the waveform shaping unit 212, a circuit in which a plurality of inverters is connected in series may be used, or another circuit having a waveform shaping effect may be used.

The circuit (counter circuit) 213 counts pulse signals output from the waveform shaping unit 212 and stores the count value. In response to a control pulse pRES being supplied via a drive line 215, the number of pulse signals that has been stored in the circuit (counter circuit) 213 is reset. Because a circuit scale of the circuit (counter circuit) 213 disposed for each pixel is large, the circuit (counter circuit) 213 may be partially disposed also in the third substrate 3100 in addition to a part disposed in the second substrate 2100.

A control pulse pSEL is supplied to the selection circuit 214 from the vertical scanning circuit unit 202 illustrated in FIG. 3 via a drive line 216 illustrated in FIG. 5, and electric connection and disconnection between the circuit (counter circuit) 213 and a signal line 217 are switched. The selection circuit 214 includes a buffer circuit for outputting a signal, for example.

In a case where the quench element 211 includes a metal-oxide semiconductor (MOS) transistor, for example, a clock cycle pulse may be applied to the gate of this MOS transistor. In this case, a pulse having a predetermined clock cycle is input from a phase locked loop (PLL) circuit (not illustrated) to the gate of a transistor included in the quench element 211. For example, in a case of the quench element 211 including a P-channel MOS (PMOS) transistor, in response to the pulse having a high level from the PLL circuit, the quench element 211 enters an off state. In this state, reverse bias is not applied to the APD 103, and the APD 103 enters a non-detection mode. On the other hand, in response to the pulse having a low level from the PLL circuit, the quench element 211 enters an on state, reverse bias is applied to the APD 103, and the APD 103 enters a detection mode (standby mode). Because a clock pulse from the PLL circuit has a predetermined cycle, an output signal is forcibly reset at every clock cycle. Consequently, the number of photons counted in response to one pulse is one, which results in generation of signals by the number corresponding to the number of incident photons even under high brightness. The PLL circuit is disposed in any one of the first substrate 1100, the second substrate 2100, and the third substrate 3100, or disposed in the plurality of substrates.

Electric connection may be switched with a switch, such as a transistor, disposed between the quench element 211 and the APD 103 or between the photoelectric conversion unit 102 and a signal processing unit 201. Similarly, the supply of the voltage VH or the voltage VL to the photoelectric conversion unit 102 may be electrically switched with a switch, such as a transistor.

In the above description, the configuration that uses the circuit 213 as a counter circuit has been described. Alternatively, a time to digital converter (hereinafter, TDC) circuit serving as a time measurement circuit may be used as the circuit 213 instead of the counter circuit. With this configuration, the photoelectric conversion apparatus 100 that acquires a pulse detection timing is realized.

The generation timing of a pulse signal output from the waveform shaping unit 212 is converted into a digital signal by the TDC circuit 213. To measure the timing of a pulse signal, a control pulse pREF (reference signal) is supplied to the TDC circuit 213 from the vertical scanning circuit unit 202 illustrated in FIG. 3 via a drive line. The TDC circuit 213 uses the control pulse pREF as a reference to acquire, as a digital signal, a signal by using a timing when an input timing of a signal output from each pixel via the waveform shaping unit 212 as a relative time.

The TDC circuit 213 includes, for example, an RS flip-flop, a coarse counter, and a fine counter. The control (drive) pulse pREF drives a light emitting unit and sets the RS flip-flop, and the RS flip-flop is reset by a signal pulse input from each pixel. Signals having a pulse width corresponding to the time of flight of light are thereby generated. The generated signals are counted by the coarse counter and the fine counter each having predetermined time resolution. A digital code is thereby output.

The PLL circuit that generates the control (drive) pulse pREF of the TDC circuit 213 is disposed in any one of the first substrate 1100, the second substrate 2100, and the third substrate 3100, or disposed in the plurality of substrates. However, if a delay occurs in the control (drive) pulse pREF input to the TDC circuit 213, the accuracy of information to be output from the TDC circuit 213 is affected. Thus, the PLL circuit is desirably provided in the same substrate as the substrate in which the TDC circuit 213 is disposed. For example, in the present exemplary embodiment, the TDC circuit 213 and the PLL circuit that generates a pulse to be supplied to the TDC circuit 213 are disposed in the second substrate 2100.

The PLL circuit sometimes inputs a pulse also to a circuit disposed in the third substrate 3100. In this case, a configuration in which a PLL circuit for the TDC circuit 213 is disposed in the second substrate 2100, and a PLL circuit for a circuit disposed in the third substrate 3100 is disposed in the third substrate 3100 can be employed. For example, one PLL circuit may be disposed in the second substrate 2100, and a pulse signal may be supplied to a circuit in the third substrate 3100 from the PLL circuit disposed in the second substrate 2100. However, in this case, a pulse signal is supplied to the circuit in the third substrate 3100 from the PLL circuit disposed in the second substrate 2100 via a through-silicon via (TSV) wiring connecting the second substrate 2100 and the third substrate 3100. This causes that processing of the circuit in the third substrate 3100, such as high-speed processing of a signal processing circuit might be affected by the wiring capacity of TSV wire or the like. In view of the foregoing, both the PLL circuit for the second substrate 2100 and the PLL circuit for the third substrate 3100 may be disposed in respective substrates.

FIG. 5 illustrates an example in which the TDC circuit 213 is disposed in each pixel, but the TDC circuit 213 may be shared by a plurality of pixels as described below.

(Operation of APD and Output Signal)

Figure 6A:
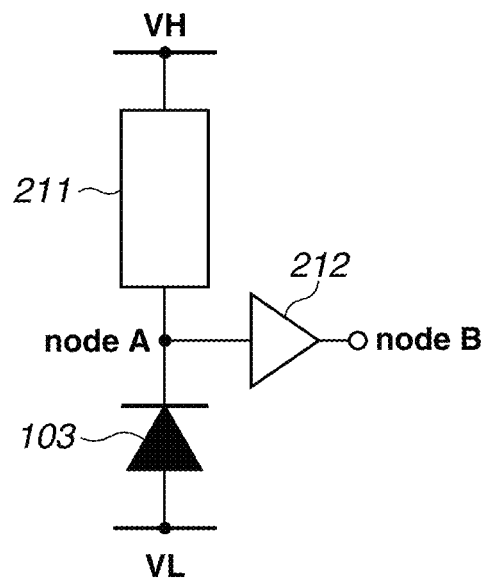
FIGS. 6A to 6C are diagrams illustrating a relationship between an operation of an avalanche photodiode (APD) and an output signal.
Figure 6B:
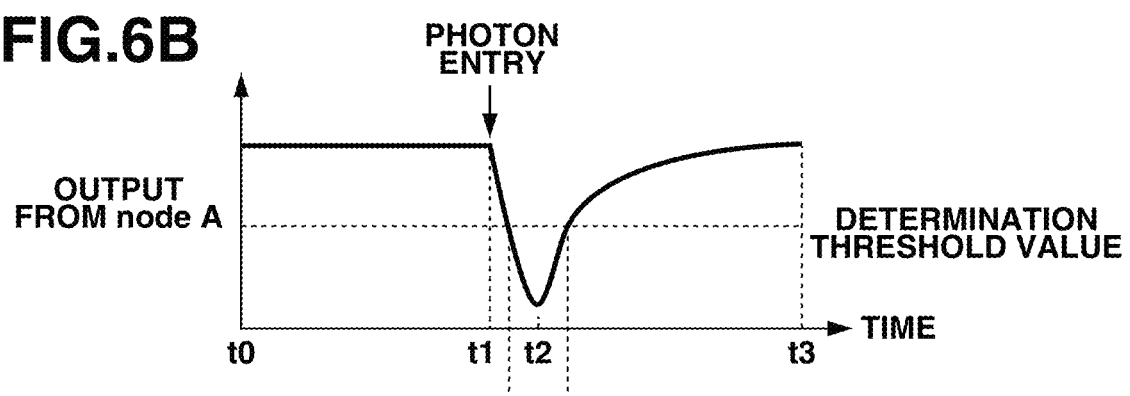
Figure 6C:
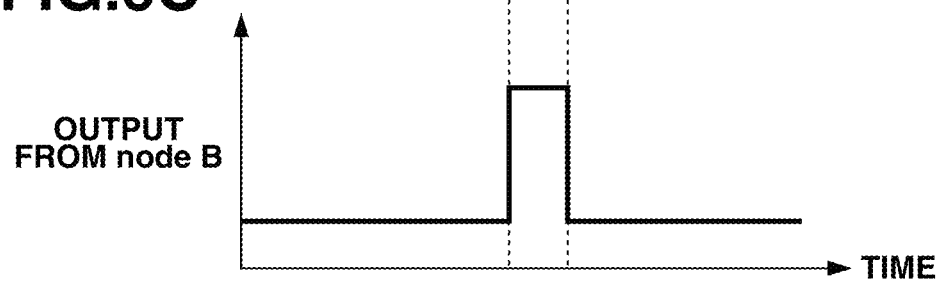

FIGS. 6A to 6C are diagrams schematically illustrating a relationship between an operation of an APD and an output signal. FIG. 6A is a diagram of the APD 103, the quench element 211, and the waveform shaping unit 212 illustrated in FIG. 5. In FIG. 6A, an input side of the waveform shaping unit 212 is referred to as a node A and an output side is referred to as a node B. FIG. 6B illustrates a waveform change of the node A in FIGS. 6A, and 6C illustrates a waveform change of the node B in FIG. 6A.

During a period from a time t0 to a time t1, a potential difference VH-VL is applied to the APD 103 in FIG. 6A. At the time t1, upon entry of a photon to the APD 103, an avalanche multiplication current flows in the quench element 211, and the voltage of the node A drops. With further increase in the voltage drop and decrease in the potential difference applied to the APD 103, the avalanche multiplication in the APD 103 stops, whereby the voltage level at the node A stops further dropping from a certain value. Then, a current compensating for the voltage drop from the voltage VL flows to the node A, and the potential level of the node A becomes static at the original potential level at a time t3.

At this time, a portion of an output waveform of the node A exceeding a certain threshold value is waveform-shaped by the waveform shaping unit 212, and output as a signal from the node B.

In the present exemplary embodiment, the memory 301, the control circuit units 302 and 303, the first signal processing unit 304, and the second signal processing unit 305 are disposed in the third substrate 3100. To downsize a chip of the photoelectric conversion apparatus 100, an area of a region other than a pixel region is desired to be made smaller. Because an avalanche photodiode includes a pixel circuit that processes a signal of each photoelectric conversion unit, a plurality of photoelectric conversion units are disposed in the first substrate 1100 and a plurality of pixel circuits are disposed in the second substrate 2100. Consequently, a region for the second substrate 2100 that overlaps a pixel region in a planar view has a space shortage, which leads to a difficulty in disposing a memory and a signal processing unit in the second substrate 2100. Thus, in the present exemplary embodiment, a memory and a signal processing unit are disposed in the third substrate 3100. The need for arrangement of a memory and a signal processing unit in the third substrate 3100 increases as a percentage of an area of the pixel region with respect to a chip area of the photoelectric conversion apparatus increases in a planar view. For example, in a case where a percentage of an area of the pixel region with respect to a chip area of the photoelectric conversion apparatus is 0.8 or more, the need obviously arises.

A transistor included in a memory or a signal processing unit in the third substrate 3100 is formed using a process finer than that for a transistor included in a pixel circuit in the second substrate 2100. This is because the memory and the signal processing unit require a space with a further larger area than the pixel circuit. For example, the thickness of a gate oxide film of a transistor in the third substrate 3100 is thinner than the thickness of a gate oxide film of a transistor in the second substrate 2100. In another case, the length of a gate length of a transistor t in the third substrate 3100 is shorter than the length of a gate length of a transistor in the second substrate 2100. In yet another case, the diameter of a via wire between interlayer films of a wiring structure (third wiring structure) of the third substrate 3100 is smaller than the diameter of a via wire between interlayer films of a wiring structure (second wiring structure) of the second substrate 2100. In yet another case, the wiring width and the distance between wirings of the wiring structure (third wiring structure) of the third substrate 3100 are smaller than the wiring width and the distance between wirings of the wiring structure (second wiring structure) of the second substrate 2100. A relationship between the above-described wiring widths and the distances between wirings is a relationship based on a comparison between shortest wiring widths or shortest distances of wirings in the substrates.

Since an avalanche multiplication current flows in the quench element 211 disposed in the second substrate 2100, in a case where the quench element 211 includes a MOS transistor, the quench element 211 is made into a high-voltage element by thickening the thickness of a gate oxide film of this MOS transistor. This causes a process of a pixel circuit other than the quench element 211 to be finer than a process of the quench element 211 in the second substrate 2100. As for a device structure of a case where a finer process is performed, requirements described above are applied to the quench element 211 in the second substrate 2100 and transistors of other pixel circuits. For example, the thickness of a gate oxide film of the quench element 211 (MOS transistor) in the second substrate 2100 is thicker than the thickness of a gate oxide film of a transistor included in a circuit other than the quench element 211 in the second substrate 2100. In addition, the thickness of the gate oxide film of the transistor included in the circuit other than the quench element 211 in the second substrate 2100 is thicker than the thickness of a gate oxide film of a transistor of a circuit in the third substrate 3100.

Furthermore, a signal processing unit in the third substrate 3100 may be a processing unit that uses a so-called "non-von Neumann" semiconductor technique, instead of a so-called "von Neumann" processing unit.

(Connection Relationship of Substrates)

Figure 7:
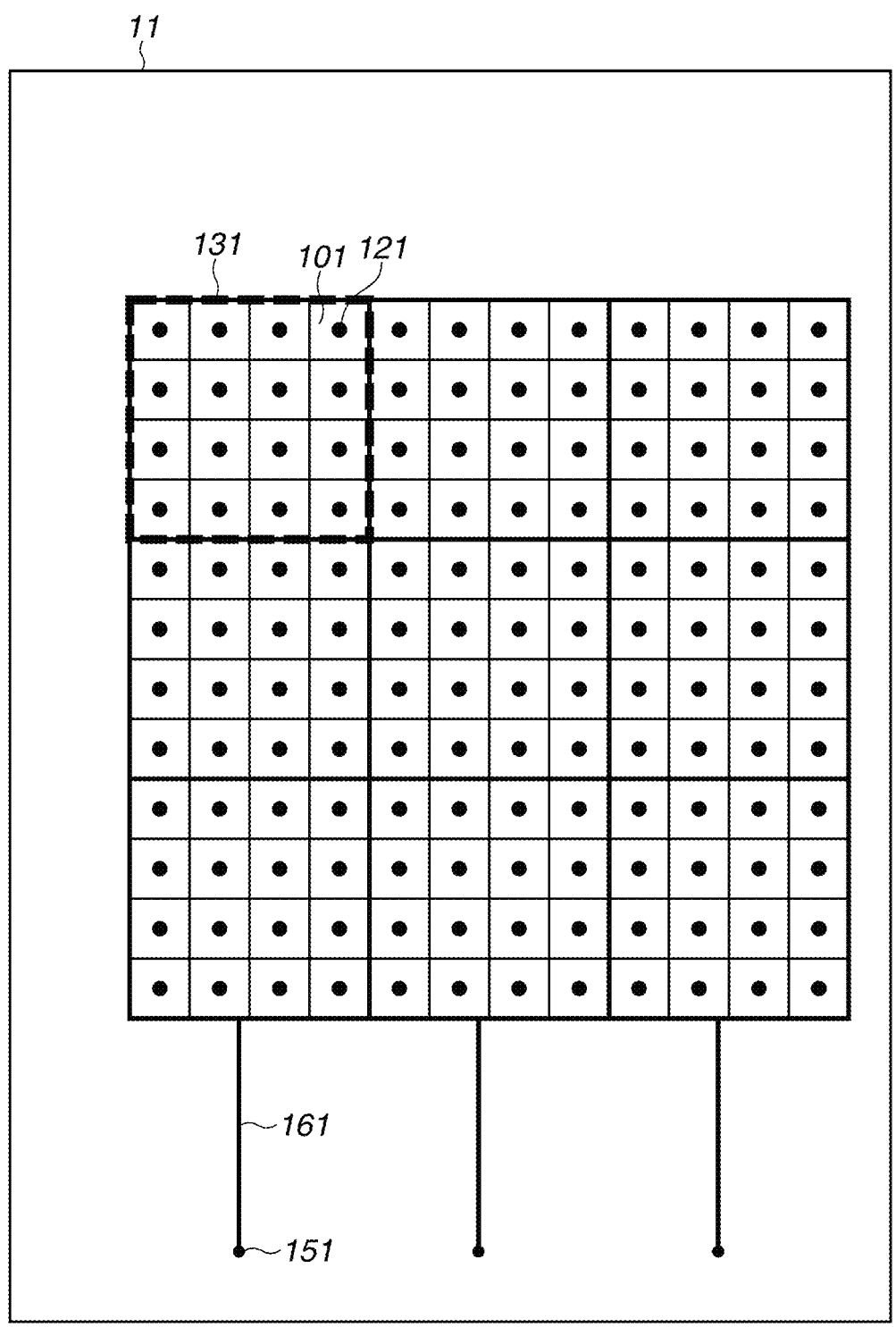
FIG. 7 is a schematic diagram illustrating an electric connection relationship between the first substrate and the second substrate according to a first exemplary embodiment.
Figure 8:
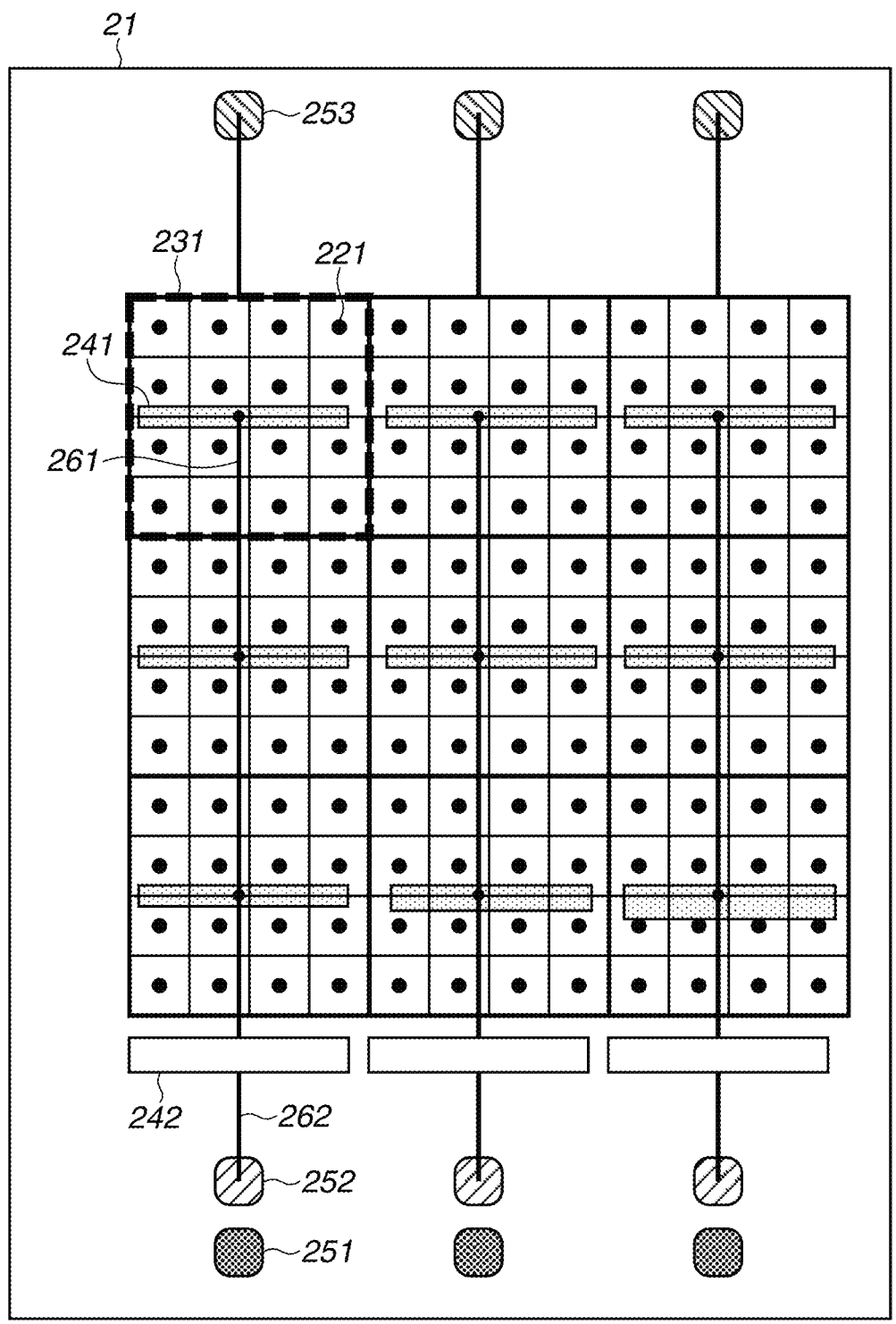
FIG. 8 is a schematic diagram illustrating an electric connection relationship between the second substrate and the third substrate according to a first exemplary embodiment.
Figure 9:
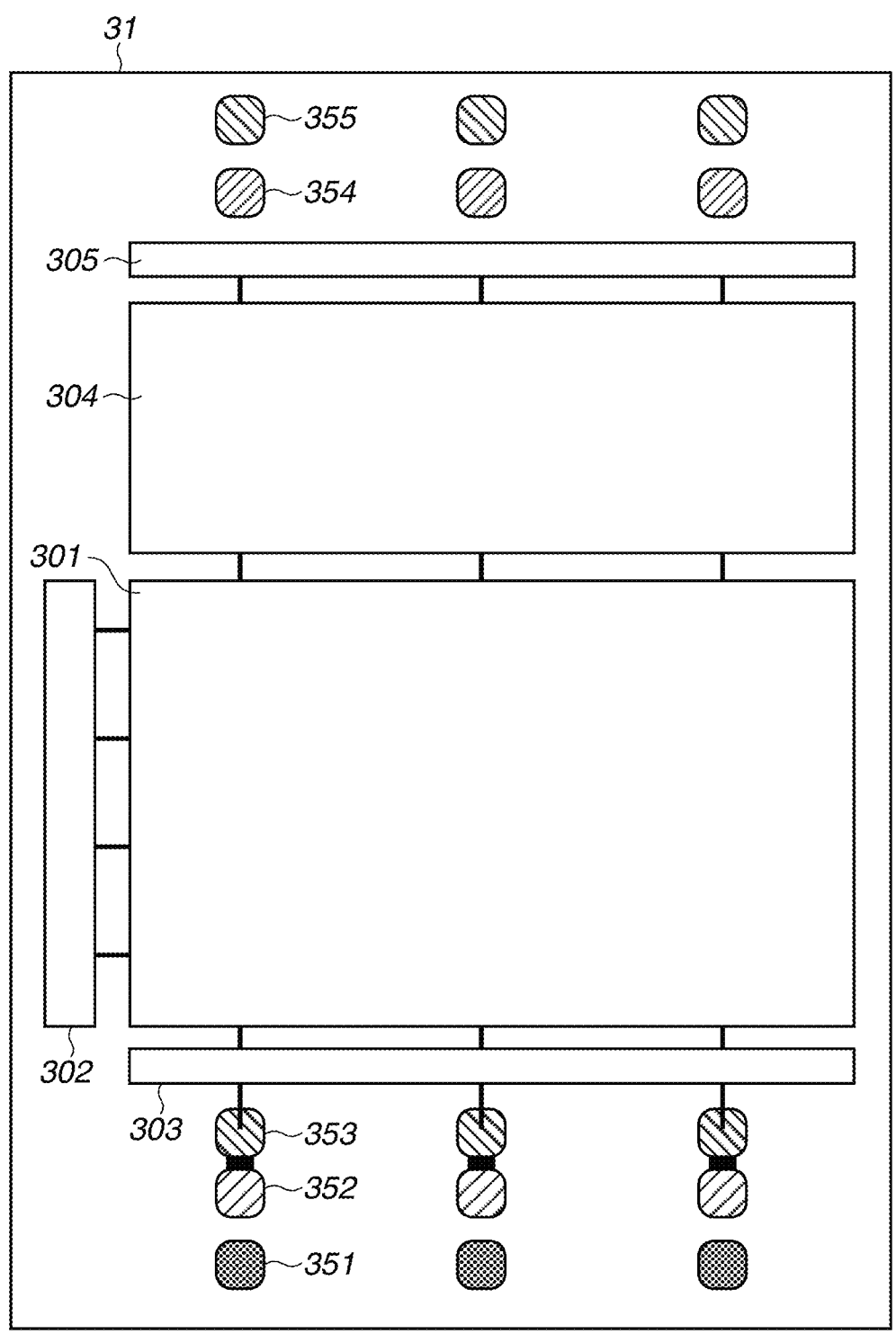
FIG. 9 is a schematic diagram illustrating an electric connection relationship between the third substrate and other components including other substrates according to a first exemplary embodiment.
Figure 10:
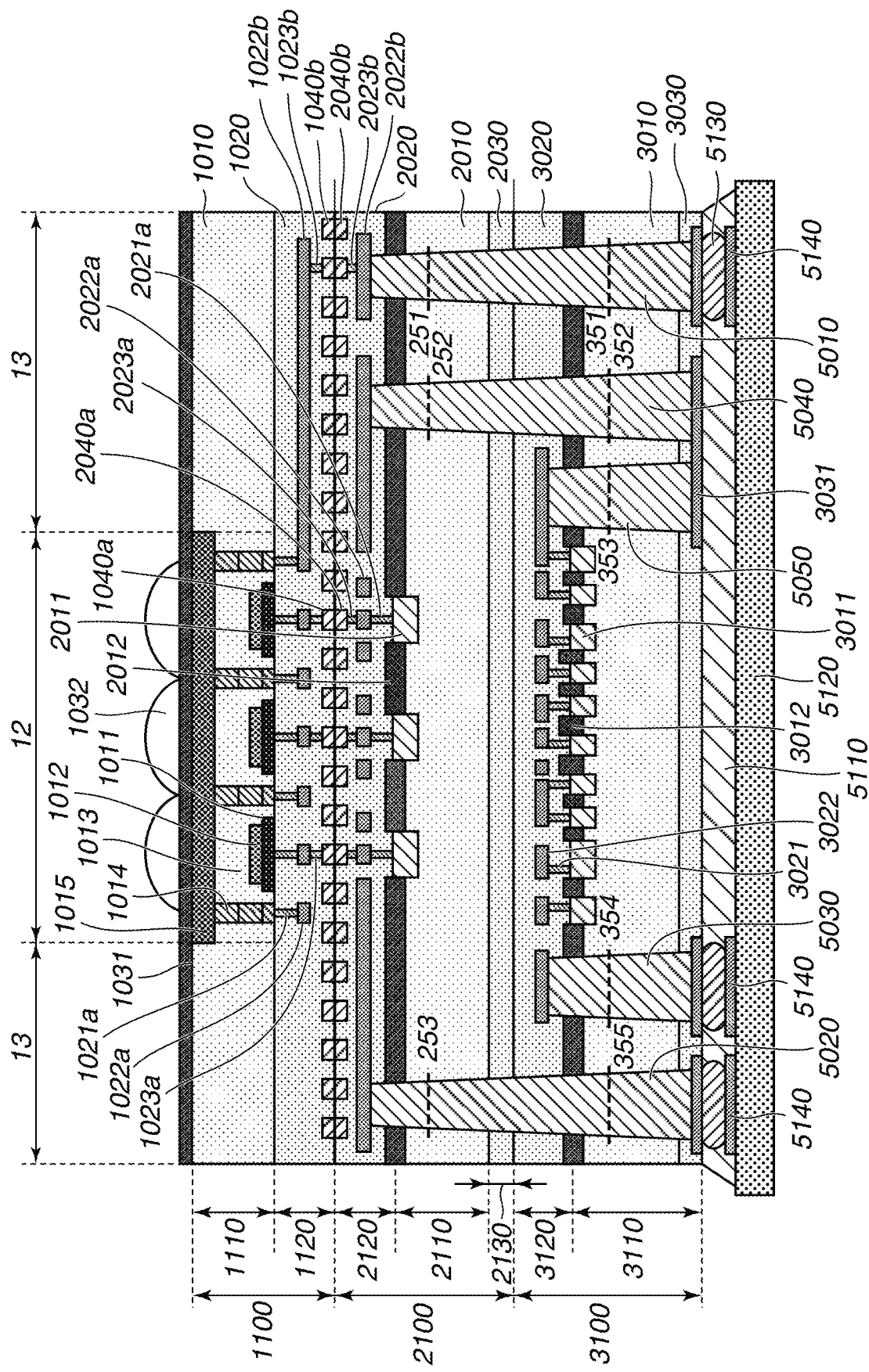
FIG. 10 is a cross-sectional view of a photoelectric conversion apparatus according to the first exemplary embodiment.

The electric connection relationship of the first to third substrates will be described in more detail with reference to FIGS. 7 to 10. FIGS. 7 to 9 are plan views respectively illustrating the first to third substrates. FIG. 10 is a cross-sectional view of the photoelectric conversion apparatus 100 in which the first to third substrates are stacked.

(Cross-Sectional View of Photoelectric Conversion Apparatus)

FIG. 10 is a cross-sectional view of the photoelectric conversion apparatus 100, and light enters from the upper side in FIG. 10.

From a light incidence surface side, the first substrate 1100, the second substrate 2100, and the third substrate 3100 are stacked.

The first substrate 1100 includes a semiconductor layer 1110 (first semiconductor layer) of the first substrate 1100 and a wiring structure 1120 (first wiring structure) of the first substrate 1100.

The second substrate 2100 includes a semiconductor layer 2110 (second semiconductor layer) of the second substrate 2100, a wiring structure 2120 (second wiring structure) of the second substrate 2100, and a connection layer 2130 that connects the second wiring structure 2120 and a wiring structure 3120 (third wiring structure) of the third substrate 3100.

The third substrate 3100 includes a semiconductor layer 3110 (third semiconductor layer) of the third substrate 3100 and the third wiring structure 3120.

The first substrate 1100 and the second substrate 2100 are bonded in such a manner that the first wiring structure 1120 and the second wiring structure 2120 are opposed and in contact with each other. In addition, the second substrate 2100 and the third substrate 3100 are bonded in such a manner that the second semiconductor layer 2110 and the third wiring structure 3120 face each other via the connection layer 2130.

A package substrate 5120 is disposed in the third substrate 3100 via an insulating bonding region 5110 in an opposite side of the light incidence surface side.

In the first semiconductor layer 1110, a first semiconductor region 1011 of a first conductivity type and a second semiconductor region 1012 of a second conductivity type are disposed to form a PN junction, which forms the APD 103 illustrated in FIG. 5.

A third semiconductor region 1013 of the second conductivity type is formed at a position closer to the light incidence surface than the second semiconductor region 1012. The impurity concentration of the third semiconductor region 1013 is lower than the impurity concentration of the second semiconductor region 1012.

In this specification, the term "impurity concentration" means a net impurity concentration obtained by subtracting compensation by impurities of an opposite conductivity type. In short, the "impurity concentration" refers to a net concentration. For example, a region in which a P-type added impurity concentration is higher than an N-type added impurity concentration is the P-type semiconductor region. Conversely, a region where an N-type added impurity concentration is higher than a P-type added impurity concentration is the N-type semiconductor region.

Pixels are isolated by a fourth semiconductor region 1014 of the second conductivity type. A fifth semiconductor region 1015 of the second conductivity type is disposed at a position closer to the light incidence surface than the fourth semiconductor region 1014. The fifth semiconductor region 1015 is disposed in common to the pixels.

The voltage VL (first voltage) illustrated in FIG. 5 is supplied to the fourth semiconductor region 1014, and the voltage VH (second voltage) illustrated in FIG. 5 is supplied to the first semiconductor region 1011. Due to the voltage supplied to the fourth semiconductor region 1014 and the voltage supplied to the first semiconductor region 1011, reverse bias voltages are supplied to the second semiconductor region 1012 and the first semiconductor region 1011. The reverse bias voltages that cause the APD 103 to perform an avalanche multiplication operation are thereby supplied.

A pinning layer 1031 is disposed at a position closer to the light incidence surface than the fifth semiconductor region 1015. The pinning layer 1031 is a layer disposed to reduce dark current. The pinning layer 1031 is formed using hafnium oxide ($HfO_2$), for example. The pinning layer 1031 may be formed using zirconium dioxide ($ZrO_2$), tantalum oxide ($Ta_2O_5$), or the like. A microlens 1032 is disposed in the pinning layer 1031 for each pixel. Between the microlens 1032 and the pinning layer 1031, a color filter (not illustrated) and a gridded light shielding film (not illustrated) to optically isolate the pixels may be disposed. The light shielding film can be any material as long as the material shields light. For example, tungsten (W), aluminum (Al), copper (Cu), or the like can be used.

As described above, to cause avalanche multiplication, a reverse bias voltage is supplied to the fourth semiconductor region 1014 and the first semiconductor region 1011. In FIG. 10, a first via wire (contact wire) 1021a of the first substrate 1100 electrically connects to the fourth semiconductor region 1014, and a wire 1022a of a first wiring layer of the first substrate 1100 electrically connects to the contact wire 1021a. The wire 1022a of the first wiring layer electrically connects with a wire 1022b.

An additional character "a" suffixed to a reference numeral indicates that a corresponding component is a wire in the pixel region 12 in which a plurality of photoelectric conversion units 102 are disposed. An additional character "b" is suffixed to a reference numeral denoting a wire arranged in a region other than the pixel region 12, or a region other than a region overlapping the pixel region 12 in a planar view.

The wire 1022a and the wire 1022b of the first wiring layer may be electrically connected via another wiring layer. The wire 1022a and the wire 1022b may be electrically connected by being continuously and integrally formed in the first wiring layer.

The wire 1022b electrically connects with a second via wire 1023b of the first substrate 1100. The second via wire 1023b electrically connects with a bonding portion 1040b of the first substrate 1100. The bonding portion 1040b of the first substrate 1100 is in contact with a bonding portion 2040b of the second substrate 2100 and is electrically connected with the bonding portion 2040b. In this manner, bonding between the bonding portion 1040b exposed on a bonded surface of the first substrate 1100 and the bonding portion 2040b exposed on a bonded surface of the second substrate 2100 will be sometimes referred to as a metal bonding (MB) structure or a metal bonding portion. Because the bonding is often performed between copper (Cu) components, the bonding will be sometimes referred to as Cu—Cu bonding.

The bonding portion 2040b of the second substrate 2100 electrically connects with a second via wire 2023b of the second substrate 2100, and the second via wire 2023b electrically connects with a wire 2022b of the first wiring layer of the second substrate 2100. The wire 2022b of the first wiring layer electrically connects with a through wire (hereinafter, will be referred to as a through silicon via (TSV) wire.) 5010. The TSV wire 5010 is a wire penetrating through a semiconductor layer 2010 of the second substrate 2100 and a semiconductor layer 3010 of the third substrate 3100. The TSV wire 5010 electrically connects with a wire 3031 of a wiring layer in a TSV opening portion side of the third substrate 3100 (opposite side of the light incidence surface side). The wire 3031 electrically connects with an electrode 5140 via a bump 5130.

The voltage VL (first voltage) is supplied to the electrode 5140 electrically connecting with the TSV wire 5010, and thus, with the configuration of the above-described connection wire, the voltage VL (first voltage) is supplied also to the fourth semiconductor region 1014.

On the other hand, the first via wire (contact wire) 1021a of the first substrate 1100 electrically connects to the first semiconductor region 1011, and the wire 1022a of the first wiring layer of the first substrate 1100 electrically connects to the contact wire 1021a. The wire 1022a of the first wiring layer electrically connects also with a second via wire 1023a of the first substrate 1100. The second via wire 1023a electrically connects with a bonding portion 1040a of the first substrate 1100. The bonding portion 1040a of the first substrate 1100 is in contact with and electrically connects with a bonding portion 2040a of the second substrate 2100. The bonding portion 2040a of the second substrate 2100 electrically connects with a second via wire 2023a of the second substrate 2100, and the second via wire 2023a electrically connects with a wire 2022a of the first wiring layer of the second substrate 2100. The wire 2022a electrically connects with a first via wire (contact wire) 2021 of the second substrate 2100, and the contact wire 2021 electrically connects with a sixth semiconductor region 2011. The sixth semiconductor region 2011 is disposed in the semiconductor layer 2010 of the second substrate 2100. The sixth semiconductor regions 2011 are isolated by an element isolation region 2012. For example, the sixth semiconductor region 2011 constitutes a part of the quench element 211. More specifically, in a case where the quench element 211 is a MOS transistor, the sixth semiconductor region 2011 serves as a source or drain region of the MOS transistor. The waveform shaping unit 212, the counter circuit 213, and the selection circuit 214, which are not illustrated in FIG. 10, are disposed in the second substrate 2100.

The sixth semiconductor region 2011 electrically connects with the wire 2022b through a plurality of wires and a semiconductor region. The wire 2022b of the first wiring layer connects with a TSV wire 5020. The TSV wire 5020 is a wire penetrating through the semiconductor layer 2010 of the second substrate 2100 and the semiconductor layer 3010 of the third substrate 3100. The TSV wire 5020 electrically connects with the electrode 5140 via the wire 3031 and the bump 5130.

The voltage VH (second voltage) is supplied to the electrode 5140 electrically connecting with the TSV wire 5020, and thus, with the configuration of the above-described connection wire, the voltage VH (second voltage) is supplied also to the first semiconductor region 1011.

A voltage supplied from the TSV wire 5020 may be supplied to a pixel circuit, such as the waveform shaping unit 212, the counter circuit 213, or the selection circuit 214. That is, the voltage VH (second voltage) serves as a drive voltage for a circuit disposed in the second substrate 2100. The drive voltage and the ground voltage are reference voltages, and the circuit is operated by the drive voltage and the ground voltage.

Furthermore, the ground voltage may be supplied from the TSV wire 5020 to the first substrate 1100 and the second substrate 2100. Although the TSV wire 5020 for the drive voltage and the TSV wire 5020 for the ground voltage are illustrated without any distinction for the sake of convenience, these are different TSV wires and electrically isolated.

The above description has been given of an example in which a drive voltage for an avalanche photodiode disposed in the first substrate 1100, and a drive voltage for a pixel circuit disposed in the second substrate 2100 are supplied from the same TSV wire 5020. Alternatively, a TSV wire different from the TSV wire 5020 for the avalanche photodiode may be disposed, and a drive voltage may be supplied to a pixel circuit disposed in the second substrate 2100.

In FIG. 10, the signal line 217 illustrated in FIG. 5 corresponds to at least part of the contact wire 2021, the wire 2022a, and the wire 2022b, and these wires are electrically connected to a TSV wire 5040. The TSV wire 5040 is electrically connected with a TSV wire 5050 via the wire 3031. That is, the TSV wires 5040 and 5050 are wires for inputting signals output from the second substrate 2100 to the third substrate 3100.

A seventh semiconductor region 3011 is formed in the semiconductor layer 3010 of the third substrate 3100 illustrated in FIG. 10, and the seventh semiconductor regions 3011 are isolated by an element isolation region 3012. The seventh semiconductor region 3011 constitutes a transistor including the memory 301, the first signal processing unit 304, the second signal processing unit 305, or the like. A wire 3021 of a first via wire (contact) of the third substrate 3100 is connected to the seventh semiconductor region 3011. The wire 3021 of the first via wire (contact) of the third substrate 3100 is connected also to a gate of a transistor disposed in the third substrate 3100, which is not illustrated. The wire 3021 is connected with a wire 3022 of the first wiring layer of the third substrate 3100. FIG. 10 illustrates an example in which the number of wiring layers is one, but the number of wiring layers to be disposed may be two or more.

The wire 3022 of the first wiring layer electrically connects with a TSV wire 5030. The TSV wire 5030 is a wire penetrating through the semiconductor layer 3010 of the third substrate 3100. The TSV wire 5030 electrically connects with the electrode 5140 via the wire 3031 and the bump 5130. A drive voltage for driving a circuit disposed in the third substrate 3100 is supplied to the electrode 5140 connecting with the TSV wire 5030. In addition, the TSV wire 5030 may be a wire that supplies the ground voltage to the circuit disposed in the third substrate 3100. Although the TSV wire 5030 for the drive voltage and the TSV wire 5030 for the ground voltage are illustrated without any distinction for the sake of convenience, these are different TSV wires and electrically isolated.

The TSV wire 5020 is a wire that supplies a drive voltage for a pixel circuit disposed in the second substrate 2100, for example. For this reason, due to a large current and a voltage drop that are caused by avalanche multiplication, the potential of the TSV wire 5020 might change. Thus, if a common TSV wire is disposed to supply drive voltages for the second substrate 2100 and the third substrate 3100, a voltage to be supplied to a circuit in the third substrate 3100 might vary and a high-speed operation can be affected. In the present exemplary embodiment, by using different wires as the TSV wire 5020 that supplies a drive voltage for the second substrate 2100 and the TSV wire 5030 that supplies a drive voltage for the third substrate 3100, influence on the third substrate 3100 is suppressed.

The TSV wires 5010, 5020, and 5030 are wires to which a voltage having a predetermined voltage value is supplied from the outside, but a power circuit that generates a voltage having a voltage value different from the predetermined voltage value may be disposed inside the photoelectric conversion apparatus 100. The power circuit can be disposed in any of the first substrate 1100, the second substrate 2100, and the third substrate 3100, or disposed in the plurality of substrates.

Here, the number of wires that connect a wire of the first wiring structure 1120 and a wire of the second wiring structure 2120 through the bonded surfaces of the first substrate 1100 and the second substrate 2100 will be referred to as a first connection number. The number of wires that connect a wire of the second wiring structure 2120 and a wire of the third wiring structure 3120 through the bonded surfaces of the second substrate 2100 and the third substrate 3100 will be referred to as a second connection number. In this case, the first connection number is larger than the second connection number. Even within the pixel region 12, the first connection number is larger than the second connection number.

(Connection Relationship Between First Substrate and Second Substrate)

FIG. 7 schematically illustrates an electric connection relationship between the first substrate 1100 and the second substrate 2100 in a planar view. The pixels 101 each including the photoelectric conversion unit 102 including an APD are two-dimensionally arranged.

A connection region 121 illustrated in FIG. 7 corresponds to the bonding portion 1040a that electrically connects the first semiconductor region 1011 and the second substrate 2100 of each pixel 101 illustrated in FIG. 10. That is, in the pixel region 12, the first substrate 1100 and the second substrate 2100 are electrically connected in the individual pixels.

A wire 161 illustrated in FIG. 7 is a wire corresponding to the wire 1022b in FIG. 10. A connection region 151 is a wire corresponding to the bonding portion 1040b electrically connecting with the wire 1022b in FIG. 10.

Each block 131 illustrated in FIG. 7 indicates a plurality of pixels 101 sharing a predetermined circuit disposed in the second substrate 2100. For example, the predetermined circuit is a TDC circuit disposed in the first substrate 1100. That is, as described below with reference to FIG. 8, in the example illustrated in FIG. 7, four pixels×four pixels=16 pixels in total share one TDC circuit. This configuration reduces an area of the TDC circuit in the second substrate 2100. Also, a variation in signal timing in a block is reduced. For example, a TDC circuit in the second substrate 2100 is disposed at the center of the block 131, and wiring from each pixel circuit to the TDC circuit is equivalently designed. This leads to a reduction in a signal timing variation that is attributed to a difference in wire layout.

Here, in a case where four pixels×four pixels=16 pixels in total share one TDC circuit, there are at least two methods.

The first method uses four pixels×four pixels for image capturing as one distance measurement pixel. Because the circuit scale of the TDC circuit is large, in a case where many small pixels are disposed, for example, there is a difficulty in disposing the TDC circuit for each pixel. Thus, a method of sharing one TDC circuit among a plurality of pixels share is employed. Especially for a distance measurement purpose, because not all pixels are used, unlike as in a photoelectric conversion apparatus for image capturing, collectively outputting signals of a plurality of pixels can be sometimes acceptable. In this case, sharing one TDC circuit among a plurality of pixels is effective. In the case of an avalanche photodiode, after entrance of one photon, a dead period occurs until recharge. If the next photon enters the same pixel during the dead period, the photon cannot be detected as a signal. Thus, with one distance measurement pixel including four pixels×four pixels, count loss due to the dead period can be reduced as compared with a configuration in which one distance measurement pixel includes only one pixel. In a case where this method is employed, identification of which pixel has output a signal is not available.

The second method is a method by which address information on each pixel is input to a TDC circuit from each pixel of four pixels×four pixels together with an output signal from a photoelectric conversion unit, and processed. By such a method, unless otherwise light rays simultaneously enter a plurality of pixels, identification of which pixel has output a signal can be performed with respect to an acquired light arrival time.

(Connection Relationship Between Second Substrate and Third Substrate)

FIG. 8 schematically illustrates electric connection relationship between the second substrate 2100 and the third substrate 3100 in a planar view. In FIG. 8, the illustration of the vertical scanning circuit unit 202, the horizontal scanning circuit unit 203, and the control pulse generation unit 206 illustrated in FIG. 3 is omitted.

A connection region 221 illustrated in FIG. 8 corresponds to the bonding portion 2040a bonding with the bonding portion 1040a illustrated in FIG. 10. A circuit 241 is a TDC circuit, for example, and one circuit is disposed for each block 231. In the example illustrated in FIG. 8, since signals output from 16 pixels are processed in one circuit 241, one circuit 241 is disposed for each block 231. A plurality of circuits 241 disposed in each block column are connected by a wire 261. The circuits 241 are disposed to respectively correspond to the blocks 231. A first circuit 241 corresponding to a first block 231 is disposed in such a manner as to overlap the first block 231 in a planar view. With this arrangement of the first circuit 241 and the first block 231, physical distances between a plurality of photoelectric conversion units belonging to the first block 231 and the first circuit 241 that processes output signals from the plurality of photoelectric conversion units become closer, which suppresses signal propagation delay. Consequently, a variation in signal processing timing among a plurality of pixels belonging to each block is also suppressed.

In FIG. 8, a decision feedback equalizer (DFE) 242 is disposed for each block column, and each DFE 242 is connected with the wire 261. An output from the DFE 242 is input to the third substrate 3100 via a TSV wire 252 (the TSV wire 5040 in FIG. 10). In this manner, the DFE 242 serves as the last signal processing circuit in the second substrate 2100 and as a circuit that output a signal to the third substrate 3100. Thus, the arrangement of the DFE 242 on the side on which the TSV wire 252 (5040) connects the second substrate 2100 and the third substrate 3100 is advantageous in improvement in efficiency of wiring. That is, in a case where a TSV wire connecting the second substrate 2100 and the third substrate 3100 is disposed in a predetermined direction with respect to a pixel region in a planar view, the DFE 242 is also disposed in the predetermined direction with respect to the pixel region. Specifically, in FIG. 8, the predetermined direction with respect to the pixel region refers to the downward direction.

In the present exemplary embodiment, the DFE 242 is disposed in the second substrate 2100, and the DFE 242 is not disposed in the third substrate 3100. Consequently, the DFE 242 is disposed between the circuit 241 (TDC circuit) included in a part of the pixel circuit and the TSV wire 252 (5040). If the pixel circuit and the TSV wire 252 (5040) are connected, and a TDC circuit is disposed downstream from these, the capacity to be added to the pixel circuit increases. This results in occurrence of a signal propagation delay, and signal processing timing is varied. In view of the foregoing, the DFE 242 is disposed between the TDC circuit and the TSV wire 252 (5040), so that the above-described inconvenience is reduced.

In FIG. 8, a TSV wire 251 of the second substrate 2100 (the TSV wire 5010 in FIG. 10) is a wire that supplies the voltage VL to the APD 103. A TSV wire 253 of the second substrate 2100 (the TSV wire 5020 in FIG. 10) is a wire that supplies a drive voltage to the second substrate 2100.

(Connection Relationship Between Third Substrate and Another Member)

FIG. 9 schematically illustrates electric connection relationship between the third substrate 3100, the outside of a semiconductor device, the second substrate 2100, and the first substrate 1100 in a planar view.

FIG. 9 illustrates the memory 301, the control circuit units 302 and 303, the first signal processing unit 304, and the second signal processing unit 305 that are illustrated in FIG. 4.

A TSV wire 354 (the TSV wire 5030 in FIG. 10) and a TSV wire 355 (the TSV wire 5020 in FIG. 10) are illustrated in an upper part of FIG. 9. A TSV wire 351 (the TSV wire 5010 in FIG. 10), a TSV wire 352 (the TSV wire 5040 in FIG. 10), and a TSV wire 353 (the TSV wire 5050 in FIG. 10) are illustrated in a lower part of FIG. 9.

Referring back to FIG. 10, in the bonding portions 1040a and 1040b of the first substrate 1100, a plurality of bonding portions not electrically connected with the first semiconductor region 1011 of the first substrate 1100 or a semiconductor region included in a circuit in the second substrate 2100 are disposed. These bonding portions are disposed to strengthen bonding between the first substrate 1100 and the second substrate 2100. These bonding portions may be electrically floating, or electrically connecting to either one of the drive voltage or the ground voltage.

(Manufacturing Method)

Figure 11:
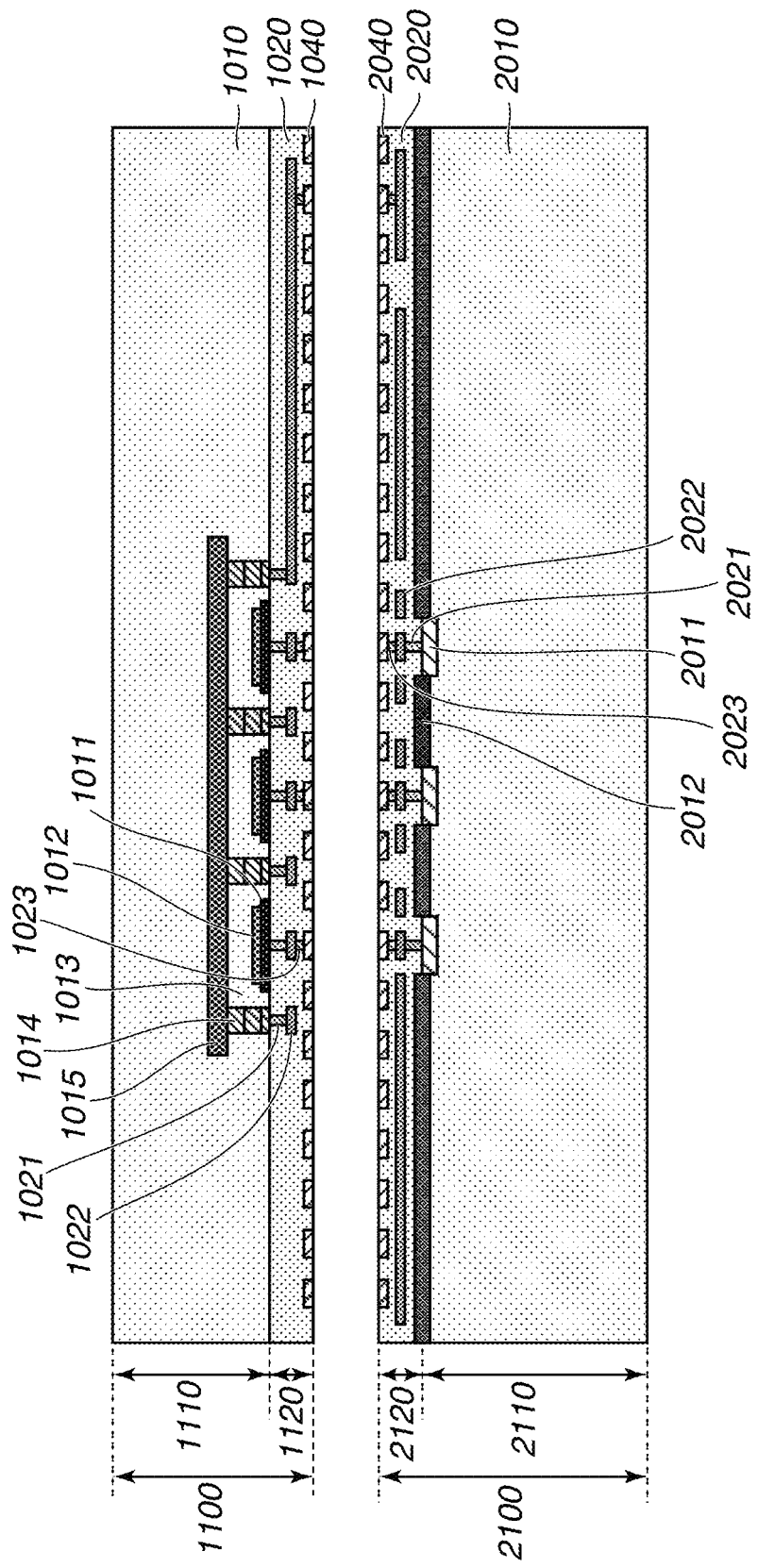
FIG. 11 illustrates a manufacturing process of the photoelectric conversion apparatus according to the first exemplary embodiment.

FIGS. 11 to FIGS. 13 and 13B are diagrams illustrating a manufacturing method of the photoelectric conversion apparatus 1000 according to a first exemplary embodiment. FIG. 11 is a diagram illustrating a process of bonding the first substrate 1100 and the second substrate 2100. Specifically, the wiring structure 1120 (first wiring structure) of the first substrate 1100 and the wiring structure 2120 (second wiring structure) of the second substrate 2100 are stacked between a first semiconductor layer 1010 and the second semiconductor layer 2010. In this process, a metal bonding portion is formed by bonding a bonding portion 1040 of the first substrate 1100 and a bonding portion 2040 of the second substrate 2100.

Figure 12:
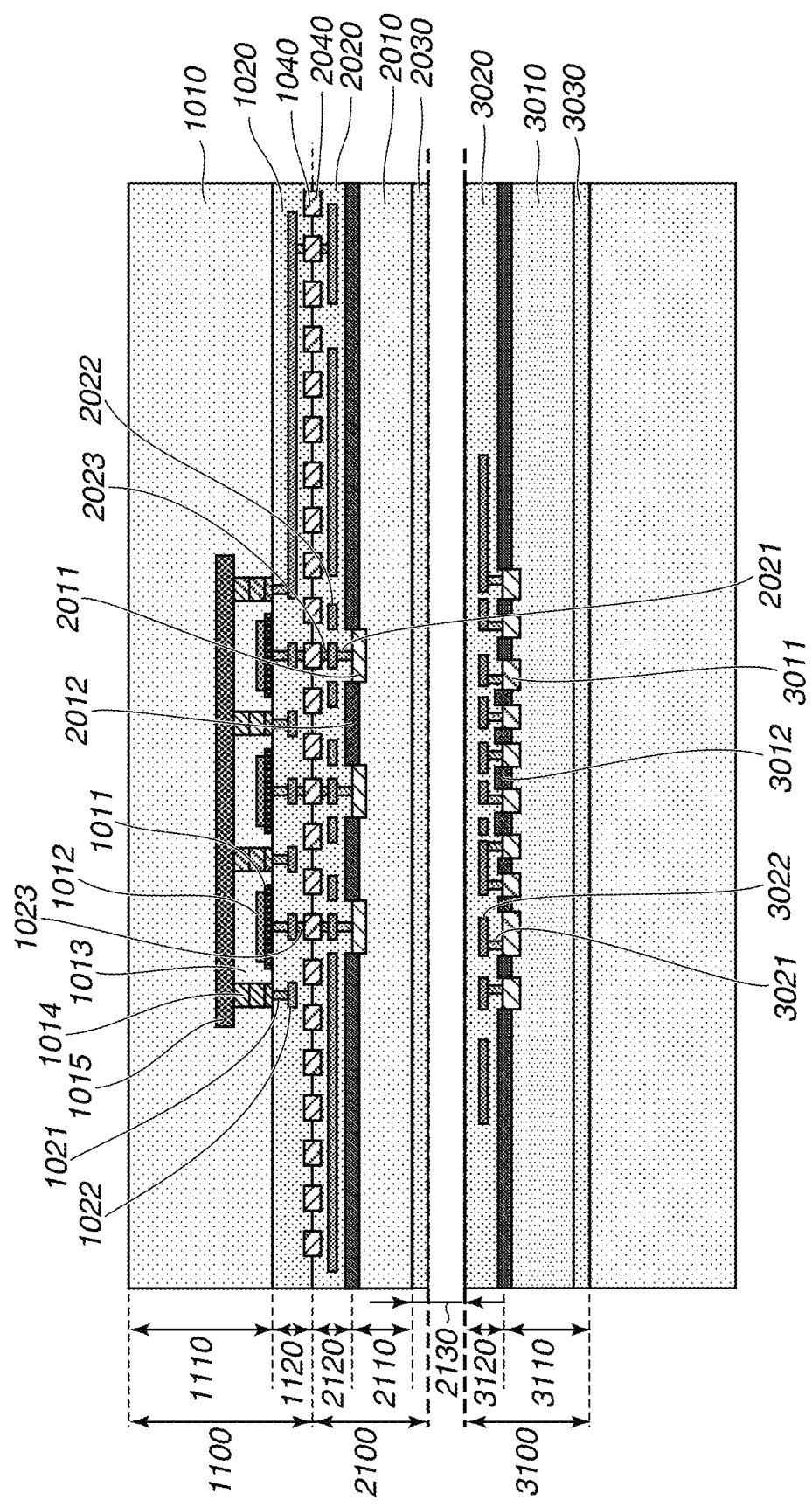
FIG. 12 illustrates the manufacturing process of the photoelectric conversion apparatus according to the first exemplary embodiment.

FIG. 12 is a diagram illustrating a process of stacking the third substrate 3100 on the first substrate 1100 and the second substrate 2100 after stacking the first substrate 1100 and the second substrate 2100. Specifically, a wiring structure 3020 (third wiring structure) of the third substrate 3100 is disposed between the second semiconductor layer 2010 and the third semiconductor layer 3010.

Here, before the third substrate 3100 is stacked, the second semiconductor layer 2010 of the second substrate 2100 is thinned by a thinning process. After the thinning process of the second semiconductor layer 2010, an insulating layer 2030 is formed. The insulating layer 2030 is a layer made of silicon oxide, for example. After that, as illustrated in FIG. 12, the third substrate 3100 is stacked on a stacked member of the first substrate 1100 and the second substrate 2100.

Figure 13A:
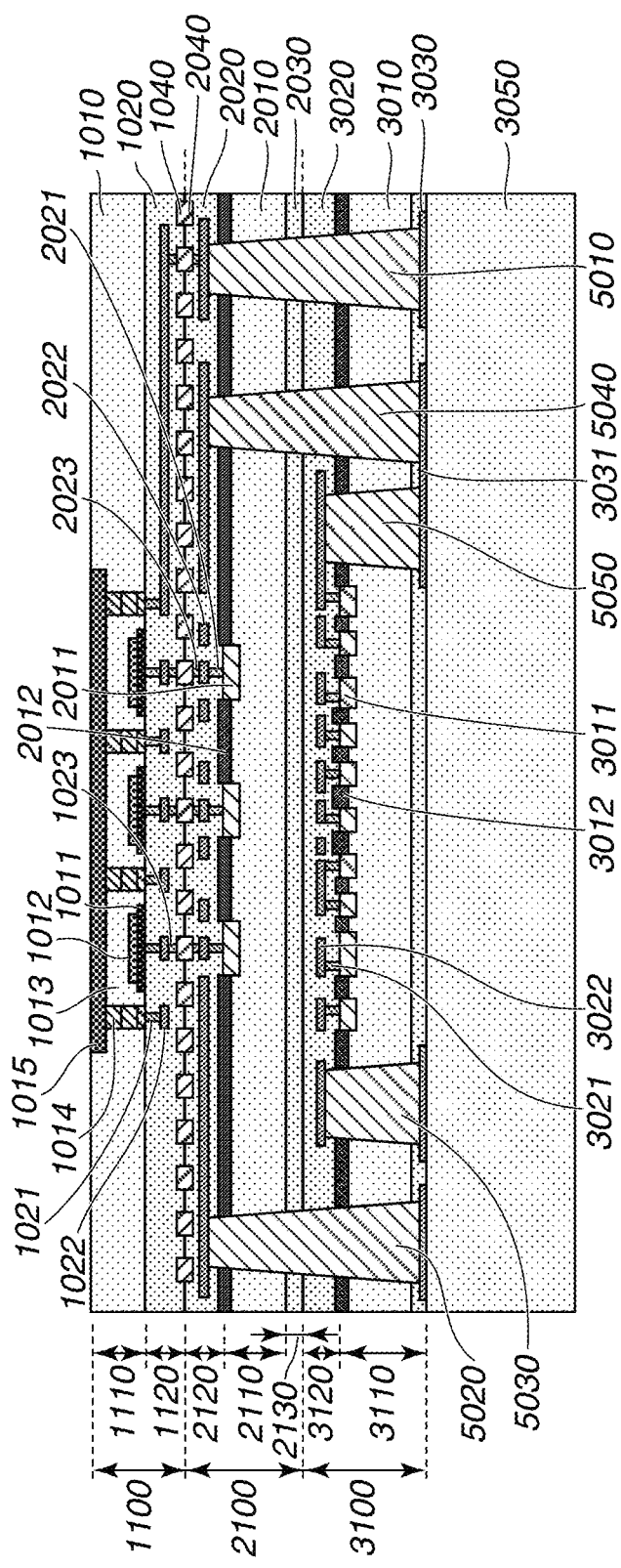
FIG. 13A illustrates the manufacturing process of the photoelectric conversion apparatus according to the first exemplary embodiment.

FIG. 13A is a diagram illustrating a wiring process of TSV wires and a thinning process of the first substrate 1100. Specifically, the TSV wires 5010 to 5050 are formed, and a support substrate 3050 for the third substrate 3100 is formed in the surface (rear surface) of the third substrate 3100 below the third semiconductor layer 3010. Next, a thinning process of thinning the first semiconductor layer 1010 of the first substrate 1100 from the light incidence surface side (rear surface) is performed. Formation of the support substrate 3050 is necessary for the thinning process of the first semiconductor layer 1010.

Figure 13B:
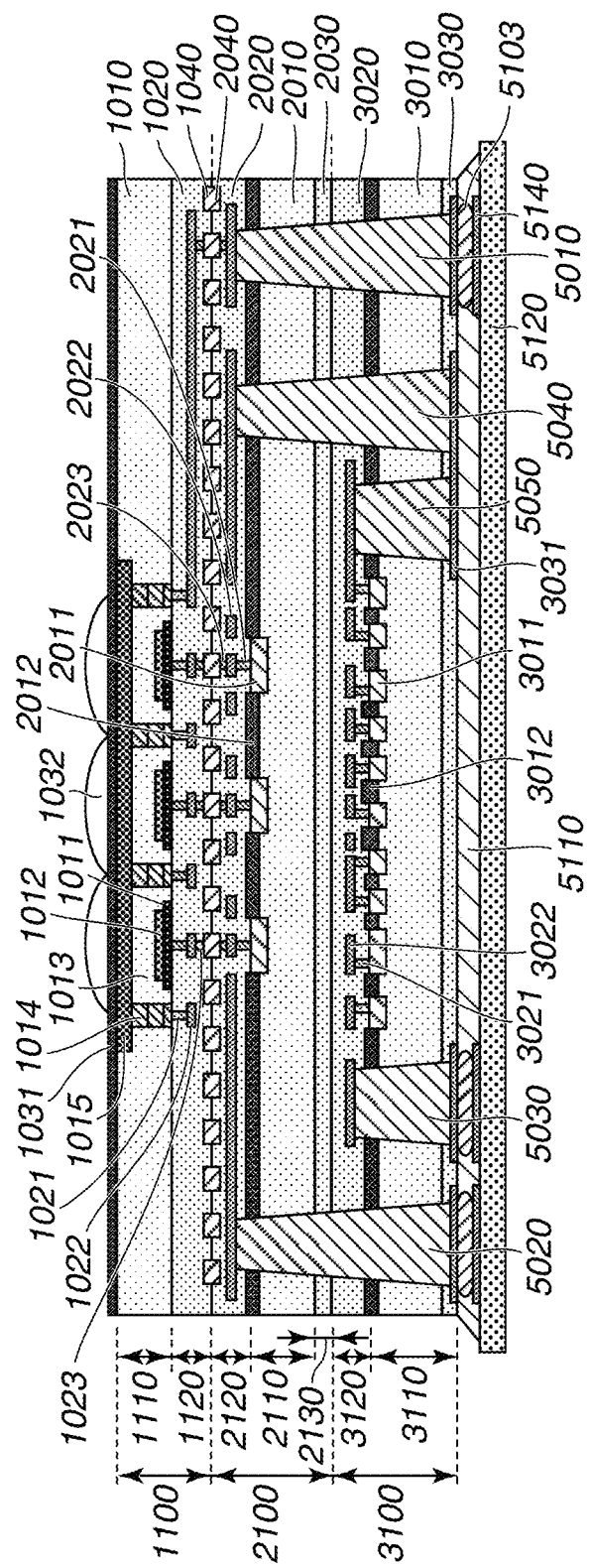
FIG. 13B illustrates the manufacturing process of the photoelectric conversion apparatus according to the first exemplary embodiment.

FIG. 13B is a diagram illustrating a later wafer process and a packaging process. Specifically, first, the pinning layer 1031 and the microlens 1032 are formed. Next, the support substrate 3050 for the third substrate 3100 is detached. The wafer process is completed. Lastly, as the packaging process, the package substrate 5120 is formed via the bump 5130 and the insulating bonding region 5110.

The thickness of the first substrate 1100 in which a pixel is disposed is a thickness of about ⅕ to ¹/₁₀ of the thickness of the second substrate 2100 or the third substrate 3100. This is because the thickness of the first semiconductor layer 1110 thinned to about 2 to 10 μm in the above-described thinning process in accordance with the wavelength of light to be photoelectrically-converted. The thickness of the second substrate 2100 or the third substrate 3100 is determined depending on elements in each substrate. In a case where a DRAM is disposed in the third substrate 3100 as a memory, for example, the third substrate 3100 having the thickness of about 50 to 100 μm is formed. The same applies to a case where a processing circuit other than a memory is disposed in the third substrate 3100. Here, the number of layers of wires formed in the wiring structure 1120 of the first substrate 1100 is smaller than the number of layers of wires formed in a wiring structure of a substrate in which a memory and a processing circuit are disposed. Both the number of layers of wires disposed in the wiring structure 1120 of the first substrate 1100 and the number of layers of wires formed in a wiring structure of a substrate in which a memory and a processing circuit are disposed are about five to ten layers. In each wiring structure, wires containing different main components may be formed in wiring layers. Examples of main components include aluminum, copper, and tungsten. For example, among six wiring layers, the main component of one layer may be aluminum, and the main component of the remaining five layers may be copper. In addition, the number of wiring layers with different main components may increase for each wiring structure. For example, in the wiring structure 1120 of the first substrate 1100, the most-frequently used main component of each wiring layer may be copper, and in the wiring structure 2120 of the second substrate 2100, the most-frequently used main component of each wiring layer may be aluminum.

Second Exemplary Embodiment

Figure 14:
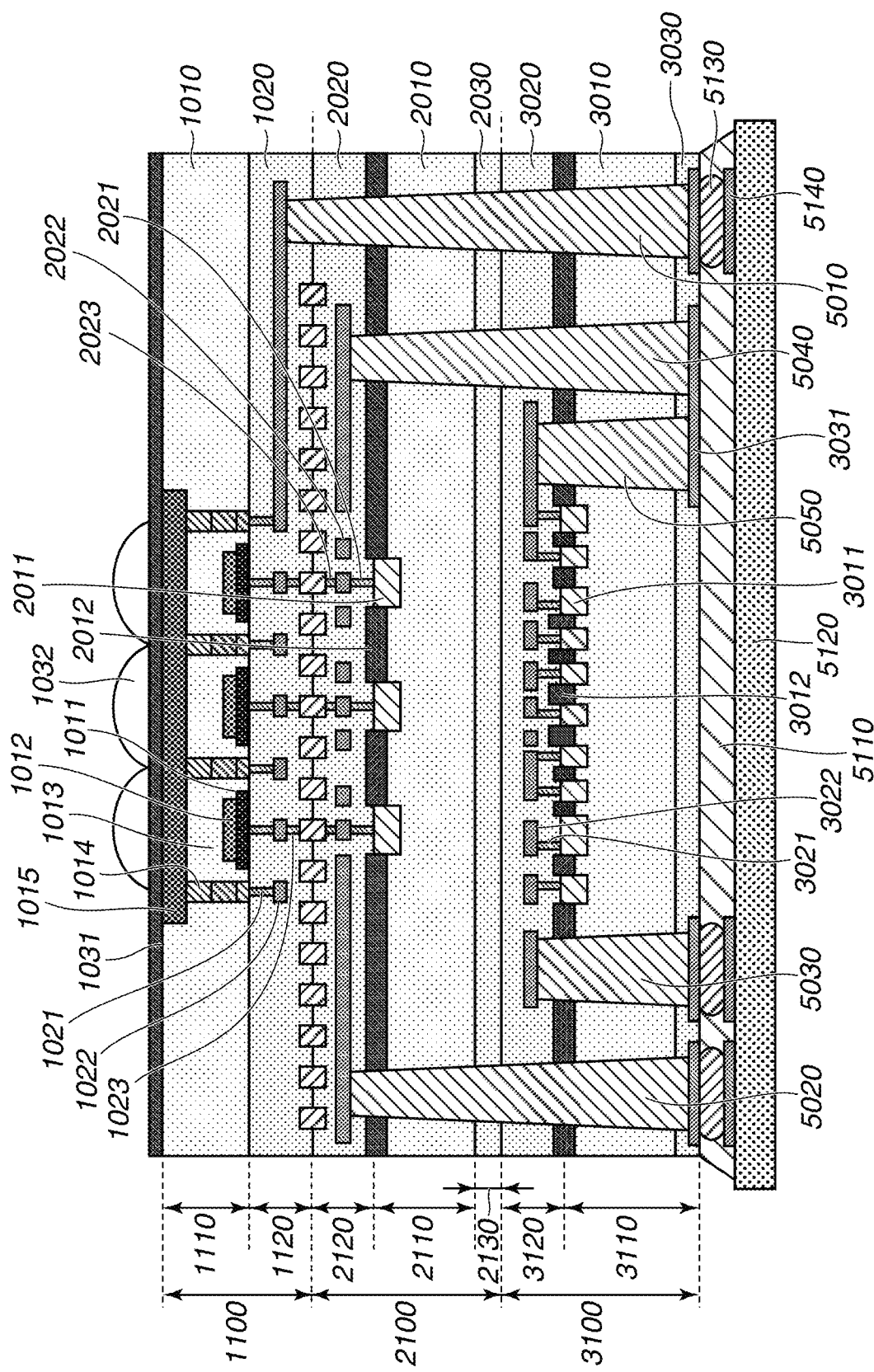
FIG. 14 is a cross-sectional view of a photoelectric conversion apparatus according to a second exemplary embodiment.

FIG. 14 illustrates a configuration of a second exemplary embodiment. The present exemplary embodiment differs from the first exemplary embodiment in that the TSV wire 5010 is in contact with the wiring structure 1120 of the first substrate 1100.

That is, in the first exemplary embodiment, the TSV wire 5010 is in contact with the wiring structure 2120 of the second substrate 2100 as illustrated in FIG. 10, whereas in the second exemplary embodiment, the TSV wire 5010 penetrates through the wiring structure 2120 of the second substrate 2100 and is in contact with the wiring structure 1120 of the first substrate 1100. A voltage is supplied to the TSV wire 5010 not via metal bonding disposed between the wiring structure 1120 of the first substrate 1100 and the wiring structure 2120 of the second substrate 2100.

Here, the voltage VL supplied to the TSV wire 5010 is a voltage to be supplied to the fourth semiconductor region 1014 and is a high voltage. A circuit formed by a fine process may be disposed in the signal processing unit 201 in the second substrate 2100. The configuration of the present exemplary embodiment allows a voltage to be supplied to the fourth semiconductor region 1014 by the TSV wire 5010 not via a wire disposed in a wiring layer of the wiring structure 2120 of the second substrate 2100. This reduces the possibility of occurrence of damage in a circuit disposed in the second substrate 2100 to which the fine process has been applied.

Third Exemplary Embodiment

Figure 15:
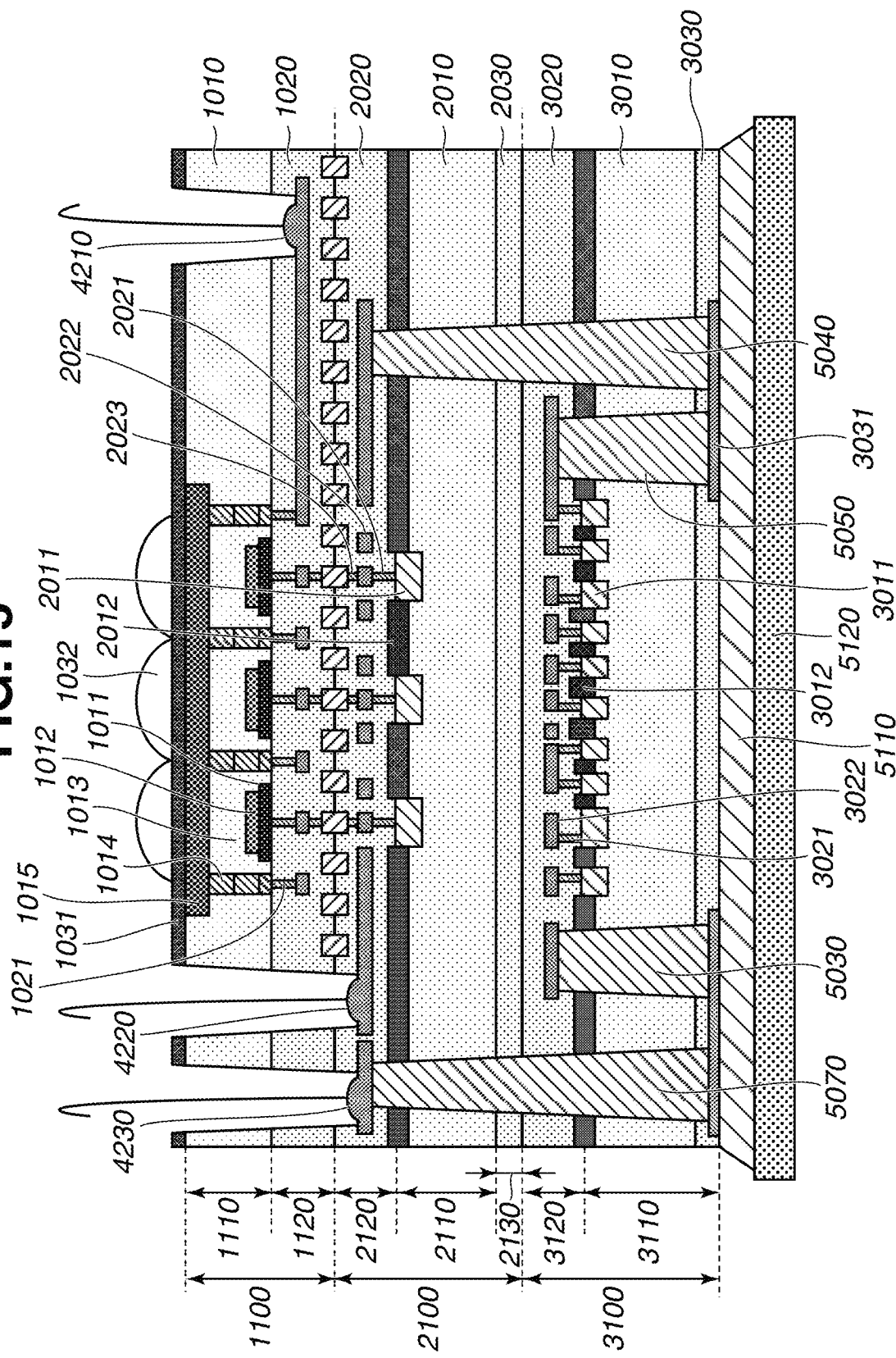
FIG. 15 is a cross-sectional view of a photoelectric conversion apparatus according to a third exemplary embodiment.

FIG. 15 illustrates a configuration of a third exemplary embodiment. The present exemplary embodiment differs from the first exemplary embodiment and the second exemplary embodiment in that an electrode electrically connecting with the outside is disposed on a light incidence side.

That is, in the first and the second exemplary embodiments, the electrode 5140 disposed in a surface (second surface) opposite to the light incidence surface (first surface) serves as an electrode electrically connecting with the outside. In the present exemplary embodiment, electrodes 4210, 4220, and 4230 disposed on the light incidence side serve as electrodes electrically connecting with the outside. These electrodes 4210 to 4230 will also be referred to as pad electrodes.

As described above, the voltage VL to be supplied to the fourth semiconductor region 1014 is a high voltage, and a circuit to which the fine process has been applied is disposed in the second substrate 2100. Thus, as illustrated in FIG. 15, with a configuration in which a voltage supplied from the electrode 4210 is controlled to be supplied only to the first substrate 1100, high voltage application to a circuit disposed in the second substrate 2100 to which the fine process has been applied is able to be prevented.

In FIG. 15, the electrode 4220 for supplying a drive voltage for the second substrate 2100 from the outside is disposed in a wiring layer of the wiring structure 2120. A circuit for a high-speed operation is sometimes disposed in the second substrate 2100. Here, a case of supplying a drive voltage to a wiring layer of the wiring structure 2120 of the second substrate 2100 via the wiring structure 1120 of the first substrate 1100 is regarded as a first case. A case of directly supplying a voltage to the wiring structure 2120 of the second substrate 2100 is regarded as a second case. As compared with the first case, the second case has a shorter wire length from an electrode connecting with the outside to a circuit disposed in the second substrate 2100. If the wire length is long, an operation of a circuit requiring a high-speed operation might be decreased due to signal propagation delay. In view of the foregoing, in the present exemplary embodiment, the electrode 4220 for supplying a drive voltage for the second substrate 2100 from the outside is disposed in a wiring layer of the wiring structure 2120.

Furthermore, in FIG. 15, the electrode 4230 for supplying a drive voltage for the third substrate 3100 from the outside is in contact with a wiring layer of the wiring structure 2120 of the second substrate 2100. The electrode 4230 electrically connects with a TSV wire 5070 via the wiring layer of the wiring structure 2120 of the second substrate 2100. The TSV wire 5070 in FIG. 15 corresponds to the TSV wire 5030 in FIG. 10. The TSV wire 5070 in FIG. 15 is however configured to penetrate through the semiconductor layer 2010 of the second substrate 2100, the wiring structure 3120 of the third substrate 3100, and the semiconductor layer 3010 of the third substrate 3100, and electrically connect with the TSV wire 5030.

Fourth Exemplary Embodiment

Figure 16:
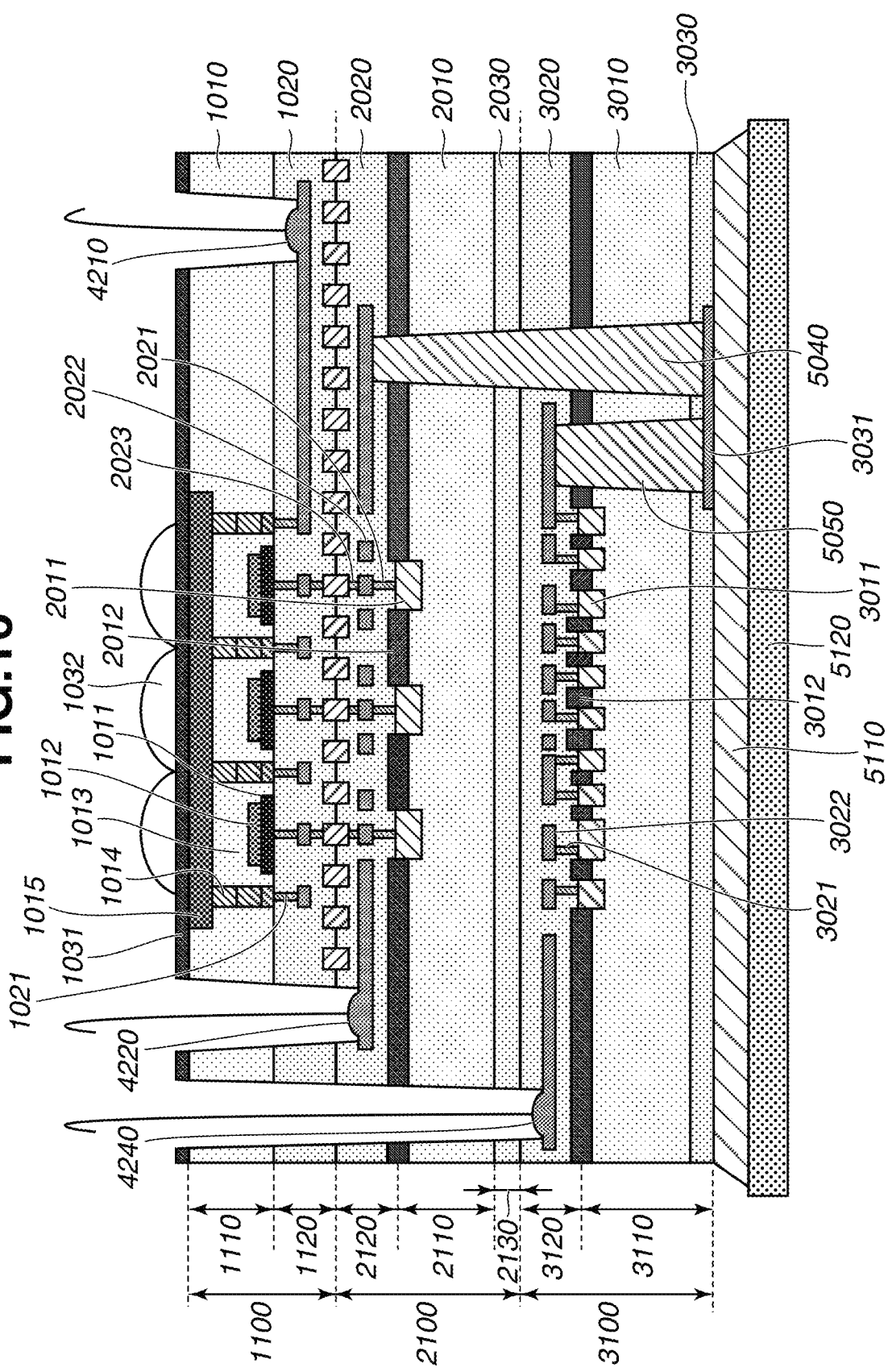
FIG. 16 is a cross-sectional view of a photoelectric conversion apparatus according to a fourth exemplary embodiment.

FIG. 16 illustrates a configuration of a fourth exemplary embodiment. The present exemplary embodiment differs from the third exemplary embodiment in that an electrode that is electrically connected with the outside and supplies a drive voltage to a circuit in the third substrate 3100 is disposed in the wiring structure 3120 of the third substrate 3100.

A circuit requiring a high-speed operation is sometimes disposed also in the third substrate 3100. In view of the foregoing, as illustrated in FIG. 16, an electrode 4240 that supplies a drive voltage for the third substrate 3100 from the outside can be disposed in a wiring layer of the wiring structure 3120 of the third substrate 3100. With this configuration, a wire length from the electrode 4240 that supplies a drive voltage from the outside to a circuit disposed in the third substrate 3100 is shortened, which leads to a decrease in possibility of slowing down of an operation of a circuit requiring a high-speed operation.

In formation of the electrodes 4210, 4220, and 4240 illustrated in FIG. 16, a pad opening is formed by etching an interlayer dielectric film or the like that is a part of a silicon substrate or a wiring structure. Since wiring layers in which the three electrodes are brought into contact are at different height levels, an opening process is performed the number of times corresponding to the number of pad openings.

Fifth Exemplary Embodiment

Figure 17:
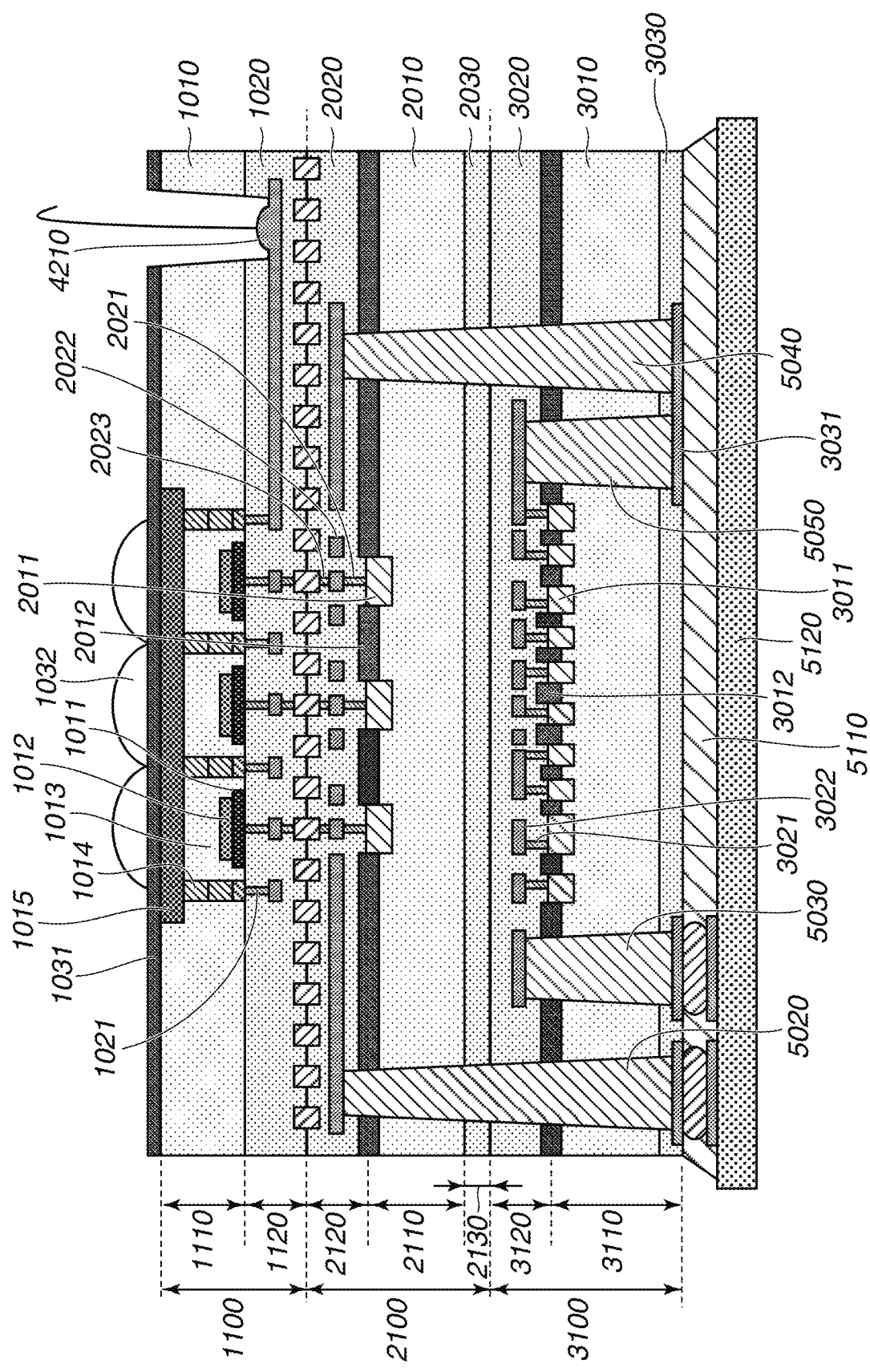
FIG. 17 is a cross-sectional view of a photoelectric conversion apparatus according to a fifth exemplary embodiment.

FIG. 17 illustrates a configuration of a fifth exemplary embodiment. The present exemplary embodiment differs from the first and second exemplary embodiments in that an electrode that is electrically connected with the outside and supplies a voltage to the fourth semiconductor region 1014 of the first substrate 1100 is formed on the light emission surface side.

More specifically, in the first exemplary embodiment described with reference to FIG. 10, and the second exemplary embodiment described with reference to FIG. 14, all electrodes electrically connecting with the outside are formed in the surface (second surface) opposite to the light incidence surface (first surface). From the viewpoint of reliability degradation prevention, a wire for high voltage to be supplied to the first substrate 1100 is desirably configured to supply a voltage not via the second substrate 2100 or the third substrate 3100. Thus, in FIG. 17, an electrode 4210 is disposed in a wiring layer of the wiring structure 1120 of the first substrate 1100, and a high voltage is not to be supplied to the second substrate 2100 and the third substrate 3100.

Sixth Exemplary Embodiment

Figure 18:
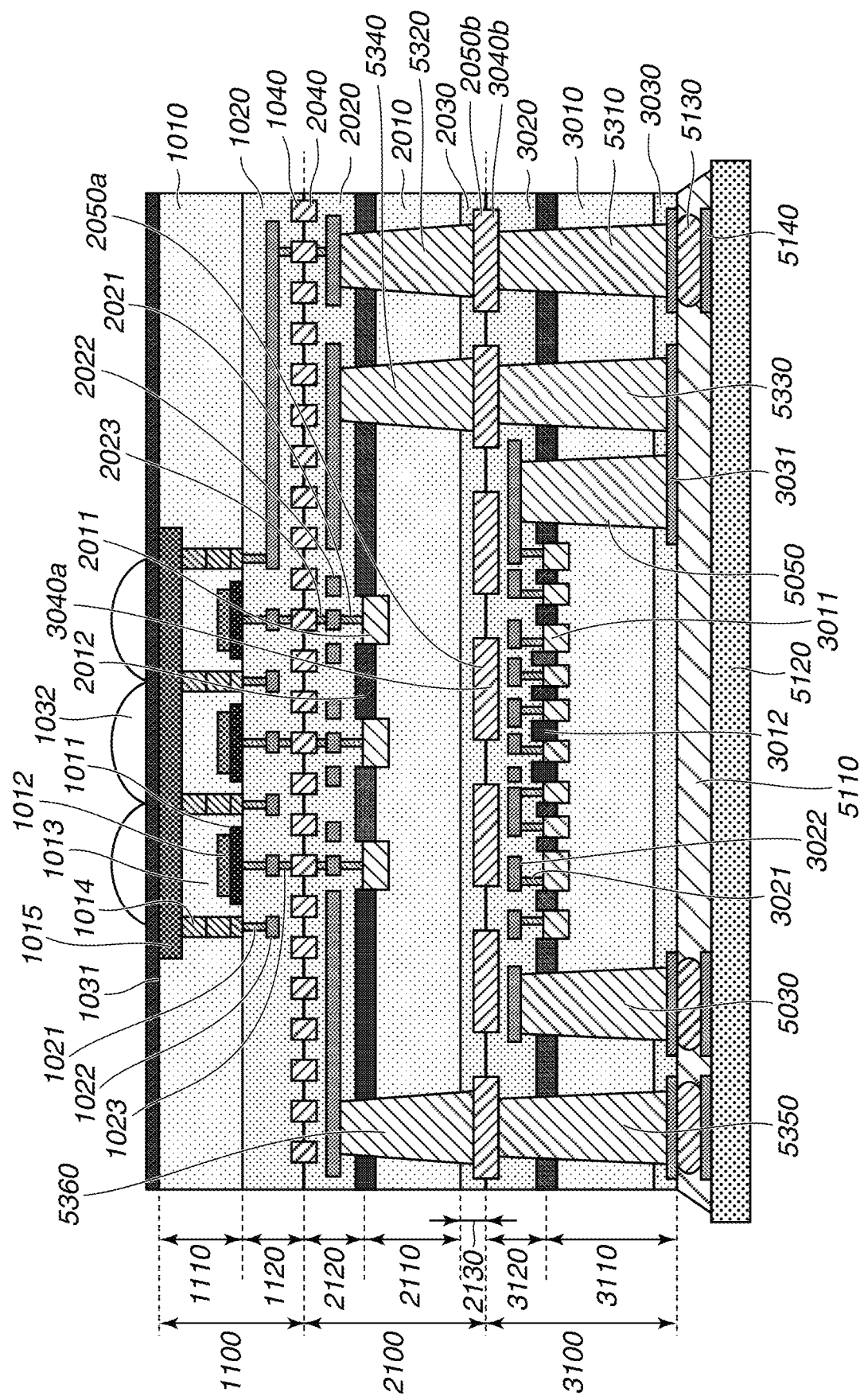
FIG. 18 is a cross-sectional view of a photoelectric conversion apparatus according to a sixth exemplary embodiment.

FIG. 18 illustrates a configuration of a sixth exemplary embodiment. The present exemplary embodiment differs from the first exemplary embodiment in that the wiring structure 2120 of the second substrate 2100 and the wiring structure 3120 of the third substrate 3100 have a metal bonding structure.

More specifically, in FIG. 10, the electrode 5140 and the wiring layer of the wiring structure 2120 of the second substrate 2100 are connected by one TSV wire 5010. In contrast to this, in FIG. 18, using TSV wires that have a two-step structure including two TSV wires 5310 and 5320, the electrode 5140 and the wiring structure 2120 of the second substrate 2100 are connected. A metal bonding structure formed by connection of a bonding portion 2050*b* of the second substrate 2100 and a bonding portion 3040*b* of the third substrate 3100 is disposed between the TSV wires 5310 and 5320.

In FIG. 18, the TSV wire 5040 in FIG. 10 is changed to TSV wires that have a two-step structure including TSV wires 5330 and 5340. A metal bonding structure is also disposed between the TSV wires 5330 and 5340.

Furthermore, in FIG. 18, the TSV wire 5020 in FIG. 10 is also changed to TSV wires that have a two-step structure including TSV wires 5350 and 5360. A metal bonding structure is also disposed between the TSV wires 5350 and 5360.

According to such a configuration illustrated in FIG. 18, a TSV wire penetrating through both the semiconductor layer 2010 of the second substrate 2100 and the semiconductor layer 3010 of the third substrate 3100 can be eliminated.

In a pixel region, a metal bonding structure formed by connection of a bonding portion 2050a of the second substrate 2100 and a bonding portion 3040a of the third substrate 3100 is disposed. The metal bonding is not necessarily a part of a circuit disposed in each substrate. This improves the bonding strength of the second substrate 2100 and the third substrate 3100.

Seventh Exemplary Embodiment

Figure 19:
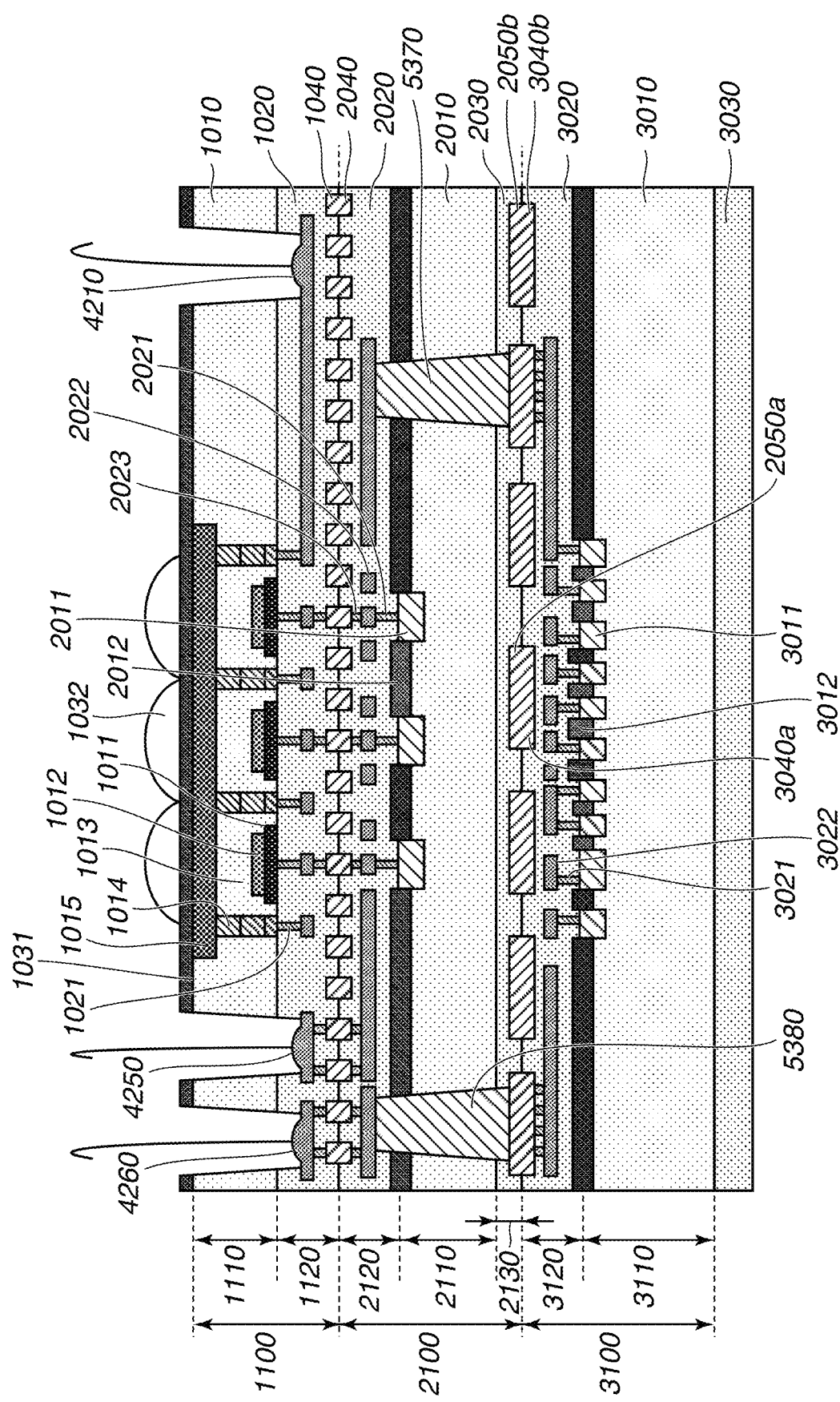
FIG. 19 is a cross-sectional view of a photoelectric conversion apparatus according to a seventh exemplary embodiment.

FIG. 19 illustrates a configuration of a seventh exemplary embodiment. The present exemplary embodiment differs from the third exemplary embodiment illustrated in FIG. 15 in that the second substrate 2100 and the third substrate 3100 are electrically connected by a metal bonding structure. The present exemplary embodiment also differs from the sixth exemplary embodiment illustrated in FIG. 18, in that an electrode connecting with the outside is disposed on the light incidence surface (first surface) side.

As illustrated in FIG. 19, because the bonding portion 2050b of the second substrate 2100 and the bonding portion 3040b of the third substrate 3100 are disposed, functions of the TSV wires 5050 and 5040 illustrated in FIG. 15 are integrated into a TSV wire 5370 in FIG. 19. In FIG. 15, while the TSV wire 5040 penetrates through both the semiconductor layer 2010 of the second substrate 2100 and the semiconductor layer 3010 of the third substrate 3100, such a TSV wire can be eliminated according to the configuration of the seventh exemplary embodiment.

Functions of the TSV wires 5030 and 5070 illustrated in FIG. 15 are integrated into a TSV wire 5380 in FIG. 19. In FIG. 15, while the TSV wire 5070 penetrates through both the semiconductor layer 2010 of the second substrate 2100 and the semiconductor layer 3010 of the third substrate 3100, such a TSV wire can be eliminated according to the configuration of the seventh exemplary embodiment.

Furthermore, a wire that supplies a drive voltage to a circuit disposed in the second substrate 2100 also electrically connects with a wiring layer included in the wiring structure 1120 of the first substrate 1100 via the bonding portion 1040b of the first substrate 1100 and the bonding portion 2040b of the second substrate 2100. An electrode 4250 is disposed in the wiring layer. The electrode 4250 serves as a pad portion electrically connecting with the outside.

Moreover, a wire that supplies a drive voltage to a circuit disposed in the third substrate 3100 also electrically connects with a wiring layer included in the wiring structure 1120 of the first substrate 1100, via the bonding portion 2050b of the second substrate 2100 and the bonding portion 3040b of the third substrate 3100. An electrode 4260 is disposed in the wiring layer. The electrode 4260 serves as a pad portion electrically connecting with the outside.

As described above, the electrodes 4210, 4250, and 4260 are disposed in contact with the same wiring layer of the wiring structure 1120 of the first substrate 1100. For this reason, in formation of pad opening portions to form these electrodes, the depths of pad openings are substantially the same. Consequently, as compared with the example illustrated in FIG. 15, a process of the wiring process becomes easier.

Eighth Exemplary Embodiment

Figure 20:
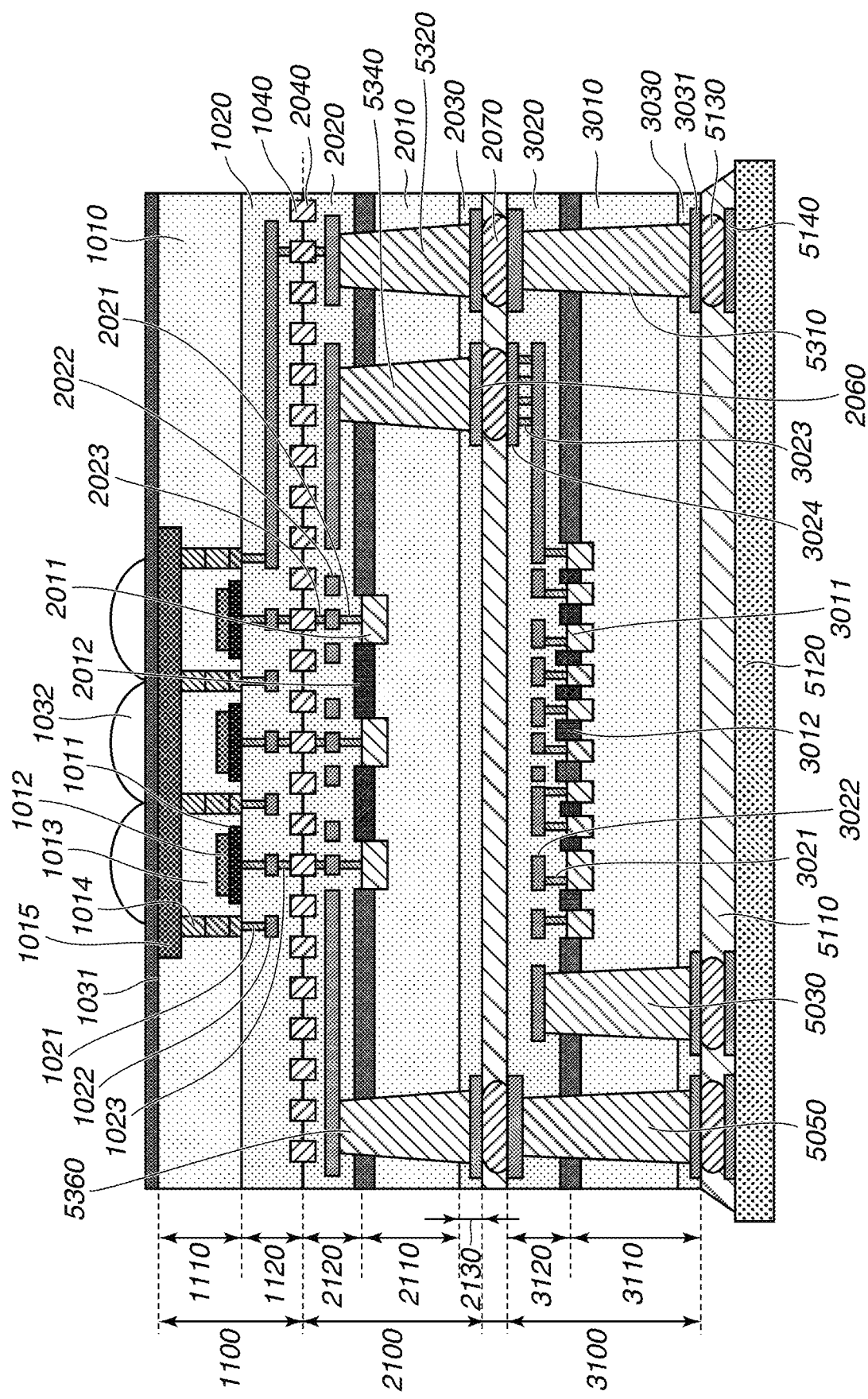
FIG. 20 is a cross-sectional view of a photoelectric conversion apparatus according to an eighth exemplary embodiment.

FIG. 20 illustrates a configuration of an eighth exemplary embodiment. The present exemplary embodiment differs from the sixth exemplary embodiment in that metal bonding is used for bonding between the second substrate 2100 and the third substrate 3100 in the sixth exemplary embodiment, whereas in the eighth exemplary embodiment, a micro bump is used for bonding between the second substrate 2100 and the third substrate 3100.

As illustrated in FIG. 20, the wire 3021 serving as a first via wire and the wire 3022 of the first wiring layer that connects to the wire 3021 are disposed in the wiring structure 3120 of the third substrate 3100. In addition, a wire 3023 serving as a second via wire that connects to the wire 3022 and a wire 3024 serving as a second via wire that connects to the wire 3023 are disposed. In the wiring structure 2120 of the second substrate 2100, a wire 2060 connecting with the TSV wire 5340 is disposed, and the wire 2060 in the second substrate 2100 and the wire 3024 in the third substrate 3100 are electrically connected via a micro bump 2070. The micro bump 2070 is formed by Cu bump bonding that uses solid-phase diffusion, or by micro bump bonding that uses solder melting. An organic filler is inserted into a clearance gap between micro bumps 2070.

Ninth Exemplary Embodiment

Figure 21:
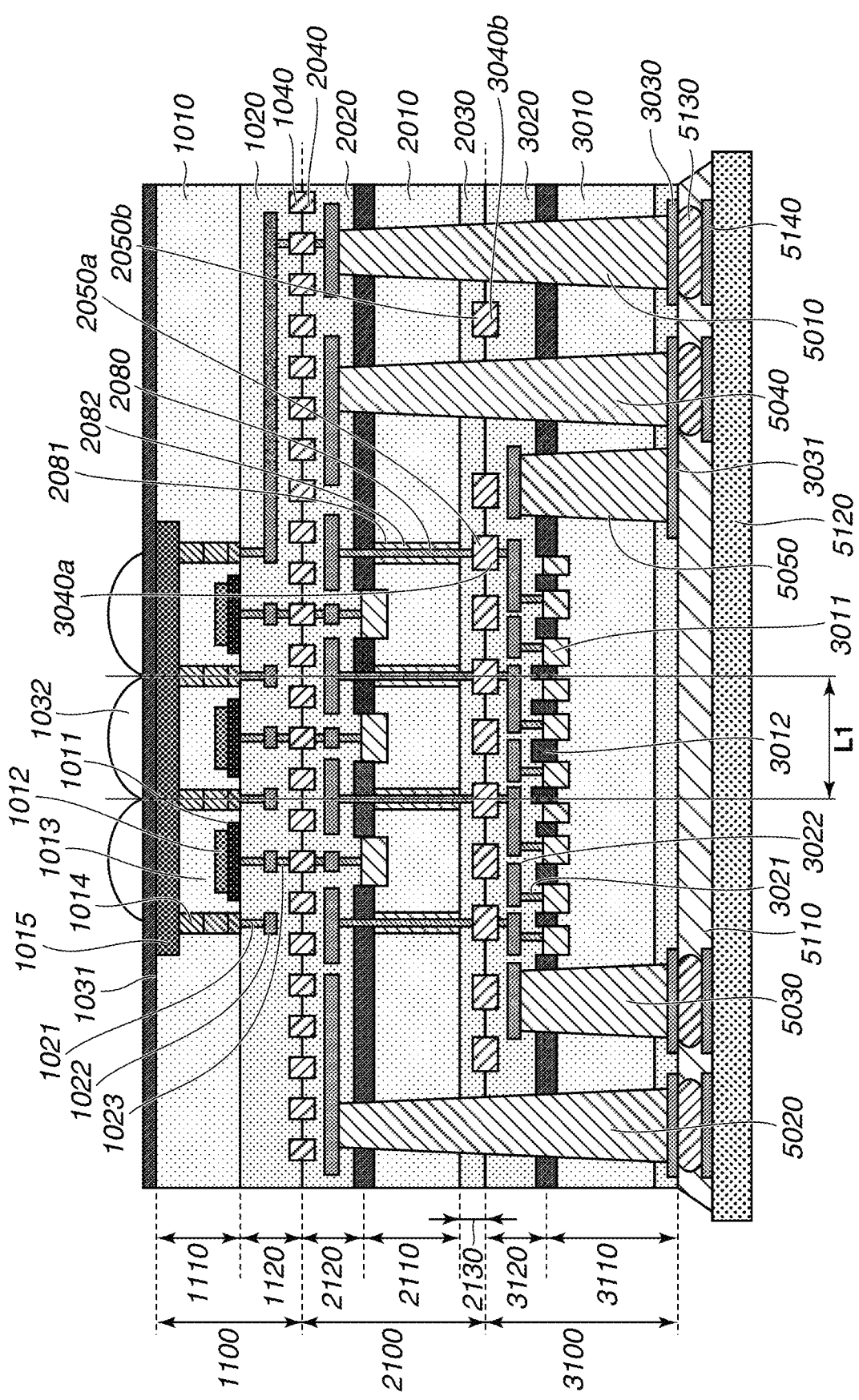
FIG. 21 is a cross-sectional view of a photoelectric conversion apparatus according to a ninth exemplary embodiment.

FIG. 21 illustrates a configuration of a ninth exemplary embodiment. The present exemplary embodiment differs from the first exemplary embodiment in that a TSV wire is used to input a signal output from the second substrate 2100 to the third substrate 3100 in the first exemplary embodiment, whereas in the present exemplary embodiment, metal bonding is used for this purpose.

As illustrated in FIG. 21, an output from a circuit disposed in the second substrate 2100 is input via a wire 2080 to a circuit disposed in the third substrate 3100. In the second substrate 2100, a deep trench structure 2081 (i.e., deep trench isolation (DTI) structure) penetrating through the semiconductor layer 2010 of the second substrate 2100 is formed. The inside of the trench structure 2081 is filled with an insulator 2082, and electric connection between the wire 2080 and the semiconductor layer 2010 of the second substrate 2100 is avoided.

In FIG. 21, a circuit corresponding to each pixel is disposed in the second substrate 2100, and FIG. 21 illustrates that an output from the circuit corresponding to each pixel is input to a circuit in the third substrate 3100. In this case, the wire 2080 is disposed individually to each pixel, and the wire 2080 is input to the circuit in the third substrate 3100 via the bonding portion 2050a of the second substrate 2100 and the bonding portion 3040a of the third substrate 3100. The circuit in the third substrate 3100 is also disposed individually to each pixel. That is, in the example illustrated in FIG. 21, a photoelectric conversion unit and a circuit in the second substrate 2100 to which a signal is input from the photoelectric conversion unit are electrically connected for each pixel via metal bonding. In addition, a circuit in the second substrate 2100 that outputs a signal to a circuit in the third substrate 3100, and the circuit in the third substrate 3100 are electrically connected for each pixel via metal bonding.

In FIG. 21, a distance L1 is between adjacent wires 2080. In a case where there are a plurality of distances between adjacent wires 2080, the shortest distance is defined as the distance L1. A relationship of $0.8P<L1<1.2P$ is satisfied, where P is a pitch between pixels. It is desirable that a relationship of $0.9P<L1<1.1P$ be satisfied.

The pitch P may be a distance between contact wires 1021 connecting with the first semiconductor region 1011. That is, the pitch P may be a distance between a first contact wire connecting with the first semiconductor region 1011 of a first pixel and a second contact wire connecting with the first semiconductor region 1011 of a second pixel adjacent to the first pixel.

In FIG. 21, the TSV wires 5040 and 5050 electrically connecting the second substrate 2100 and the third substrate 3100 are disposed. In FIG. 10 according to the first exemplary embodiment, the TSV wires 5040 and 5050 serves as wires for inputting signals output from the second substrate 2100 to the third substrate 3100. In the present exemplary embodiment, because the wire 2080 is used as a wire for inputting signals output from the second substrate 2100 to the third substrate 3100, the TSV wires 5040 and 5050 can be eliminated.

On the other hand, a power wire that supplies a drive voltage or a ground wire may be sometimes shared by a circuit disposed in the second substrate 2100 and a circuit disposed in the third substrate 3100. In this case, the TSV wires 5040 and 5050 illustrated in FIG. 21 are used so that a common potential is supplied to the circuits disposed in the second substrate 2100 and the third substrate 3100. Alternatively, a metal bonding wire including the bonding portion 2050*b* of the second substrate and the bonding portion 3040*b* of the third substrate 3100 is used so that a common potential is supplied to the circuits disposed in the second substrate 2100 and the third substrate 3100.

Circuits in the second substrate 2100 respectively corresponding to the pixels may be arranged in a translational symmetry form in a planar view. Alternatively, circuits in the second substrate 2100 respectively corresponding to the pixels may be arranged in line symmetric (mirror symmetric) form in a planar view. In a case where the circuits are arranged in a mirror symmetric form, a first circuit in the second substrate 2100 corresponding to the first pixel and a second circuit in the second substrate 2100 corresponding to the second pixel can easily share a part of functions and members, which leads to achievement of space saving. For example, a well of a MOS transistor included in the first circuit and the second circuit can be shared. This can reduce a circuit area in the second substrate 2100. Especially in a case of disposing photoelectric conversion units at a narrow pitch, it is possible to avoid a case where photoelectric conversion units are not able to be disposed at the narrow pitch due to an area occupied by a circuit in the second substrate 2100.

Circuits in the third substrate 3100 respectively corresponding to the pixels may be arranged in a translational symmetric form or a line symmetric (mirror symmetric) form in a planar view. In the latter case, the above-described advantages can be gained.

As described above, FIG. 21 illustrates an example in which a circuit in the second substrate 2100 that outputs a signal to a circuit in the third substrate 3100, and the circuit in the third substrate 3100 are disposed for each pixel. However, even in a case where a circuit in the second substrate 2100 to which a signal from a photoelectric conversion unit is input is disposed for each pixel, a circuit that performs subsequent signal processing is sometimes disposed to correspond to every pixel block including a plurality of pixels. That is, one signal processing circuit of the second substrate 2100 is disposed for each pixel block. In this case, a circuit in the second substrate 2100 that outputs a signal to a circuit in the third substrate 3100, and the circuit in the third substrate 3100 are electrically connected via metal bonding not for each pixel but for each pixel block. Specifically, the wire 2080 is disposed not for each pixel but for each pixel block. In this case, the number of metal bondings that bond the first substrate 1100 and the second substrate 2100 is larger than the number of metal bondings that bond the second substrate 2100 and the third substrate 3100.

Tenth Exemplary Embodiment

Figure 22:
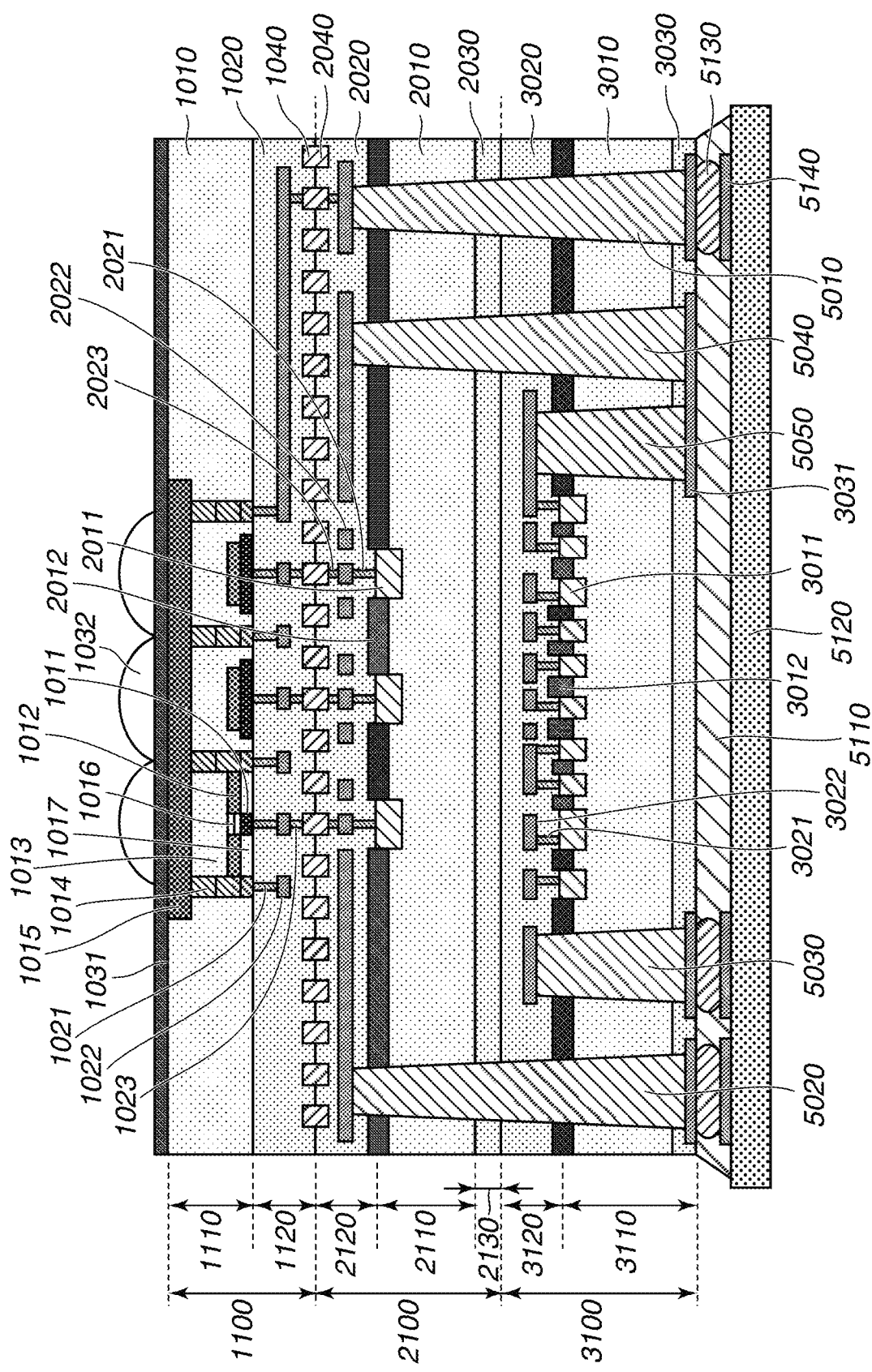
FIG. 22 is a cross-sectional view of a photoelectric conversion apparatus according to a tenth exemplary embodiment.

FIG. 22 illustrates a configuration of a tenth exemplary embodiment. The present exemplary embodiment differs from the first exemplary embodiment in that an avalanche multiplication region in a pixel structure of a photoelectric conversion unit according to the tenth exemplary embodiment is smaller than that of the first exemplary embodiment.

In FIG. 22, the width (length in a traverse direction in FIG. 22) of the first semiconductor region 1011 of the first conductivity type is narrower than the width of the first semiconductor region 1011 in FIG. 10. An area of the first semiconductor region 1011 in FIG. 19 is smaller than an area of the first semiconductor region 1011 in FIG. 10 in a planar view, which is not illustrated.

A sixth semiconductor region 1016 is disposed at a position overlapping the first semiconductor region 1011 of the first conductivity type in a planar view. The conductivity type of the sixth semiconductor region 1016 may be either of the first conductivity type and the second conductivity type. The sixth semiconductor region 1016 is configured to have a potential with respect to a signal charge that is lower than a potential of the second semiconductor region 1012. For example, in a case where the sixth semiconductor region 1016 is of the first conductivity type, an impurity concentration of the sixth semiconductor region 1016 is lower than an impurity concentration of the first semiconductor region 1011.

With such a potential structure, charges generated in the third semiconductor region 1013 are more likely to be collected to the sixth semiconductor region 1016 than to the second semiconductor region 1012. The collected signal charges are subjected to multiplication in an avalanche multiplication region formed between the sixth semiconductor region 1016 and the first semiconductor region 1011.

Furthermore, seventh semiconductor regions 1017 are disposed with the first semiconductor region 1011 of the first conductivity type interposed therebetween. The conductivity type of the seventh semiconductor regions 1017 may be either of the first conductivity type and the second conductivity type. For example, in a case where the seventh semiconductor region 1017 is of the first conductivity type, an impurity concentration of the seventh semiconductor region 1017 of the first conductivity type is lower than an impurity concentration of the first semiconductor region 1011. In a case where the seventh semiconductor region 1017 is of the second conductivity type, an impurity concentration of the seventh semiconductor region 1017 is lower than an impurity concentration of the fourth semiconductor region 1014 of the second conductivity type.

Such a relationship of impurity concentrations leads to a reduction in possibility of formation of an avalanche multiplication region between the first semiconductor region 1011 and the seventh semiconductor region 1017.

In the present exemplary embodiment, with the above-described configuration, charges generated in the third semiconductor region 1013 can be efficiently collected and cause avalanche multiplication, whereby the sensitivity of a photoelectric conversion unit is easily enhanced. Further, an avalanche multiplication region can be made smaller due to a smaller width or area of the first semiconductor region 1011 as compared with the first exemplary embodiment, which reduces a value of a dark count rate (DCR).

Eleventh Exemplary Embodiment

Figure 23:
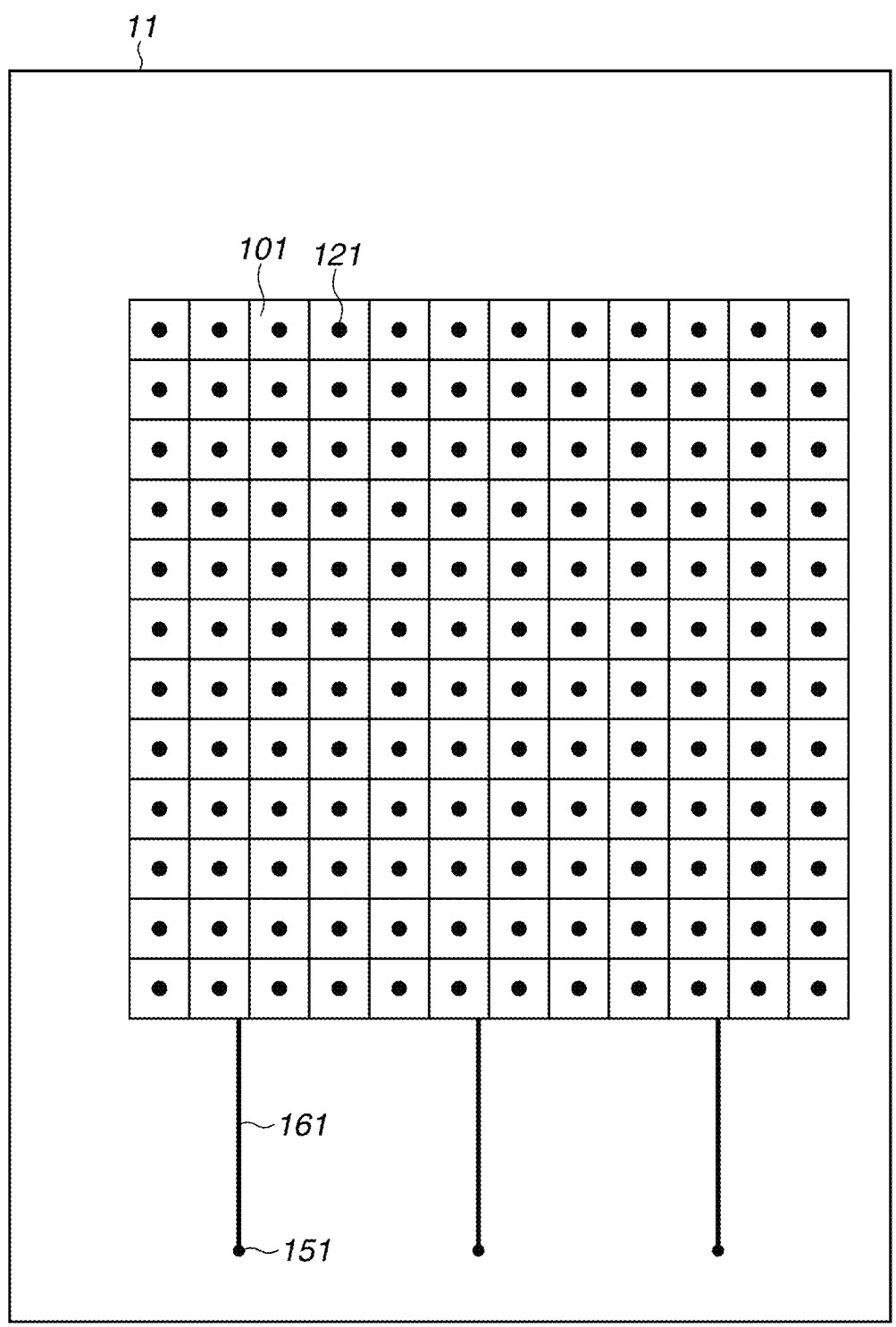
FIG. 23 is a schematic diagram illustrating an electric connection relationship between a first substrate and a second substrate according to an eleventh exemplary embodiment.
Figure 24:
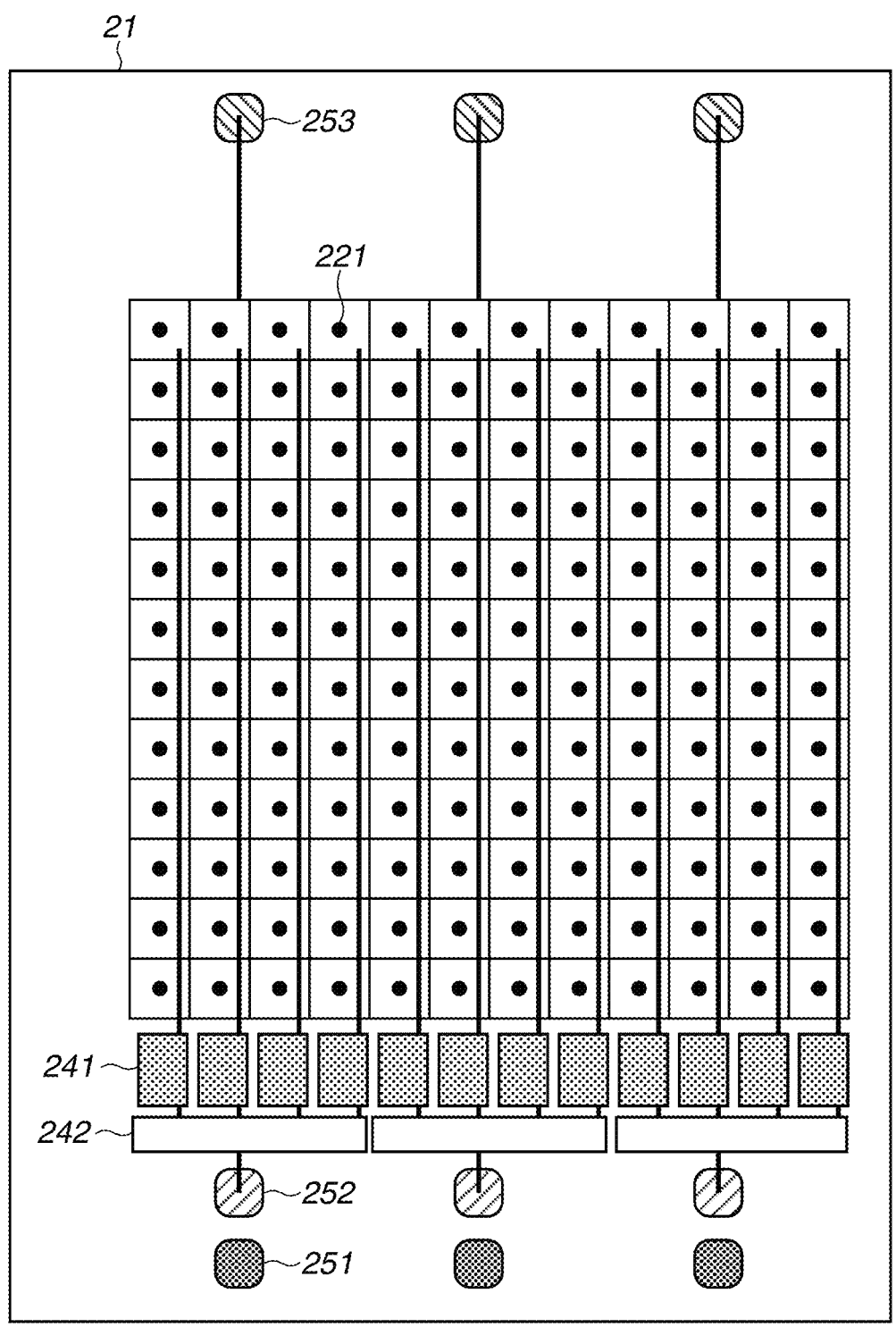
FIG. 24 is a schematic diagram illustrating an electric connection relationship between a second substrate and a third substrate according to the eleventh exemplary embodiment.
Figure 25:
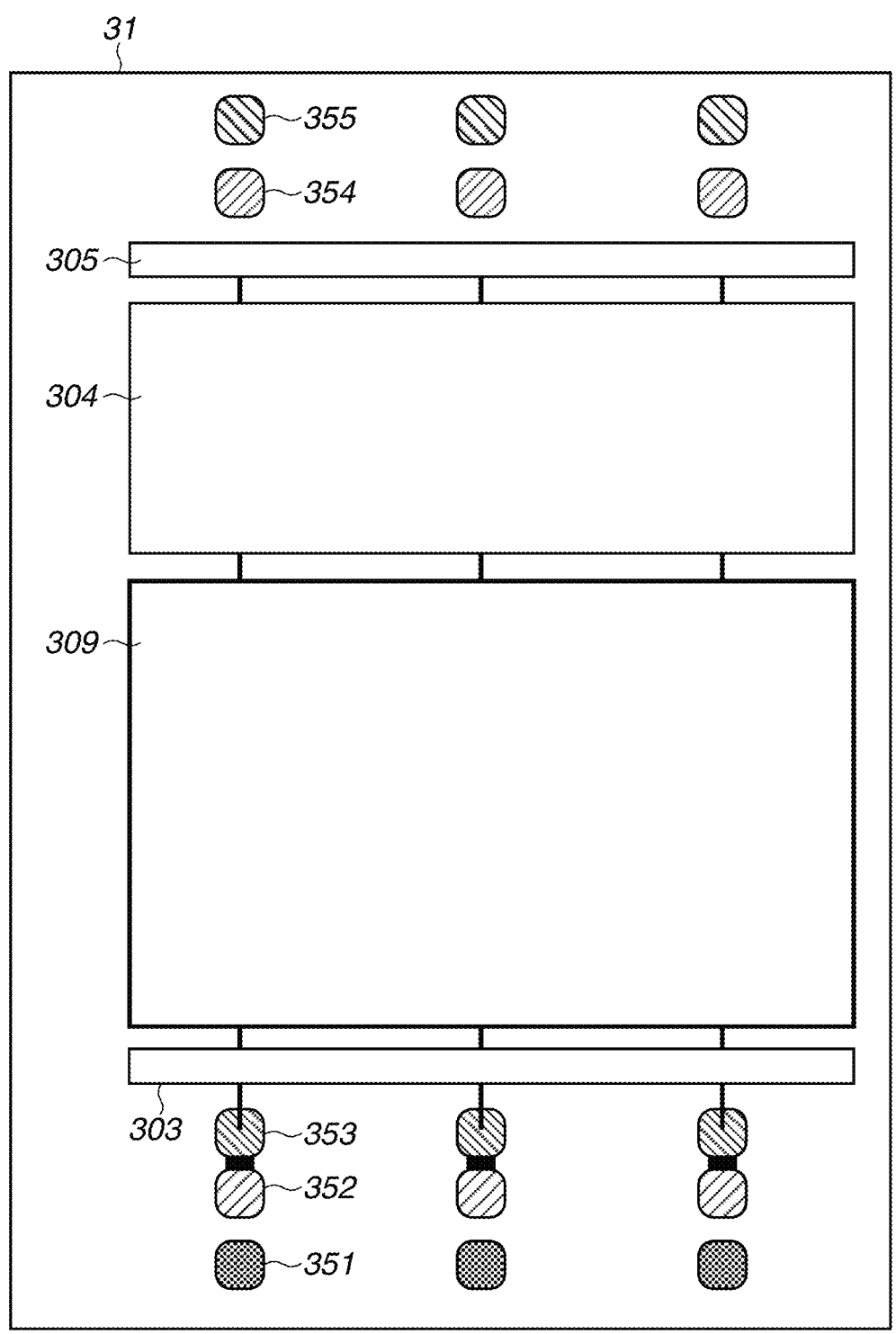
FIG. 25 is a schematic diagram illustrating an electric connection relationship between a third substrate and other components including other substrates according to the eleventh exemplary embodiment.

FIGS. 23 to 25 are diagrams illustrating a configuration of an eleventh exemplary embodiment. The configuration described in the first exemplary embodiment with reference to FIGS. 1 to 6 and 10 is applied also to the configuration of the present exemplary embodiment. The present exemplary embodiment differs from the first exemplary embodiment in which a processing circuit is disposed for each pixel block, in that a processing circuit is disposed for each pixel column.

FIG. 23 schematically illustrates an electric connection relationship between the first substrate 1100 and the second substrate 2100 in a planar view. FIG. 23 differs from FIG. 7 in that the concept of a pixel block is not illustrated.

FIG. 24 schematically illustrates an electric connection relationship between the second substrate 2100 and the third substrate 3100 in a planar view. While the circuit 241 is disposed to correspond to each block in FIG. 8, the circuit 241 is disposed to correspond to each pixel column in FIG. 21. Further, while the circuit 241 is disposed in a region overlapping a pixel region in FIG. 8, the circuit 241 is disposed in a region not overlapping a pixel region in FIG. 24. That is, in FIG. 24, the circuit 241 is disposed in a peripheral region on the outside of the pixel region. Here, the circuit 241 is a TDC circuit, for example. With this configuration, heat propagation from a plurality of photoelectric conversion units and heat propagation from the TDC circuit do not interfere with each other, and thus heat propagation between the first substrate 1100 and the second substrate 2100 can be suppressed. Consequently, the photoelectric conversion apparatus 100 is stably operated.

A pixel circuit region in which pixel circuits for processing signals from photoelectric conversion units are two-dimensionally arranged is disposed in the second substrate 2100. If the TDC circuit is disposed in the pixel region, an area occupied by the pixel circuit is limited. Achievement of the sophistication of the pixel circuit also results in an increase in an area occupied by the pixel circuit. In view of the foregoing, to achieve the sophistication of the pixel circuit, the TDC circuit is disposed in a peripheral region on the outside of the pixel region, as in the present exemplary embodiment. For example, in a case where a ToF system is an intended purpose, an external light removal circuit may be disposed for each pixel. Disposing the TDC circuit in the peripheral region allows the external light removal circuit serving as a pixel circuit to be arranged in the pixel region of the second substrate 2100. With this configuration, the sophistication of the pixel circuit can be achieved.

It is desirable that the circuit 241 (example: TDC circuit) be arranged with a distance between the circuit 241 and a pixel circuit closest to the circuit 241 being 2 μm or more in a planar view. Because a distance between the circuit 241 and the pixel region in which photoelectric conversion units are arranged is increased in a planar view, a distance between the circuit 241 of the second substrate 2100 and the pixel region of the first substrate 1100 is also increased. Consequently, even if the pixel region of the first substrate 1100 produces heat, thermal influence to be exerted on the TDC circuit can be reduced. In contrast, even if the TDC circuit of the second substrate 2100 produces heat, thermal influence to be exerted on photoelectric conversion units included in the pixel region of the first substrate 1100 can be reduced.

FIG. 25 schematically illustrates an electric connection relationship between the third substrate 3100, the outside of a semiconductor device, the second substrate 2100, and the first substrate 1100 in a planar view. FIG. 25 differs from FIG. 9 in that the memory 301 is not disposed in the third substrate 3100. In place of the memory 301, a third signal processing unit 309 is disposed in FIG. 25. That is, a signal output from the second substrate 2100 is to be processed by the third signal processing unit 309 without passing through a memory. With such a configuration, an area in which a signal processing unit is arranged can increased as compared with the first exemplary embodiment, which allows signal processing with high load to be performed. For example, a learned model that performs calculation with high load can also be mounted.

Twelfth Exemplary Embodiment

FIGS. 26 to 29 are diagrams illustrating a configuration of a twelfth exemplary embodiment. The present exemplary embodiment differs from the first exemplary embodiment in that a processing result of a signal processing unit disposed in the third substrate 3100 is fed back to a control circuit unit in the second substrate 2100, and a highly-accurate or high-function photoelectric conversion apparatus is achieved.

Figure 26:
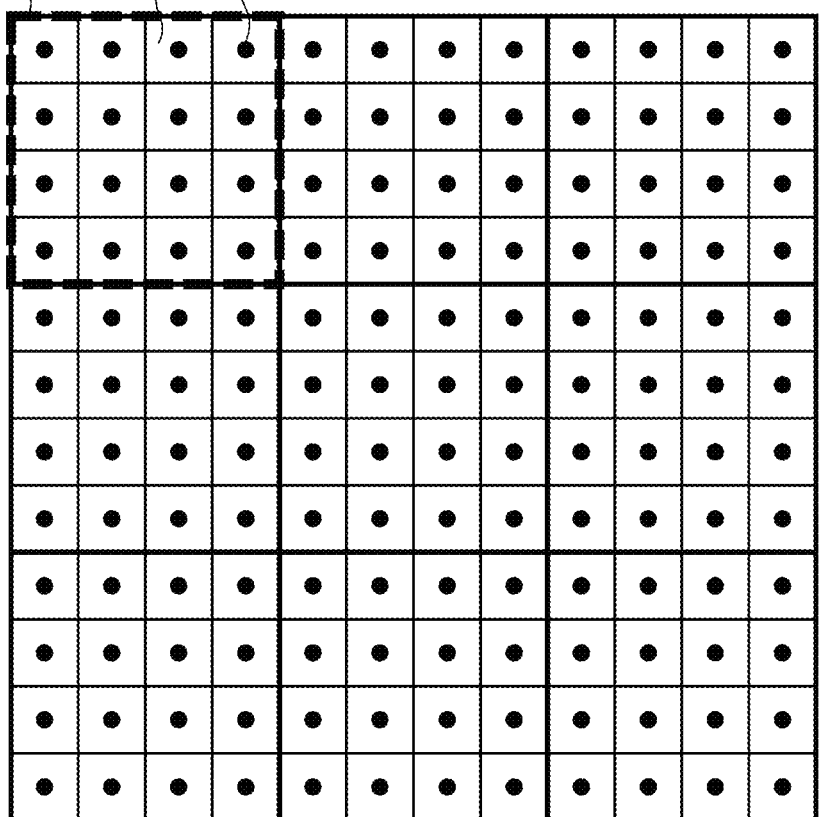
FIG. 26 is a schematic diagram illustrating an electric connection relationship between a first substrate and a second substrate according to a twelfth exemplary embodiment.

FIG. 26 schematically illustrates electric connection relationship between the first substrate 1100 and the second substrate 2100 in a planar view. Each block 231 includes a plurality of pixels 101 sharing a predetermined circuit disposed in the second substrate 2100.

Figure 27:
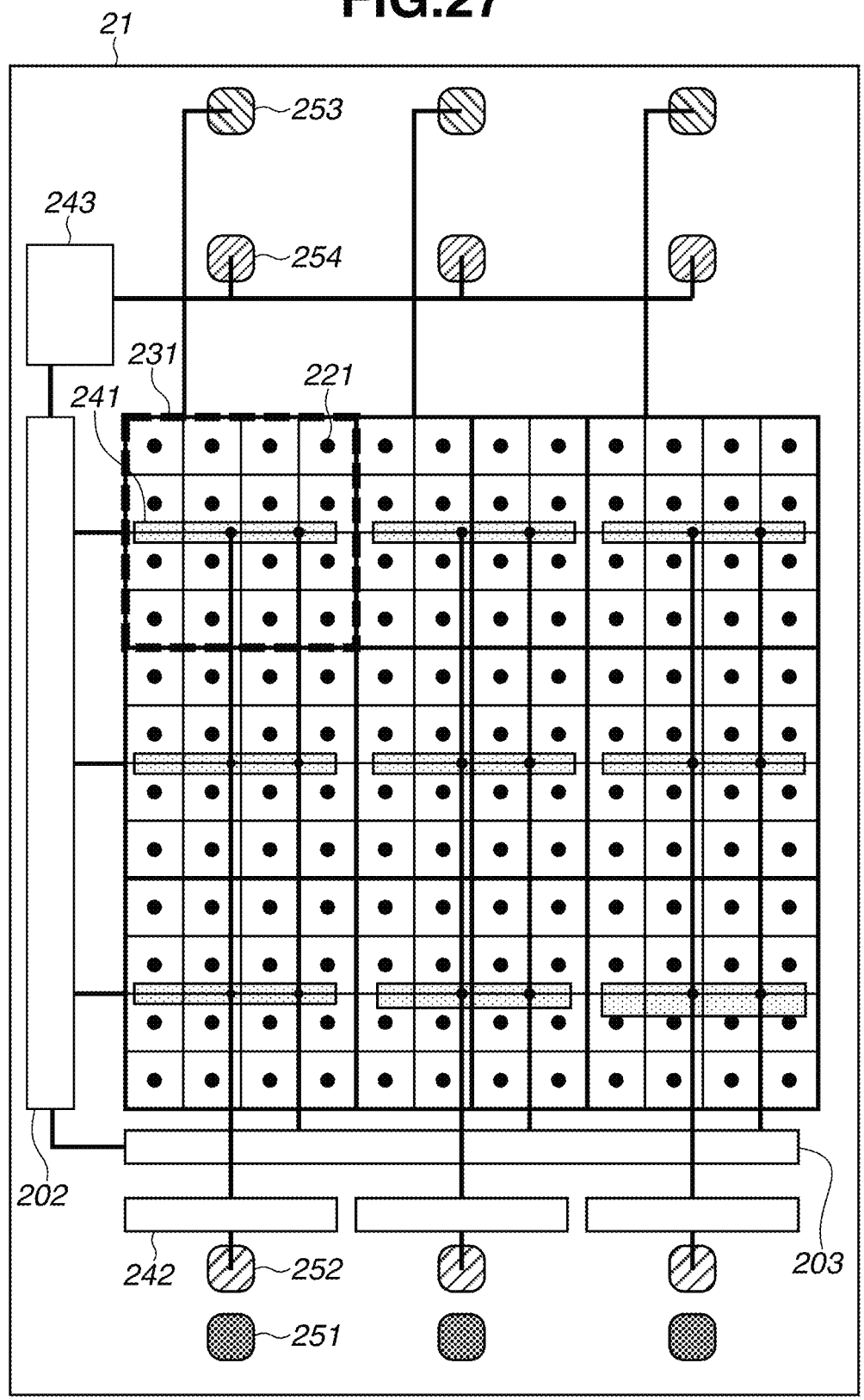
FIG. 27 is a schematic diagram illustrating an electric connection relationship between a second substrate and a third substrate according to the twelfth exemplary embodiment.

FIG. 27 schematically illustrates electric connection relationship between the second substrate 2100 and the third substrate 3100 in a planar view. FIG. 27 illustrates the vertical scanning circuit unit 202 and the horizontal scanning circuit unit 203 (these will also be collectively referred to as a "scanning circuit unit") that have been described in the first exemplary embodiment and are not illustrated in FIG. 8. In addition, a control unit 243 for controlling the scanning circuit units 202 and 203 or another circuit is disposed. FIG. 27 illustrates an example in which the control unit 243 controls the scanning circuit units 202 and 203. While FIG. 27 illustrates an example in which a control line is disposed for each block from the scanning circuit units 202 and 203 to a pixel circuit unit, a control line may be disposed for each pixel.

Figure 29:
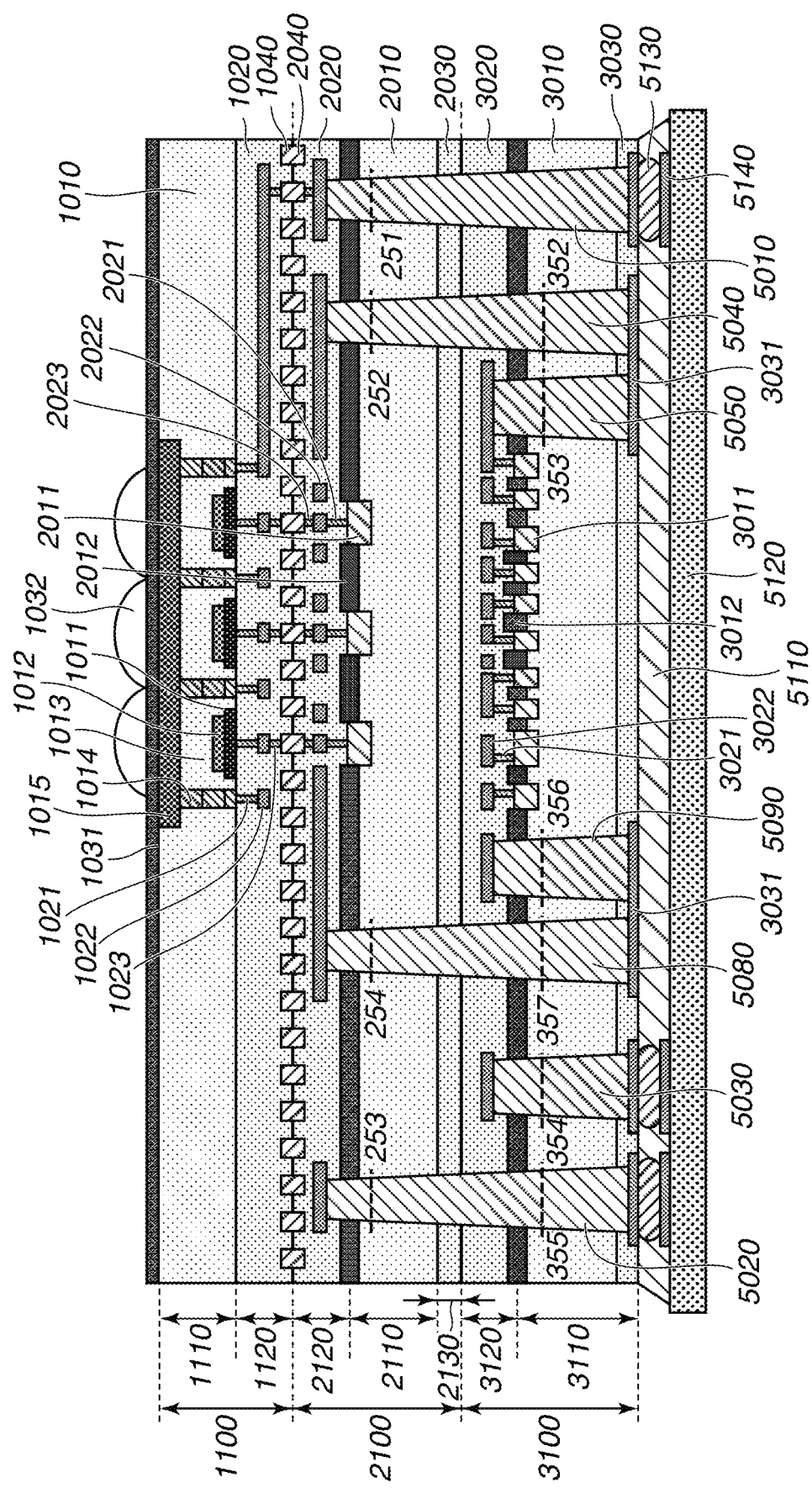
FIG. 29 is a cross-sectional view of a photoelectric conversion apparatus according to the twelfth exemplary embodiment.

A TSV wire 254 (corresponding to a TSV wire 5080 in FIG. 29) is a wire for transmitting a processing result of a signal processing unit disposed in the third substrate 3100 to the control unit 243 disposed in the second substrate 2100. Specifically, as illustrated in FIG. 29, a processing result of the signal processing unit disposed in the third substrate 3100 is input to the control unit 243 via a TSV wire 5090, the wire 3031, and the TSV wire 5080 (corresponding to the TSV wire 254 in FIG. 27).

The control unit 243 can perform various types of control.

For example, the control unit 243 can perform control to set exposure in such a manner that an exposure time varies for each pixel block. Specifically, the pixel region includes a pixel block (first pixel block) that detects a large number of photons per unit time and a pixel block (second pixel block) that detects a small number of photons per unit time. In this case, the control unit 243 can control an exposure time of the second pixel block to be longer than an exposure time of the first pixel block. This allows a dynamic range to be extended. For example, based on a count value of each pixel block that corresponds to a processing result of the signal processing unit in the third substrate 3100 and has been acquired in the previous frame, which the control unit 243 can control an exposure time of each pixel block. The exposure time may be controlled based on whether a reverse bias is to be applied to the photoelectric conversion unit to perform avalanche multiplication, or controlled based on whether a counter counts a pulse corresponding to a photon.

In a case where a photoelectric conversion apparatus according to the present disclosure is applied to a system (for example, monitoring camera) that ensures safety and security, for example, there is a demand that image capturing is performed at low resolution before the occurrence of an event and performed at high resolution after the occurrence of an event. This is because power saving can be achieved by performing image capturing at low resolution before the occurrence of an event, since an avalanche photodiode consumes large power by the application of a high voltage. In view of the foregoing, the signal processing unit in the third substrate 3100 may determine whether an event has occurred, and the control unit 243 may perform control to change a resolution mode from a low resolution mode to a high resolution mode in accordance with a result of the determination. Specifically, for example, acquisition of a photon by application of a reverse bias only to one pixel among two pixels×two pixels=four pixels in total allows to achieve the low resolution mode. In response to occurrence of an event, the control unit 243 may perform control to acquire photons by using all pixels of two pixels×two pixels. Determination of whether an event has occurred may be determined using the second signal processing unit 305 including a learned model created by machine learning. Examples of the event include detection of a suspicious individual or a suspicious substance, detection of a predetermined number or more of people or objects, collision prediction of a movable body, or the like. While, in the above description, power saving is achieved by switching a photoelectric conversion unit, power saving may be achieved by switching whether to execute counting by a counter.

For example, only information regarding a region of interest (ROI) can be acquired. For example, in a case where a detection target object of interest exists in a partial region, performing photoelectric conversion of other regions wastes power. In view of the foregoing, the control unit 243 performs control to acquire information regarding a region of interest. Specifically, the signal processing unit in the third substrate 3100 determines a region of interest in which a detection target object exists, and the control unit 243 performs control in such a manner that photoelectric conversion is performed on the region of interest and photoelectric conversion is not performed on regions other than the region of interest. This leads to achievement of power saving. Alternatively, the control unit 243 may perform control in such a manner that photons are not counted by a counter in a region other than the region of interest, and photons are counted by a counter in a region of interest. Also in this case, by stopping an unnecessary counter, power saving can be achieved.

Figure 28:
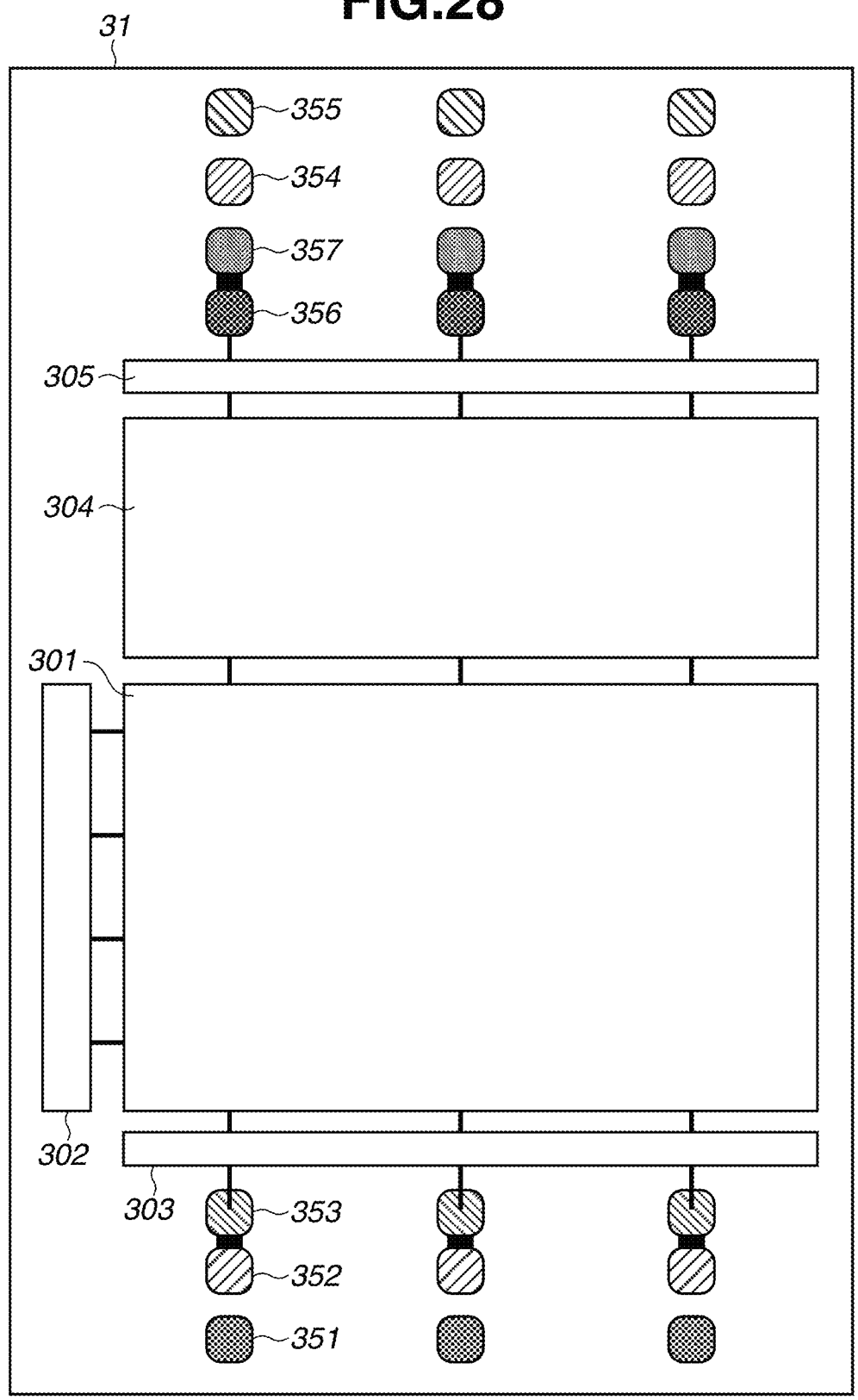
FIG. 28 is a schematic diagram illustrating an electric connection relationship between a third substrate and other components including other substrates according to the twelfth exemplary embodiment.

FIG. 28 schematically illustrates an electric connection relationship between the third substrate 3100, the outside of a semiconductor device, the second substrate 2100, and the first substrate 1100 in a planar view. FIG. 28 differs from FIG. 9 described in the first exemplary embodiment, in that a TSV wire 356 (corresponding to the TSV wire 5090 in FIG. 26) and a TSV wire 357 (corresponding to the TSV wire 5080 in FIG. 26) are illustrated. The TSV wires 356 and 357 transmit a processing result of a signal processing unit disposed in the third substrate 3100 to the control unit 243 disposed in the second substrate 2100.

Thirteenth Exemplary Embodiment

Figure 30:
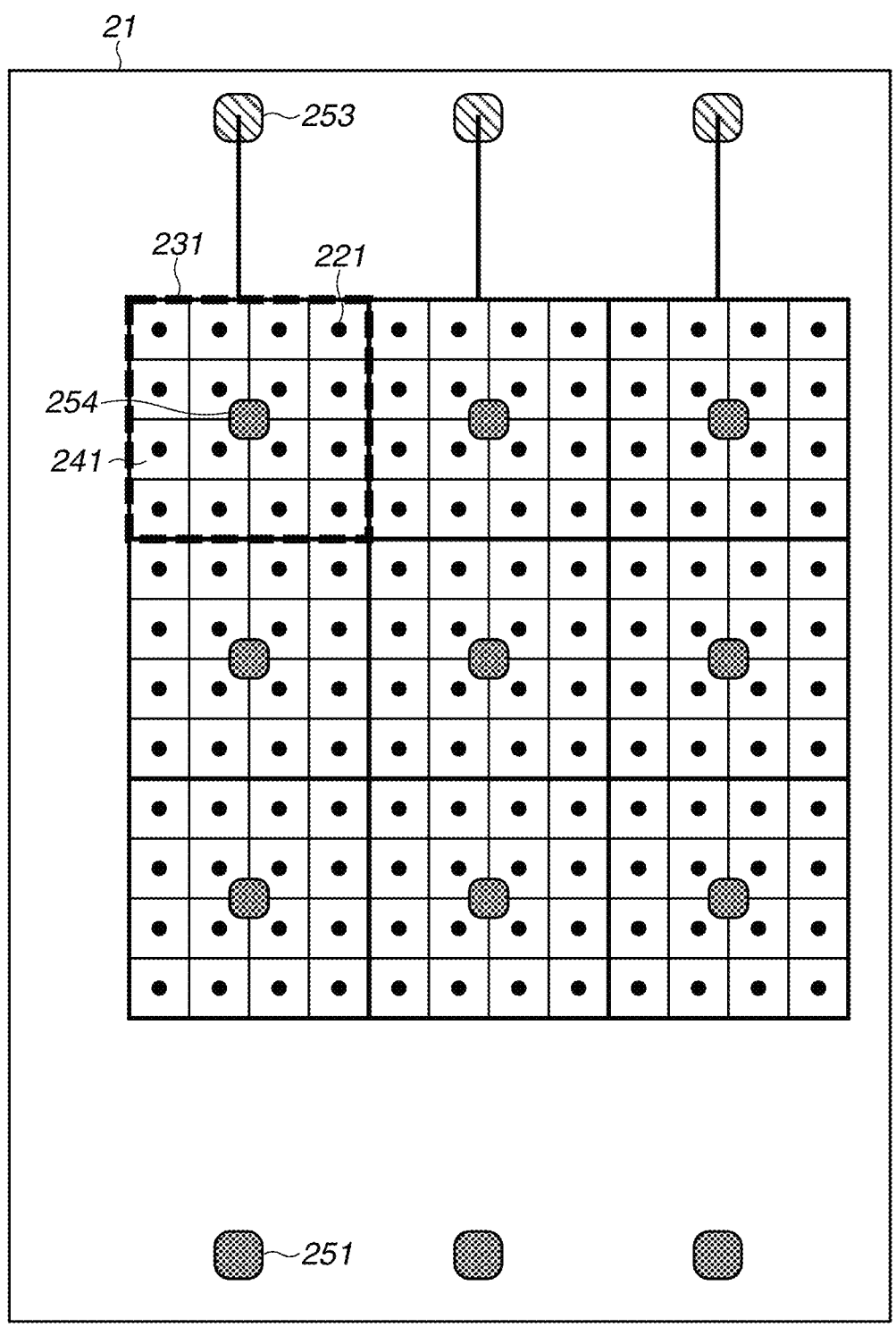
FIG. 30 is a schematic diagram illustrating an electric connection relationship between a second substrate and a third substrate according to a thirteenth exemplary embodiment.
Figure 31:
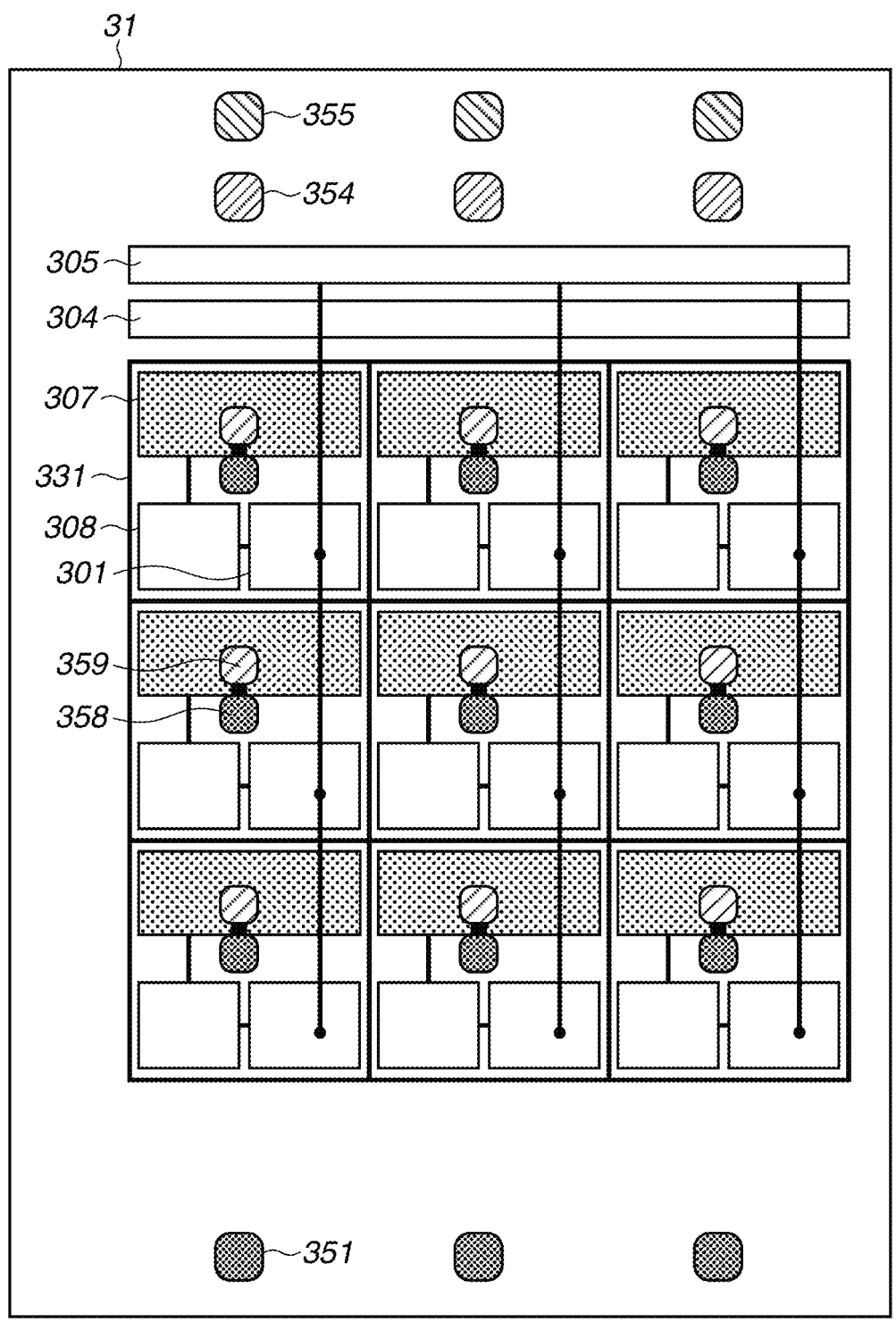
FIG. 31 is a schematic diagram illustrating an electric connection relationship between a third substrate and other substrates according to the thirteenth exemplary embodiment.
Figure 32:
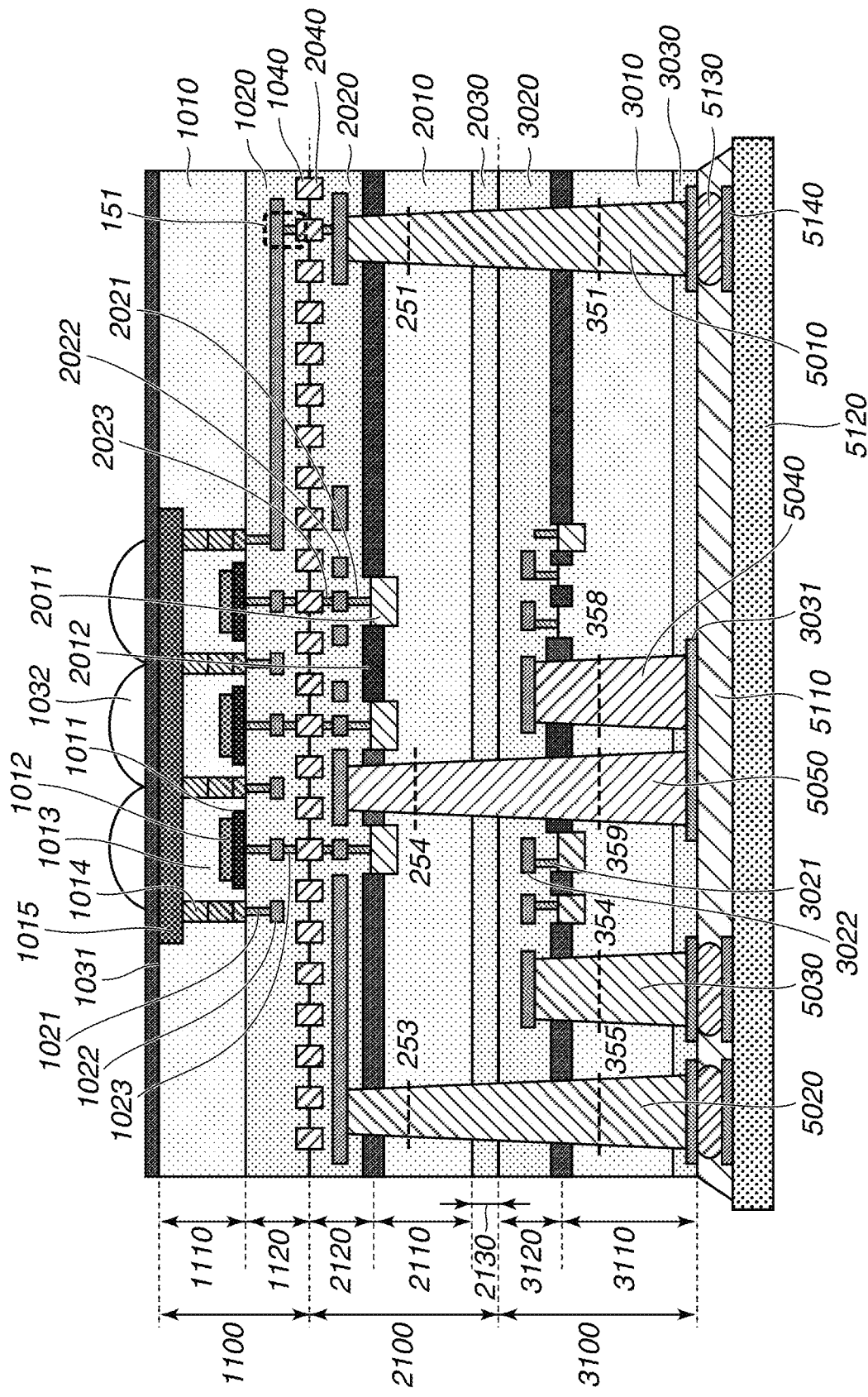
FIG. 32 is a cross-sectional view of a photoelectric conversion apparatus according to the thirteenth exemplary embodiment.

FIGS. 30 to 32 are diagrams illustrating a configuration of a thirteenth exemplary embodiment. The present exemplary embodiment differs from the first exemplary embodiment in that a circuit (for example, TDC circuit) is disposed in the third substrate 3100. The electric connection relationship of the first substrate 1100 in the present exemplary embodiment is the same as the electric connection relationship illustrated in FIG. 26, the description will be given based on it.

FIG. 30 schematically illustrates electric connection relationship between the second substrate 2100 and the third substrate 3100 in a planar view. The illustration of the control circuit units 302 and 303 is omitted. The TSV wire 254 is disposed at the center part of each block 231. The TSV wire 254 (corresponding to the TSV wire 5040 in FIG. 32) is a wire for inputting output of the second substrate 2100 to the third substrate 3100.

FIG. 31 schematically illustrates electric connection relationship between the second substrate 2100 and the third substrate 3100 in a planar view. A plurality of signal processing blocks 331 are disposed in the third substrate 3100 to respectively correspond to a plurality of pixels block 231 in the first substrate 1100 and the second substrate 2100.

Specifically, in the present exemplary embodiment, a circuit 307 corresponding to the circuit 241 of the first exemplary embodiment is disposed for each signal processing block. The circuit 307 is a TDC circuit, for example. For example, in a case where there is a difficulty in arranging the TDC circuit 307 in the second substrate 2100 due to an increased circuit scale of another circuit, the TDC circuit 307 can be disposed in the third substrate 3100 as in the present exemplary embodiment.

In a case where the photoelectric conversion apparatus 100 is used as a photoelectric conversion apparatus for image capturing, the counter circuit 213 can be disposed in both the second substrate 2100 and the third substrate 3100. This is because, since an APD includes a counter for each pixel, a circuit scale of counters increases and an occupied area in the second substrate 2100 also increases. In the present exemplary embodiment, a DFE 308 corresponding to the DFE 242 of the first exemplary embodiment is disposed in each signal processing block 331.

Furthermore, in the present exemplary embodiment, the memory 301 is disposed in each signal processing block.

In FIG. 31, an output from the memory 301 disposed in each signal processing block is input to the first signal processing unit 304, and an output from the first signal processing unit 304 is input to the second signal processing unit 305.

As described above, in the present exemplary embodiment, because signal processing blocks are disposed to respectively correspond to pixel blocks, and signal processing can be concurrently performed by the circuit 307 (for example, TDC circuit), high-speed signal processing can be performed.

Alternatively, the first signal processing unit 304 and the second signal processing unit 305 may be disposed in each signal processing block. Alternatively, the first signal processing unit 304 may be disposed in each signal processing block, and the second signal processing unit 305 may be disposed outside a region in which signal processing blocks are arranged, as illustrated in FIG. 31.

Fourteenth Exemplary Embodiment

FIGS. 33 to 39 are diagrams illustrating a configuration of a fourteenth exemplary embodiment. The components similar to those in the first exemplary embodiment are assigned the same reference numerals, and the redundant description will be omitted. The present exemplary embodiment differs from the first exemplary embodiment in that a fourth substrate 4100 is stacked in addition to the first substrate 1100, the second substrate 2100, and the third substrate 3100.

Figure 33:
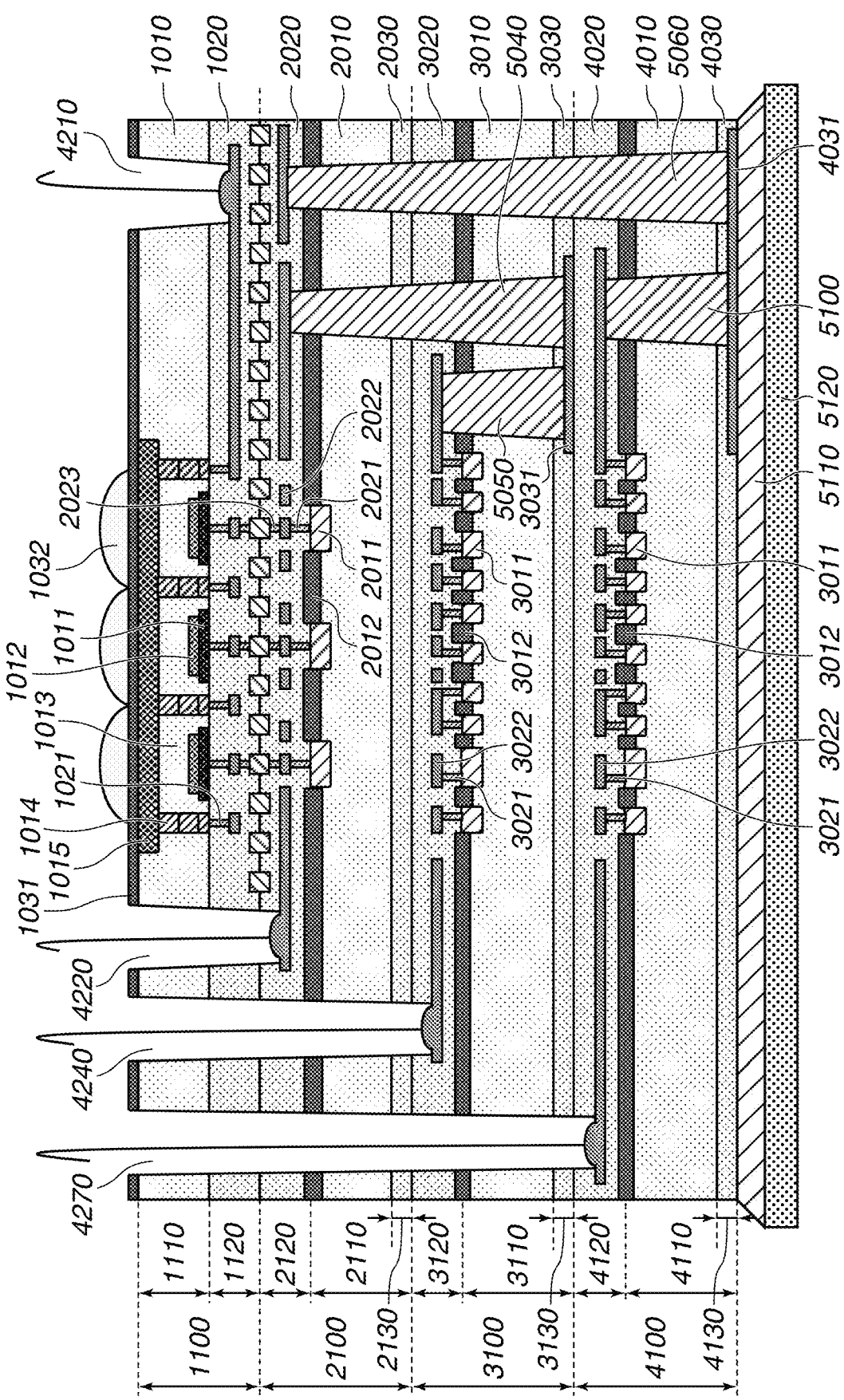
FIG. 33 is a cross-sectional view of a photoelectric conversion apparatus according to a fourteenth exemplary embodiment.

In the configuration illustrated in FIG. 33, an electrode that is electrically connected with the outside and supplies a drive voltage to a circuit in the fourth substrate 4100 is disposed in a wiring structure 4120 of the fourth substrate 4100. Electrodes that supply drive voltages to circuits in the first to third substrates are respectively disposed in the wiring structures of the first to third substrates. Specifically, the electrode 4210 of the first substrate 1100 is disposed in the wiring structure 1120 of the first substrate 1100, the electrode 4220 of the second substrate 2100 is disposed in the wiring structure 2120 of the second substrate 2100, the electrode 4240 of the third substrate 3100 is disposed in the wiring structure 3120 of the third substrate 3100, and an electrode 4270 of the fourth substrate 4100 is disposed in the wiring structure 4120 of the fourth substrate 4100.

The second substrate 2100 and the third substrate 3100, and the third substrate 3100 and the fourth substrate 4100 are electrically connected by TSV wires. Specifically, the second substrate 2100 is connected to the wire 3031 of the wiring structure 3120 in the third substrate 3100 via the TSV wire 5040, and the wire 3031 is connected to the third substrate 3100 via the TSV wire 5050. The first substrate 1100 is connected to a wire 4031 in the wiring structure 4120 of the fourth substrate 4100 via a TSV wire 5060, and the wire 4031 is connected to the fourth substrate 4100 via the TSV wire 5100.

With this configuration, a wire length from the electrode that supplies a drive voltage from the outside to a circuit disposed in each substrate is shortened, which reduces possibility of decrease in a circuit operation speed due to signal propagation delay. It is also possible to supply a drive voltage suitable for an element disposed in each substrate, from each electrode.

Figure 34:
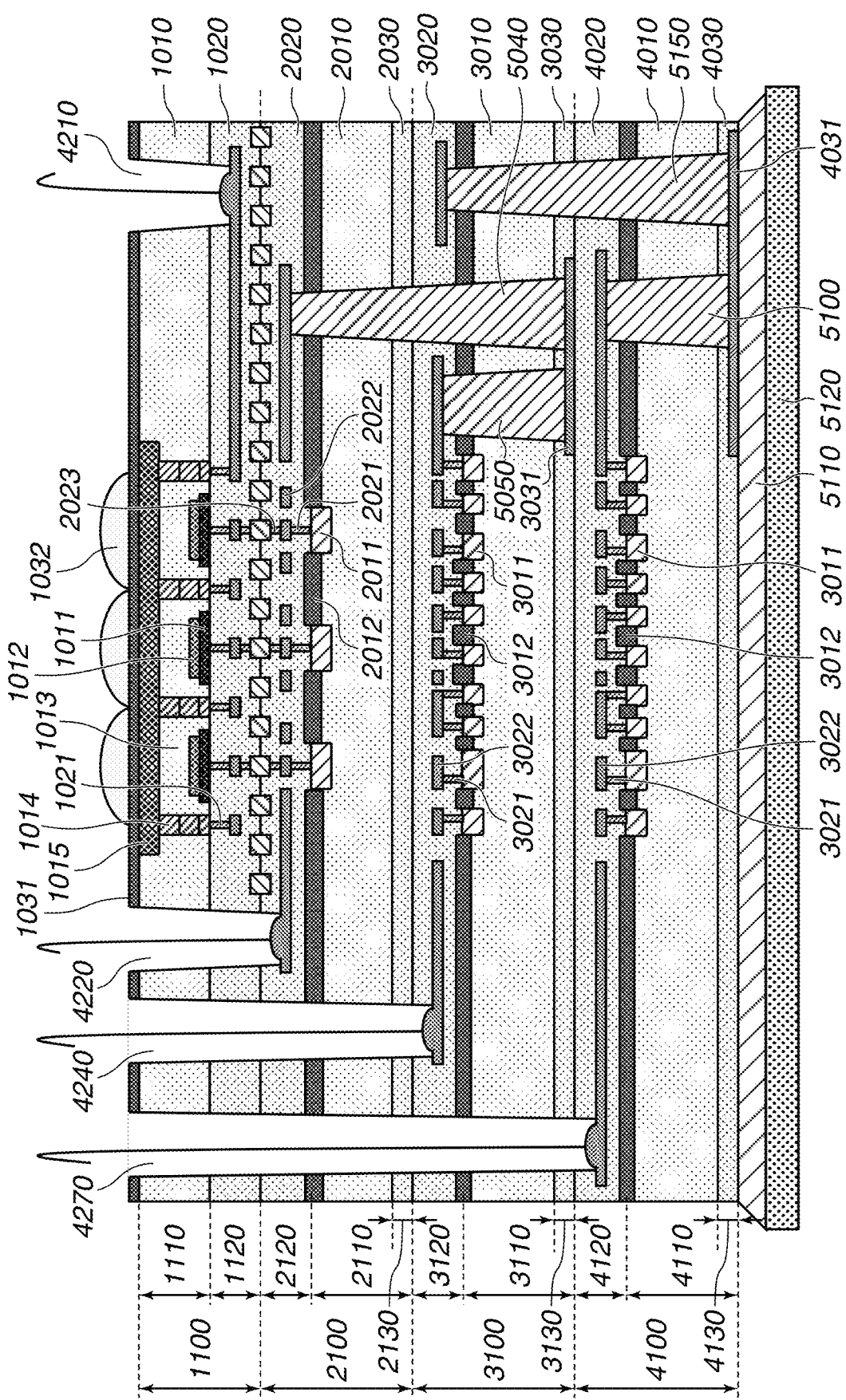
FIG. 34 is a cross-sectional view of a photoelectric conversion apparatus according to the fourteenth exemplary embodiment.

In the configuration illustrated in FIG. 34, similarly to FIG. 33, an electrode that supplies a drive voltage to a circuit in each substrate is disposed in a wiring structure of a corresponding substrate, but FIG. 34 differs from FIG. 33 in that the second substrate 2100 and the third substrate 3100, and the second substrate 2100 and the fourth substrate 4100 are connected by TSV wires. Specifically, the third substrate 3100 is connected to the wire 4031 of the wiring structure 4120 of the fourth substrate 4100 via a bump 5150, and the wire 4031 is connected to the fourth substrate 4100 via the bump 5100.

Figure 35:
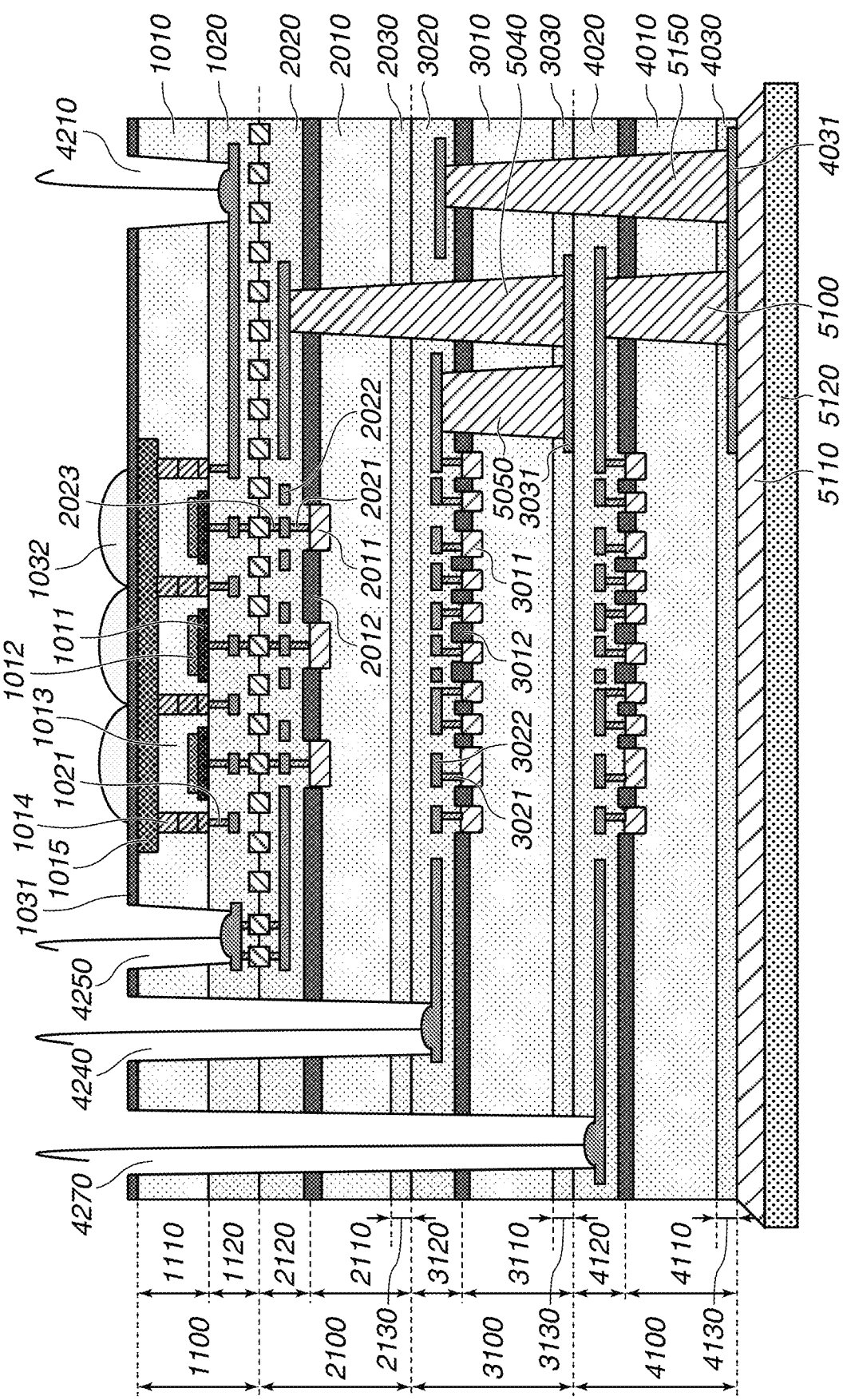
FIG. 35 is a cross-sectional view of a photoelectric conversion apparatus according to the fourteenth exemplary embodiment.

In the configuration illustrated in FIG. 35, an electrode that supplies a drive voltage to a circuit in each substrate is disposed in a corresponding one of the first substrate 1100, the third substrate 3100, and the fourth substrate 4100. The configuration illustrated in FIG. 35 is similar to the configuration illustrated in FIG. 34 in that the second substrate 2100 and the third substrate 3100, and the third substrate 3100 and the fourth substrate 4100 are connected by TSV wires. The electrode 4250 is disposed in the first substrate 1100, and the first substrate 1100 and the second substrate 2100 are electrically connected by bonding between the bonding portion 1040 of the first substrate 1100 and the bonding portion 2040 of the second substrate 2100.

Figure 36:
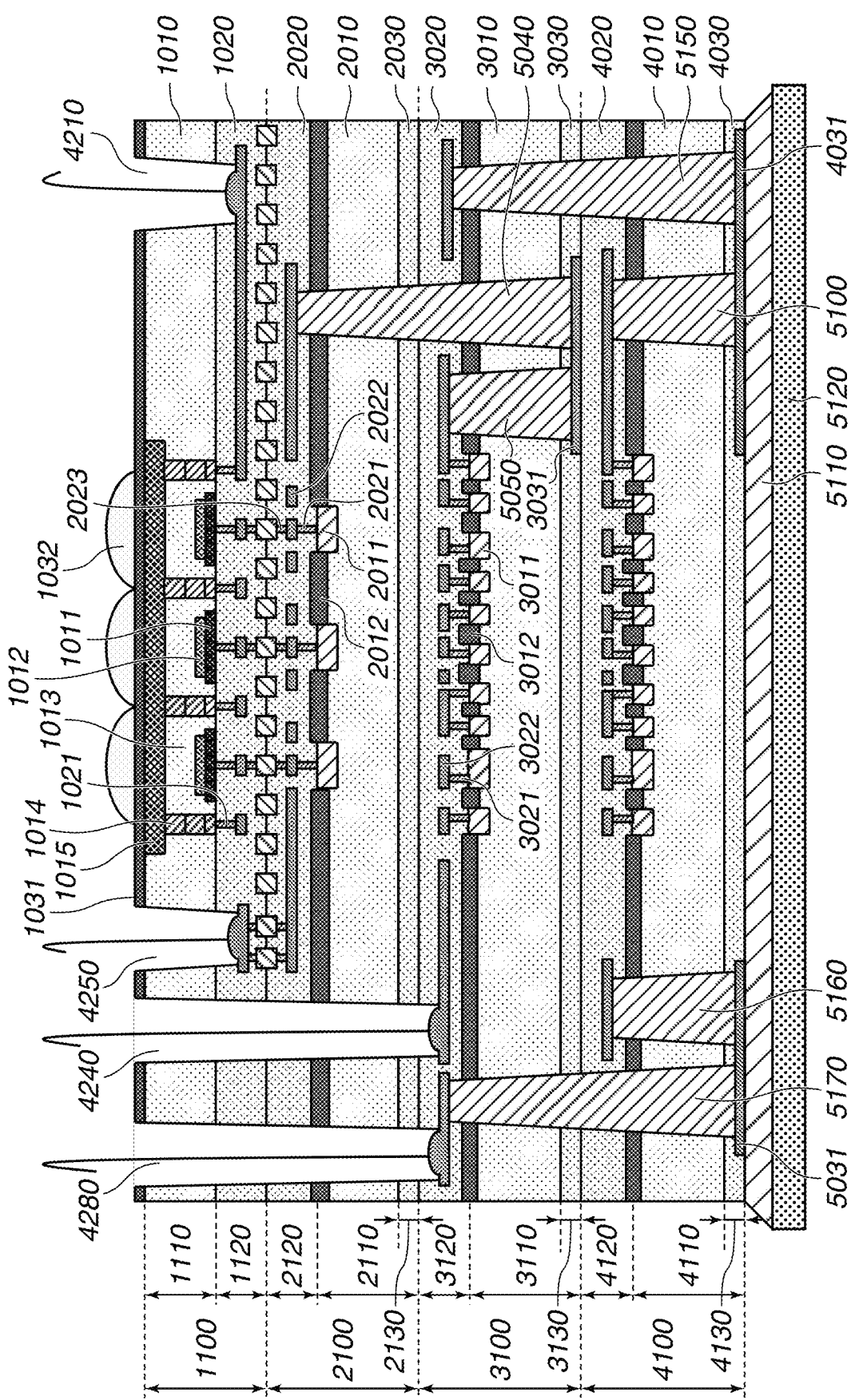
FIG. 36 is a cross-sectional view of a photoelectric conversion apparatus according to the fourteenth exemplary embodiment.

In the configuration illustrated in FIG. 36, electrodes that supply a drive voltage to a circuit in each substrate are disposed in a corresponding one of the first substrate 1100 and the third substrate 3100. The first substrate 1100 and the second substrate 2100 are electrically connected by bonding between the bonding portion 1040 of the first substrate 1100 and the bonding portion 2040 of the second substrate 2100, and the third substrate 3100 and the fourth substrate 4100 are electrically connected by a TSV wire. The electrodes 4210 and 4250 are disposed to be in contact with the same wiring layer in the wiring structure 1120 of the first substrate 1100. The electrodes 4240 and 4280 are disposed to be in contact with the same wiring layer in the wiring structure 3120 of the third substrate 3100. For this reason, the depths of pad openings formed in formation of the electrodes 4210 and 4250 or the electrodes 4240 and 4280 are substantially the same. With this configuration, a process of the wiring becomes easier.

Figure 37:
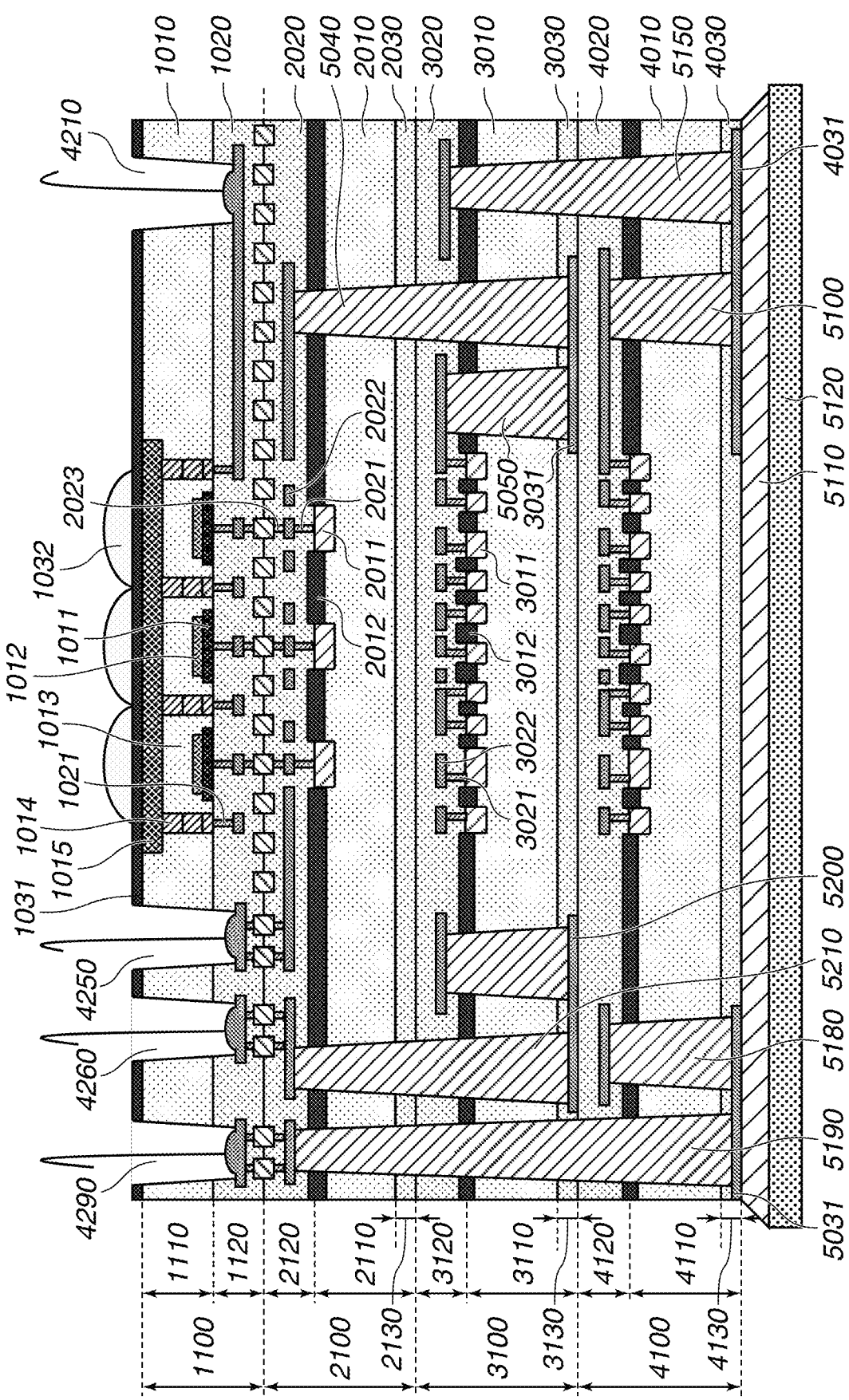
FIG. 37 is a cross-sectional view of a photoelectric conversion apparatus according to the fourteenth exemplary embodiment.

In the configuration illustrated in FIG. 37, electrodes that supply a drive voltage to a circuit in the first substrate 1100 are disposed in the first substrate 1100. The first substrate 1100 and the second substrate 2100 are electrically connected by bonding between the bonding portion 1040 of the first substrate 1100 and the bonding portion 2040 of the second substrate 2100. The second substrate 2100 and the third substrate 3100, and the second substrate 2100 and the fourth substrate 4100 are electrically connected by TSV wires.

More specifically, the electrodes 4210, 4250, 4260, and 4290 are disposed to be in contact with the same wiring layer in the wiring structure 1120 of the first substrate 1100. Accordingly, the depths of pad openings formed in formation of these electrodes are substantially the same. Because formation of a deep pad opening penetrating through wires in substrates from the first substrate 1100 to the fourth substrate 4100 can be eliminated, a process of the wiring becomes easier.

Figure 38:
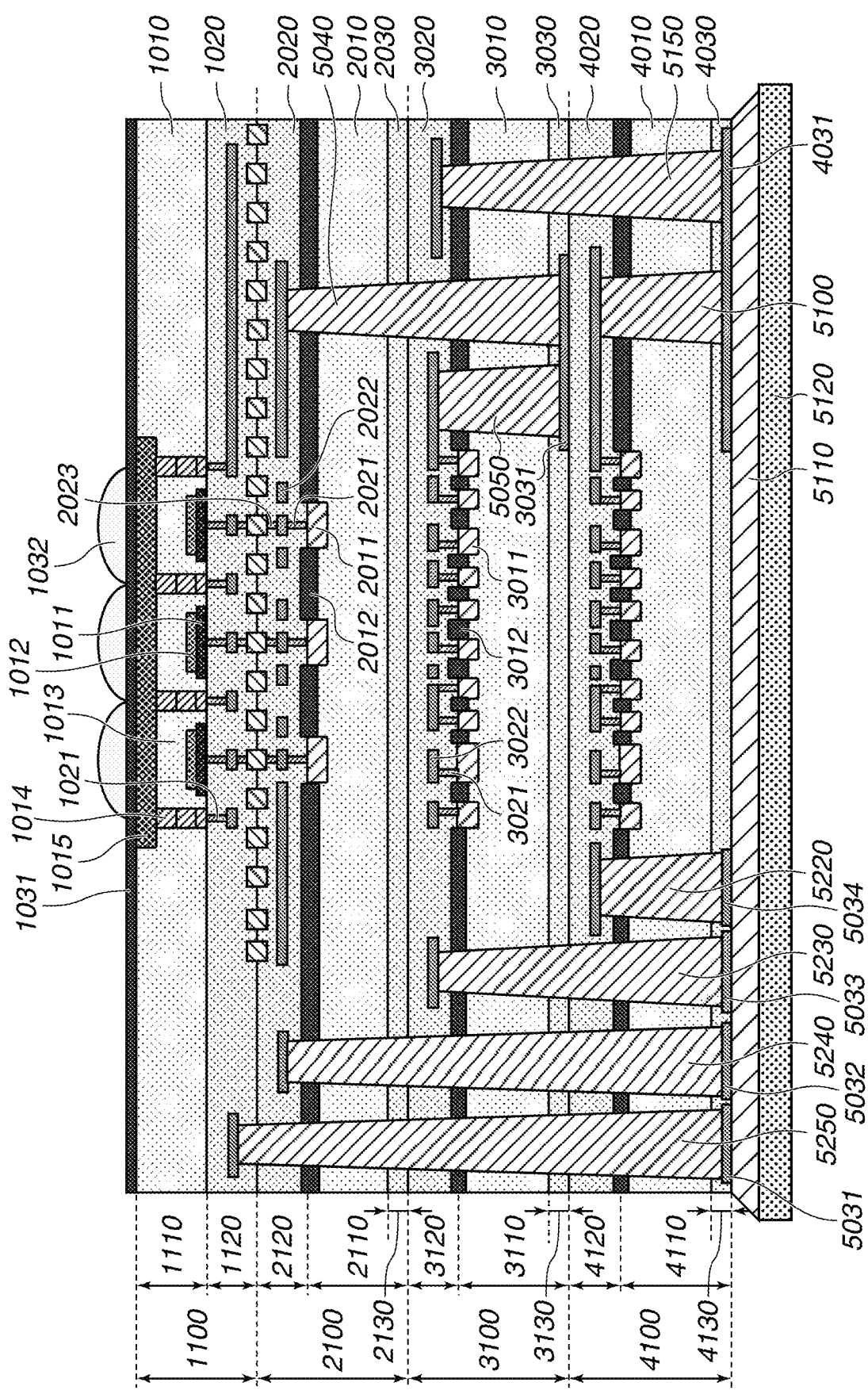
FIG. 38 is a cross-sectional view of a photoelectric conversion apparatus according to the fourteenth exemplary embodiment.

In the configuration illustrated in FIG. 38, TSV wires are connected to the substrates from the first substrate 1100 to the fourth substrate 4100. A wire of the first substrate 1100 and a wire 5031 of a wiring layer of the fourth substrate 4100 are connected via a bump 5250, and a wire of the second substrate 2100 and a wire 5032 are connected via a bump 5240. A wire of the third substrate 3100 and a wire 5033 are connected via a bump 5230, and the fourth substrate 4100 and a wire 5034 are connected via a bump 5220. Because all connection terminals for connection with the outside can be disposed on the front surface side of the photoelectric conversion apparatus, a region that is used for terminals disposed around the pixel region decreases, and an area of the photoelectric conversion apparatus is expected to be saved.

Fifteenth Exemplary Embodiment

Figure 39:
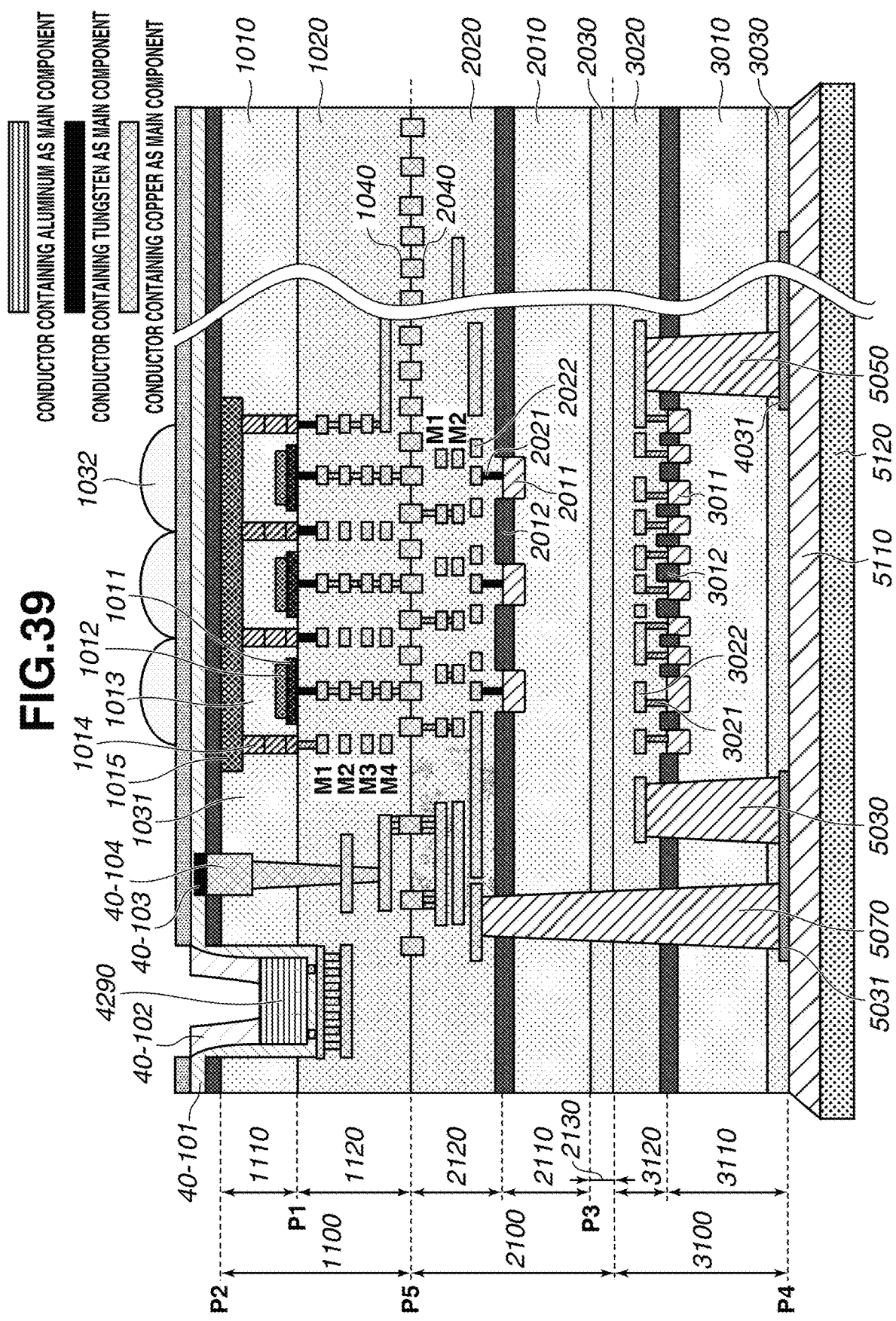
FIG. 39 is a cross-sectional view of a photoelectric conversion apparatus according to a fifteenth exemplary embodiment.

FIG. 39 is a cross-sectional view of a photoelectric conversion apparatus according to a fifteenth exemplary embodiment. The components similar to those in the first exemplary embodiment are assigned the same reference numerals, and the redundant description will be omitted. In the present exemplary embodiment, a structure of a pad electrode 4290 is mainly changed from the configuration of the first exemplary embodiment.

The wiring structure 1120 includes a first wiring layer M1, a second wiring layer M2, a third wiring layer M3, a fourth wiring layer M4, and the bonding portion 1040 of the first substrate 1100. The wiring structure 2120 includes the first wiring layer M1, the second wiring layer M2, and the bonding portion 2040 of the second substrate 2100. Each wiring layer is a copper wire. Each wiring layer may be a mesh structure, for example, in a planar view. That is, wires arranged in the direction in a planar view and wires intersecting with the wires form a netlike wiring layer.

In the wiring structure 1120 and the wiring structure 2120, the first wiring layers M1 include a conductor pattern containing copper as a main component. The conductor pattern of the first wiring layers M1 is a single damascene structure. A contact is arranged for electric connection between the first wiring layers M1 and the semiconductor layer 1110. The contact is a conductor pattern containing tungsten as a main component. The second wiring layers M2 and the third wiring layer M3 include a conductor pattern containing copper as a main component. The conductor pattern of the second wiring layers M2 and the third wiring layer M3 is a dual damascene structure, and includes a portion functioning as a wire and a portion functioning as a via. The fourth wiring layer M4 is similar to the second wiring layers M2 and the third wiring layer M3.

The pad electrode 4290 is a conductor pattern containing aluminum as a main component. The pad electrode 4290 is disposed not in a wiring structure but in an opening of the semiconductor layer 1110. While a configuration in which the pad electrode 4290 has an exposed surface between a second surface P2 and a first surface P1 has been described, the level of an exposed surface of the pad electrode 4290 may be above the second surface P2.

A formation method of this structure will be briefly described. A pad opening is formed in the semiconductor layer 1110 in such a manner that a part of the first wiring layer M1 of the wiring structure 1120 is exposed. Then, an insulator 40-101 is formed to cover the second surface P2 of the semiconductor layer 1110 and the pad opening. An opening functioning as a via of the pad electrode 4290 is formed in the insulator 40-101. After formation of a conductive film functioning as the pad electrode 4290 is formed, an unnecessary portion of the conductive film is removed to obtain a desired pattern. After formation of an insulator 40-102, an opening for exposing the pad electrode 4290 is formed. The above-described configuration can be formed by such a method.

A through electrode 40-104 may be disposed from the second surface P2. The through electrode 40-104 is made of a conductor containing copper as a main component, and barrier metal may be included between the semiconductor layer 1110 and the conductor.

A conductor 40-103 is disposed in the through electrode 40-104. The conductor 40-103 may be disposed in common to other through electrodes, and may have a function of reducing diffusion of the conductor of the through electrode 40-104.

The materials and the structures of the wiring layers of the wiring structures 1120 and 2120 are not limited to the exemplified materials and structures. For example, a conductor layer may be further disposed between a wiring layer and a semiconductor layer. The structures may be a stack contact structure in which two or more contacts are stacked.

Sixteenth Exemplary Embodiment

Figure 40:
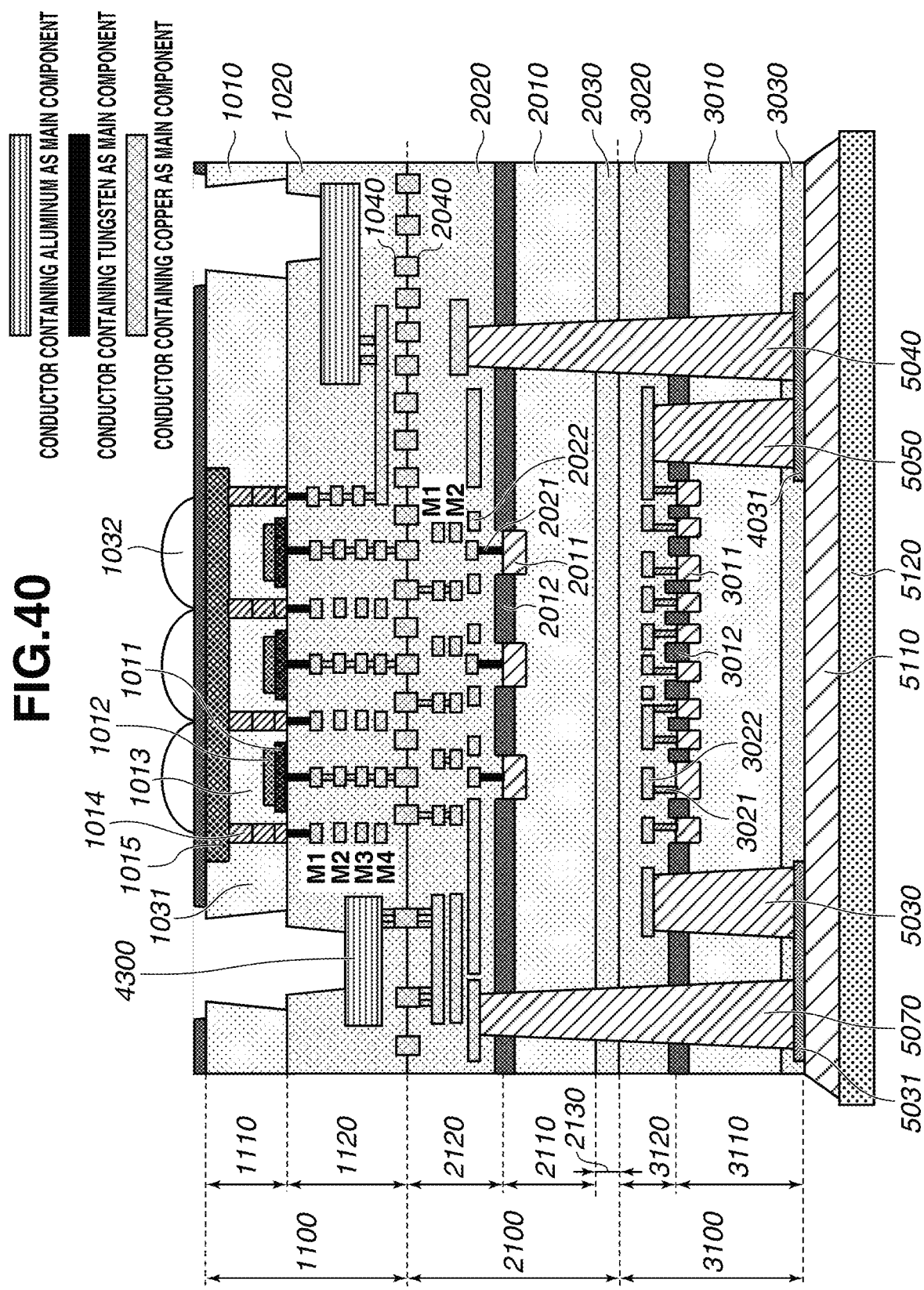
FIG. 40 is a cross-sectional view of a photoelectric conversion apparatus according to a sixteenth exemplary embodiment.

FIG. 40 is a cross-sectional view of a photoelectric conversion apparatus according to a sixteenth exemplary embodiment. The components similar to those in the first exemplary embodiment are assigned the same reference numerals, and the redundant description will be omitted. In the present exemplary embodiment, a structure of the pad electrode 4290 is mainly changed from the configuration of the first exemplary embodiment.

The wiring structure 1120 includes a first wiring layer M1, a second wiring layer M2, a third wiring layer M3, a fourth wiring layer M4, and the bonding portion 1040 of the first substrate 1100. The wiring structure 2120 includes the first wiring layer M1, the second wiring layer M2, and the bonding portion 2040 of the second substrate 2100. Each wiring layer is a copper wire.

In the wiring structure 1120 and the wiring structure 2120, the first wiring layers M1 include a conductor pattern containing copper as a main component. The conductor pattern of the first wiring layers M1 is a single damascene structure. A contact is disposed for electric connection between the first wiring layers M1 and the semiconductor layer 1110. The contact is a conductor pattern containing tungsten as a main component. The second wiring layers M2 and the third wiring layer M3 include a conductor pattern containing copper as a main component. The conductor pattern of the second wiring layers M2 and the third wiring layer M3 is a dual damascene structure and includes a portion functioning as a wire and a portion functioning as a via. The fourth wiring layer M4 is similar to the second wiring layers M2 and the third wiring layer M3.

A pad electrode 4300 is a conductor pattern containing aluminum as a main component. The pad electrode 4300 is disposed in the second and third wiring layers of the wiring structure 1120. For example, a portion functioning as a via connecting the first wiring layer M1 and the second wiring layer M2, and a portion functioning as a wire of the third wiring layer M3 are included. The pad electrode 4300 is positioned between a second surface P1 and a fifth surface P5, for example. The pad electrode 4300 can be disposed between the second surface P2 and a fourth surface P4, and can also be disposed between the second surface P2 and the fifth surface P5.

The pad electrode 4300 has a first surface and a second surface being a surface opposite to the first surface. A part of the first surface is exposed by an opening in the semiconductor layer. An exposed portion of the pad electrode 4300 can function as a connection portion with an external terminal, or a pad portion. On the second surface, the pad electrode 4300 connects with a plurality of conductors containing copper as a main component.

As another configuration of the present exemplary embodiment, an electric connection portion can also be included in an unexposed portion in the first surface side of the pad electrode 4300. For example, the pad electrode 4300 may include a via made of a conductor containing aluminum as a main component, and may electrically connect through the via with a conductor containing copper as a main component and being positioned in the first surface side. The pad electrode 4300 may connect with the first wiring layer M1 of the wiring structure 1120 in the first surface by a conductor containing tungsten as a main component.

The pad electrode 4300 is formed by, for example, forming components up to an insulator covering the third wiring layer M3, and then removing a part of the insulator, forming a film that contains aluminum as a main component and serves as the pad electrode 4300, and performing patterning. The pad electrode 4300 is formed after formation of a copper wire, whereby the pad electrode 4300 with a thick film thickness is formed with a fine copper wire having planarity.

While, the pad electrode 4300 of the present exemplary embodiment is included in the wiring structure 1120, the pad electrode 4300 may be included in the wiring structure 2120. The position at which the pad electrode 4300 is disposed may be in either of the wiring structure 1120 and 2120, and the position is not limited. The materials and the structures of the wiring layers of the wiring structures 1120 and 2120 are not limited to the exemplified materials and structures. For example, a conductor layer may be further included between a first wiring layer and a semiconductor layer. The structures may be a stack contact structure in which two or more contacts are stacked.

The pad electrode as described so far in the above-described exemplary embodiments is connected to the outside of a semiconductor device, and used to output a signal generated in the semiconductor device to the outside and to input a voltage supplied from the outside to drive a circuit of the semiconductor device. Because external noise, such as static electricity and surge voltage, is also input from the pad electrode, a protection circuit for protecting an internal circuit may be arranged near the pad electrode. The protection circuit includes, for example, a diode, a gate grounded MOS, an RC trigger MOS, or a combination of these. The protection circuit may be disposed in a portion overlapping the pad electrode in a planar view, or may be disposed in each substrate in accordance with a voltage for driving an element disposed in each of the stacked substrates, and the arrangement of the pad.

Seventeenth Exemplary Embodiment

Figure 41:
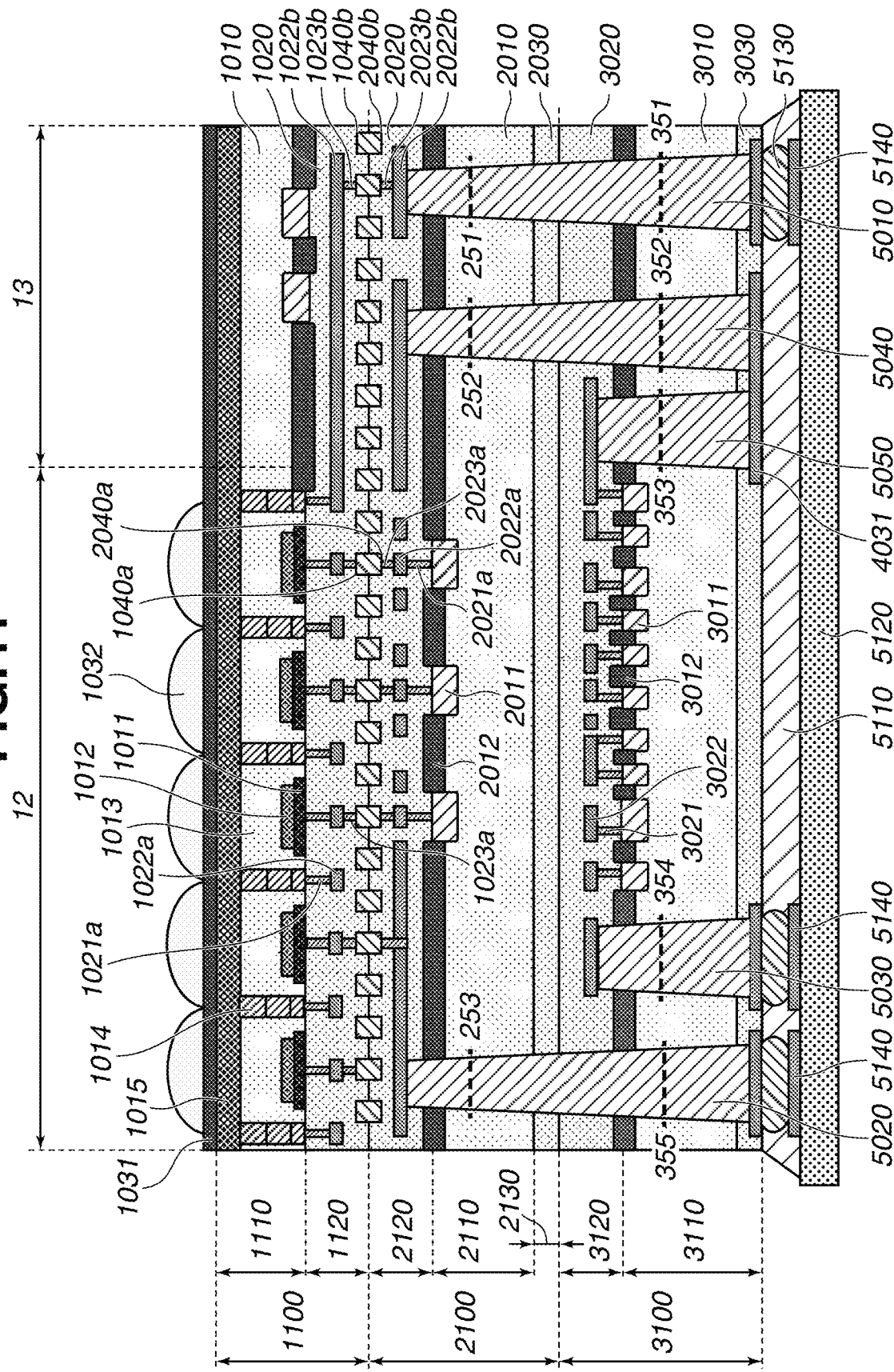
FIG. 41 is a cross-sectional view of a photoelectric conversion apparatus according to a seventeenth exemplary embodiment.

FIG. 41 is a cross-sectional view of a photoelectric conversion apparatus according to a seventeenth exemplary embodiment. The components similar to those in the first exemplary embodiment are assigned the same reference numerals, and the redundant description will be omitted. In the present exemplary embodiment, a pixel arrangement position is mainly changed from the configuration of the first exemplary embodiment.

In the exemplary embodiments described so far, TSV wires are disposed in a range overlapping the peripheral region 13 on the outside of the pixel region 12, in a planar view. Nevertheless, the TSV wires may be disposed in a range overlapping the pixel region 12 in a planar view, for example. Since at least three semiconductor substrates are stacked in the photoelectric conversion apparatus according to the present exemplary embodiment, even in a region overlapping the TSV wires in a planar view, the influence on pixels that is exerted by a voltage input or output via the TSV wires is reduced, and the area can be efficiently utilized.

Pixels disposed in the region overlapping the TSV wires in a planar view are not limited to effective pixels that output signals based on photoelectric conversion. For example, the pixel may be an optical black pixel (OB pixel) with its light incidence surface side covered by a light shielding film in such a manner that light does not enter, and a dummy pixel not being connected with an output line and not outputting signals. The dummy pixel is a pixel disposed between the effective pixel and the dummy pixel to prevent oblique light incidence to the OB pixel, for example. Because small influence is exerted on image quality even if such a pixel is influenced by a voltage input or output via the TSV wires, arranging dummy pixels in a region overlapping the TSV wires in a planar view results in efficient utilization of the area.

Elements disposed in a region overlapping the TSV wires in a planar view are not limited to photoelectric conversion elements, such as the above-described pixels, and may be semiconductor elements, such as transistors, for example. Elements, such as transistors, formed in the semiconductor layer 1110 enhances planarity of the substrate. An element disposed in a region overlapping the TSV wires in a planar view may be a protection element having a function as the above-described protection circuit, for example.

Eighteenth Exemplary Embodiment

Figure 42:
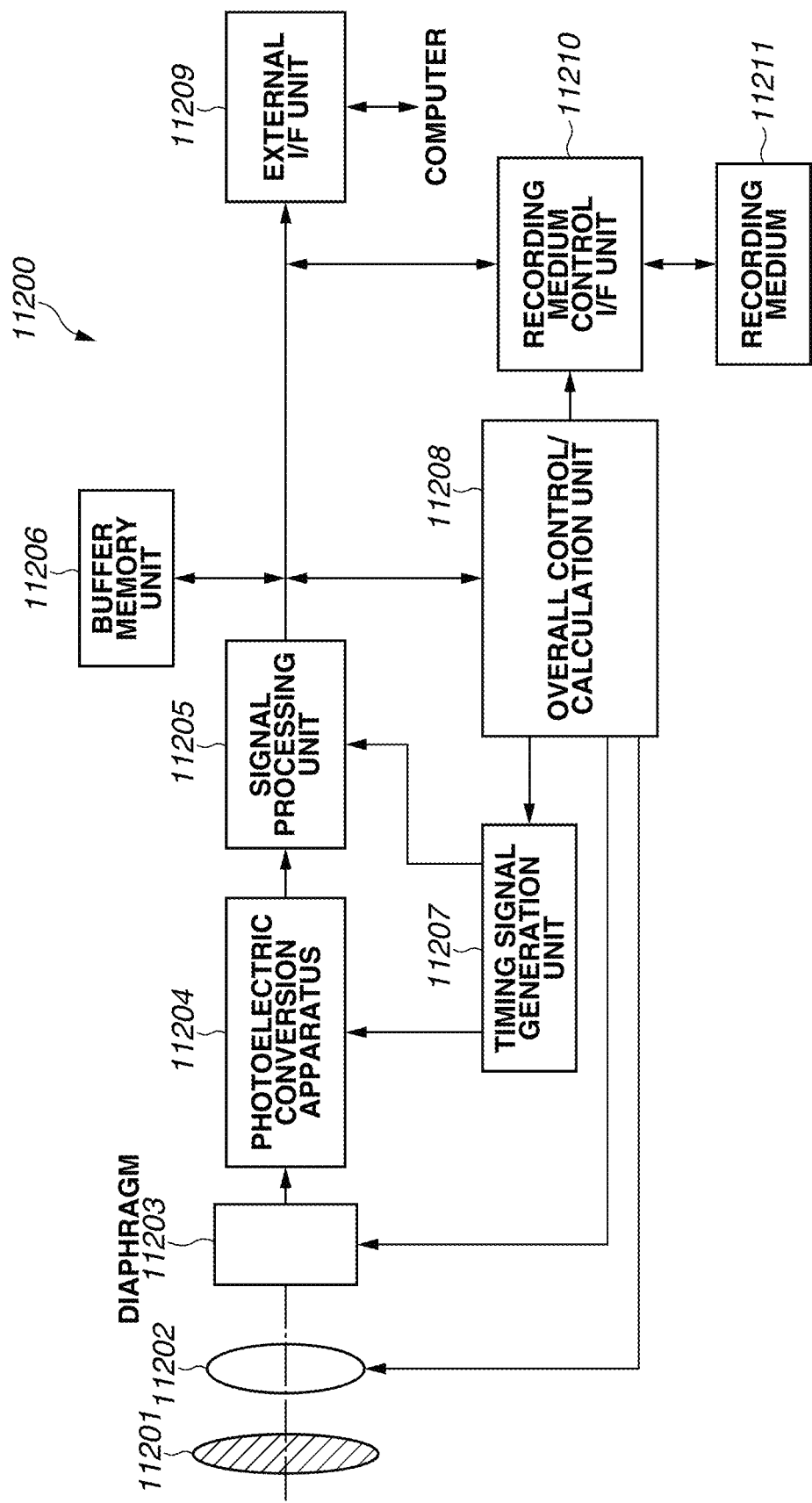
FIG. 42 is a functional block diagram of a photoelectric conversion system according to an eighteenth exemplary embodiment.

FIG. 42 is a block diagram illustrating a configuration of a photoelectric conversion system 11200 according to the present exemplary embodiment. The photoelectric conversion system 11200 according to the present exemplary embodiment includes a photoelectric conversion apparatus 11204. Here, any of the photoelectric conversion apparatuses described in the above-described exemplary embodiments can be applied as the photoelectric conversion apparatus 11204. The photoelectric conversion system 11200 can be used as an image capturing system, for example. Specific examples of image capturing systems include a digital still camera, a digital camcorder, and a monitoring camera. FIG. 42 illustrates an example in which a digital still camera is used as the photoelectric conversion system 11200.

The photoelectric conversion system 11200 exemplified in FIG. 42 includes a photoelectric conversion apparatus 11204, and a lens 11202 that forms an optical image of a subject on the photoelectric conversion apparatus 11204. The photoelectric conversion system 11200 further includes a diaphragm 11203 for varying an amount of light passing through the lens 11202, and a barrier 11201 for protecting the lens 11202. The lens 11202 and the diaphragm 11203 serve as an optical system that collects light onto the photoelectric conversion apparatus 11204.

The photoelectric conversion system 11200 further includes a signal processing unit 11205 that processes an output signal output from the photoelectric conversion apparatus 11204. The signal processing unit 11205 performs various types of correction and compression on an input signal as necessary and performs a signal processing operation of outputting the input signal. The photoelectric conversion system 11200 further includes a buffer memory unit 11206 for temporarily storing image data, and an external interface unit (external I/F unit) 11209 for communicating with an external computer. The photoelectric conversion system 11200 further includes a recording medium 11211, such as a semiconductor memory, for recording therein or reading therefrom captured image data, and a recording medium control interface unit (recording medium control I/F unit) 11210 for performing recording onto or readout from the recording medium 11211. The recording medium 11211 may be built into the photoelectric conversion system 11200 or may be detachably attached to the photoelectric conversion system 11200. Communication from the recording medium control I/F unit 11210 to the recording medium 11211, and communication from the external I/F unit 11209 may be wirelessly performed.

The photoelectric conversion system 11200 further includes an overall control/calculation unit 11208 that performs various types of calculation and controls the entire operation of the digital still camera, and a timing signal generation unit 11207 that outputs various timing signals to the photoelectric conversion apparatus 11204 and the signal processing unit 11205. The timing signals may be input from the outside. The photoelectric conversion system 11200 may be required to include at least the photoelectric conversion apparatus 11204 and the signal processing unit 11205 that processes an output signal output from the photoelectric conversion apparatus 11204. The overall control/calculation unit 11208 and the timing signal generation unit 11207 may be configured to execute a part or all of control functions of the photoelectric conversion apparatus 11204.

The photoelectric conversion apparatus 11204 outputs an imaging signal to the signal processing unit 11205. The signal processing unit 11205 performs predetermined signal processing on the imaging signal output from the photoelectric conversion apparatus 11204 and outputs image data. The signal processing unit 11205 also generates an image using the imaging signal. The signal processing unit 11205 may also perform distance measurement calculation on a signal output from the photoelectric conversion apparatus 11204. The signal processing unit 11205 and the timing signal generation unit 11207 may be mounted on a photoelectric conversion apparatus. That is, the signal processing unit 11205 and the timing signal generation unit 11207 may be disposed in a substrate in which a pixel is arranged, or may be disposed in another substrate. With an image capturing system using the photoelectric conversion apparatus according to each of the above-described exemplary embodiments, an image capturing system that can acquire a higher-quality image can be realized.

Nineteenth Exemplary Embodiment

Figure 43:
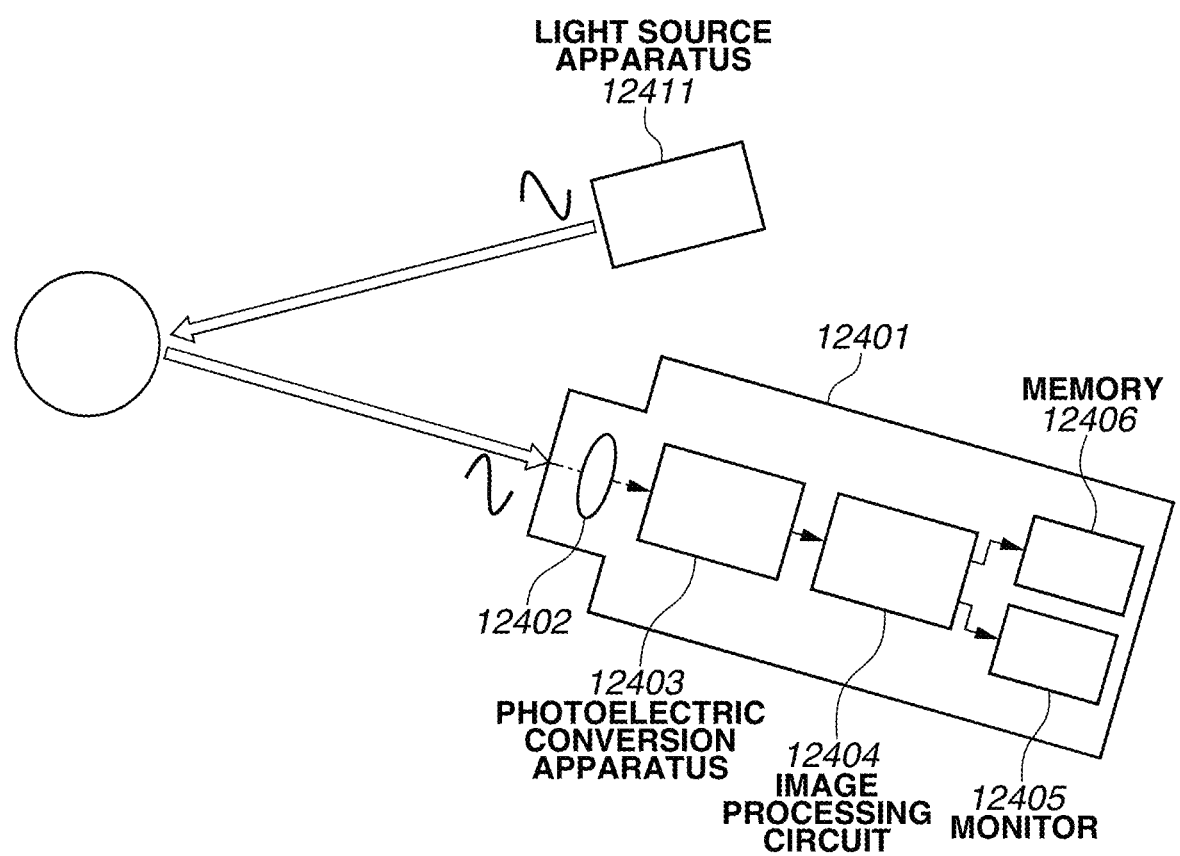
FIG. 43 is a functional block diagram of a distance sensor according to a nineteenth exemplary embodiment.

FIG. 43 is a block diagram illustrating a configuration example of a distance image sensor that is an electronic device using the photoelectric conversion apparatus described in the above-described exemplary embodiment.

As illustrated in FIG. 43, a distance image sensor 12401 includes an optical system 12402, a photoelectric conversion apparatus 12403, an image processing circuit 12404, a monitor 12405, and a memory 12406. The distance image sensor 12401 acquires a distance image corresponding to a distance from a subject by receiving light (modulated light or pulse light) that has been projected from a light source apparatus 12411 toward a subject and reflected on a front surface of the subject.

The optical system 12402 includes one or more lenses and forms an image on a light receiving surface (sensor portion) of the photoelectric conversion apparatus 12403 by guiding image light (incident light) from the subject to the photoelectric conversion apparatus 12403.

The photoelectric conversion apparatus according to any of the above exemplary embodiments is applied as the photoelectric conversion apparatus 12403, and a distance signal indicating a distance obtained from a light receiving signal output from the photoelectric conversion apparatus 12403 is supplied to the image processing circuit 12404.

The image processing circuit 12404 performs image processing to construct a distance image based on the distance signal supplied from the photoelectric conversion apparatus 12403. Then, the distance image (image data) obtained by the image processing is supplied to the monitor 12405 and displayed on the monitor 12405, or supplied to the memory 12406 and stored (recorded) in the memory 12406.

Application of the above-described photoelectric conversion apparatus to the distance image sensor 12401 having the above-described configuration leads to achievement of acquiring a more accurate distance image, for example, in accordance with the improved characteristic of pixels.

Twentieth Exemplary Embodiment

The technique according to the present disclosure (the present technique) can be applied to various products. For example, the technique according to the present disclosure may be applied to an endoscopic operation system.

Figure 44:
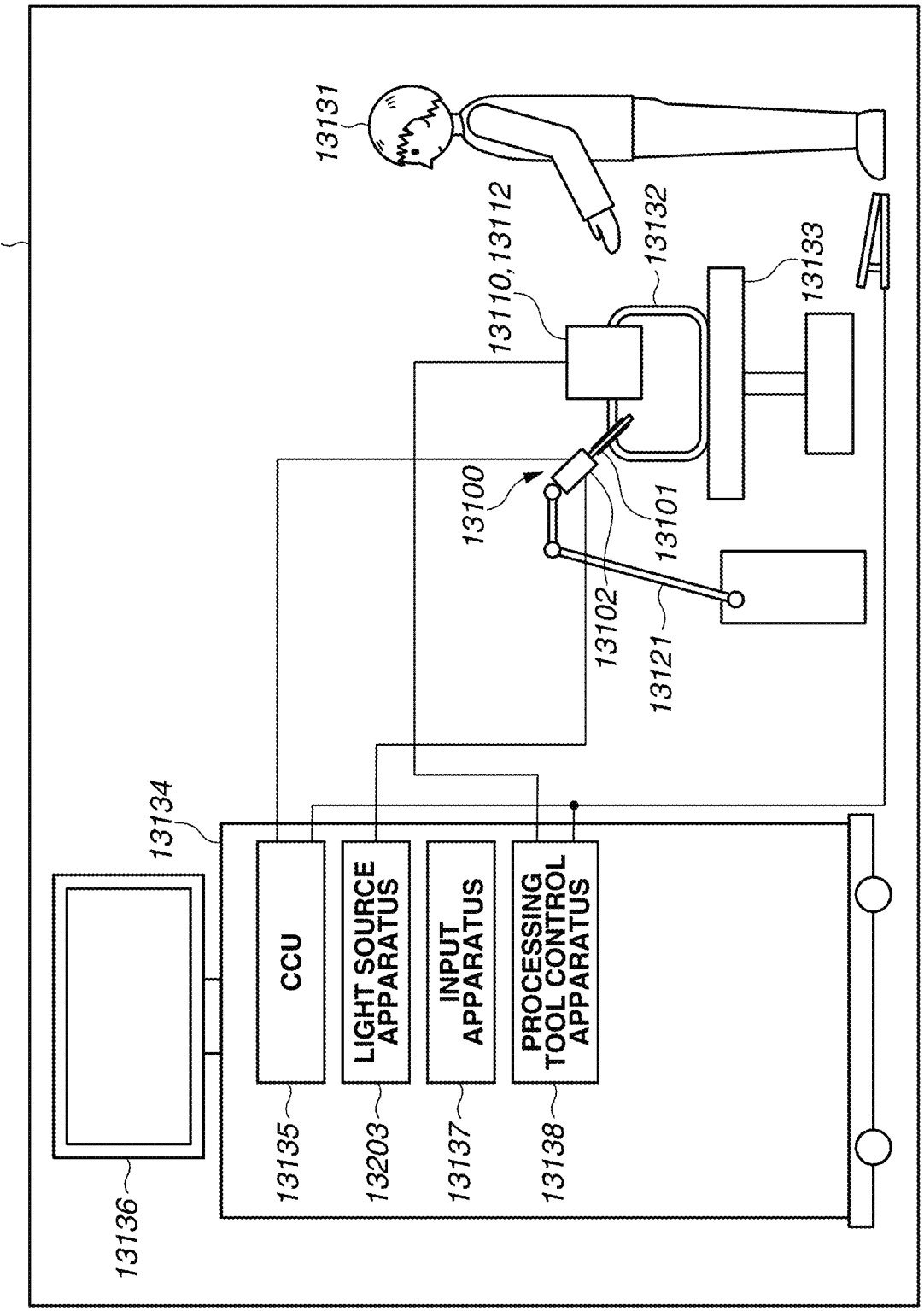
FIG. 44 is a functional block diagram of an endoscopic operation system according to a twentieth exemplary embodiment.

FIG. 44 is a diagram illustrating an example of a schematic configuration of an endoscopic operation system to which the technique according to the present disclosure (the present technique) can be applied.

FIG. 44 illustrates a state in which an operator (doctor) 13131 performs an operation on a patient 13132 lying on a patient bed 13133 by using an endoscopic operation system 13003. As illustrated in FIG. 44, the endoscopic operation system 13003 includes an endoscope 13100, a surgical tool 13110, and a cart 13134 equipped with various apparatuses for an endoscopic operation.

The endoscope 13100 includes a lens barrel 13101 having a part to be inserted into a body cavity of the patient 13132 by a predetermined length from its front end, and a camera head 13102 connected to the base end of the lens barrel 13101. While, in the example illustrated in FIG. 44, the endoscope 13100 is configured as a rigid scope including the lens barrel 13101 having a rigid structure is illustrated, the endoscope 13100 may be configured as a flexible scope including a flexible lens barrel.

An opening portion into which an objective lens is fitted is disposed at the front end of the lens barrel 13101. A light source apparatus 13203 is connected to the endoscope 13100, and light generated by the light source apparatus 13203 is guided to the front end of the lens barrel 13101 by a light guide extended inside the lens barrel 13101. The light emitted onto an observation target in the body cavity of the patient 13132 via the objective lens. The endoscope 13100 may be a forward-viewing endoscope or may be a side-viewing endoscope or a lateral view endoscope.

An optical system and a photoelectric conversion apparatus are disposed inside the camera head 13102. Reflected light (observation light) from the observation target is collected on the photoelectric conversion apparatus by the optical system. The observation light is photoelectrically converted by the photoelectric conversion apparatus, and an electric signal corresponding to the observation light, i.e., an image signal corresponding to an observed image is generated. The photoelectric conversion apparatus described in each of the above exemplary embodiments can be used as the photoelectric conversion apparatus. The image signal is transmitted to a camera control unit (CCU) 13135 as RAW data.

The CCU 13135 includes a central processing unit (CPU) or a graphics processing unit (GPU), and comprehensively controls operations of the endoscope 13100 and a display device 13136. Further, the CCU 13135 receives an image signal from the camera head 13102 and performs various types of image processing for displaying an image based on the image signal, such as development processing (demosaic processing), for example, on the image signal.

Based on the control from the CCU 13135, the display device 13136 displays an image based on an image signal subjected to the image processing performed by the CCU 13135.

The light source apparatus 13203 includes a light source, such as a light emitting diode (LED), for example, and supplies emission light for image capturing of an operation site to the endoscope 13100.

An input apparatus 13137 is an input interface for the endoscopic operation system 13003. A user can input various types of information and instructions to the endoscopic operation system 13003 via the input apparatus 13137.

A processing tool control apparatus 13138 controls driving of an energy processing tool 13112 for cauterizing or incising a tissue, or sealing blood vessels.

The light source apparatus 13203 that supplies emission light for image capturing of an operative site to the endoscope 13100 can include a white light source including an LED, a laser light source, or a combination of these, for example. In a case of a white light source including a combination of RGB laser light sources, output intensity and an output timing of each color (each wavelength) can be controlled highly accurately, and thus white balance of a captured image can be adjusted in the light source apparatus 13203. In this case, laser light is emitted from each RGB laser light source onto an observation target in a time division manner, and the driving of an image sensor of the camera head 13102 is controlled in synchronization with the emission timing, whereby an image corresponding to each of RGB can also be captured in a time division manner. According to this method, a color image can be obtained without a color filter in the image sensor.

The driving of the light source apparatus 13203 may be controlled in such a manner that the intensity of light to be output is changed every predetermined time. Images are acquired in a time division manner by controlling the driving of the image sensor of the camera head 13102 in synchronization with the change timing of the light intensity, and the images are combined, whereby a high dynamic range image without blocked up shadows and clipped whites is generated.

The light source apparatus 13203 may be configured to supply light in a predetermined wavelength band adapted to special light observation. In the special light observation, for example, wavelength dependency of light absorption in body tissues is utilized. Specifically, light in a narrower band than emission light (i.e., white light) in normal observation is emitted to capture an image of a predetermined tissue, such as blood vessels in a superficial layer of a mucous membrane, with high contrast. Alternatively, in the special light observation, fluorescent observation to obtain an image with fluorescent light generated by emitting excitation light may be performed. In the fluorescent observation, fluorescent light from a body tissue is observed by emitting excitation light onto the body tissue, or a fluorescent image is obtained by locally injecting reagent, such as indocyanine green (ICG), into a body tissue and emitting excitation light suitable for a fluorescence wavelength of the reagent onto the body tissue. The light source apparatus 13203 can be configured to supply narrow-band light and/or excitation light adapted to such special light observation.

Twenty-First Exemplary Embodiment

Figure 45A:
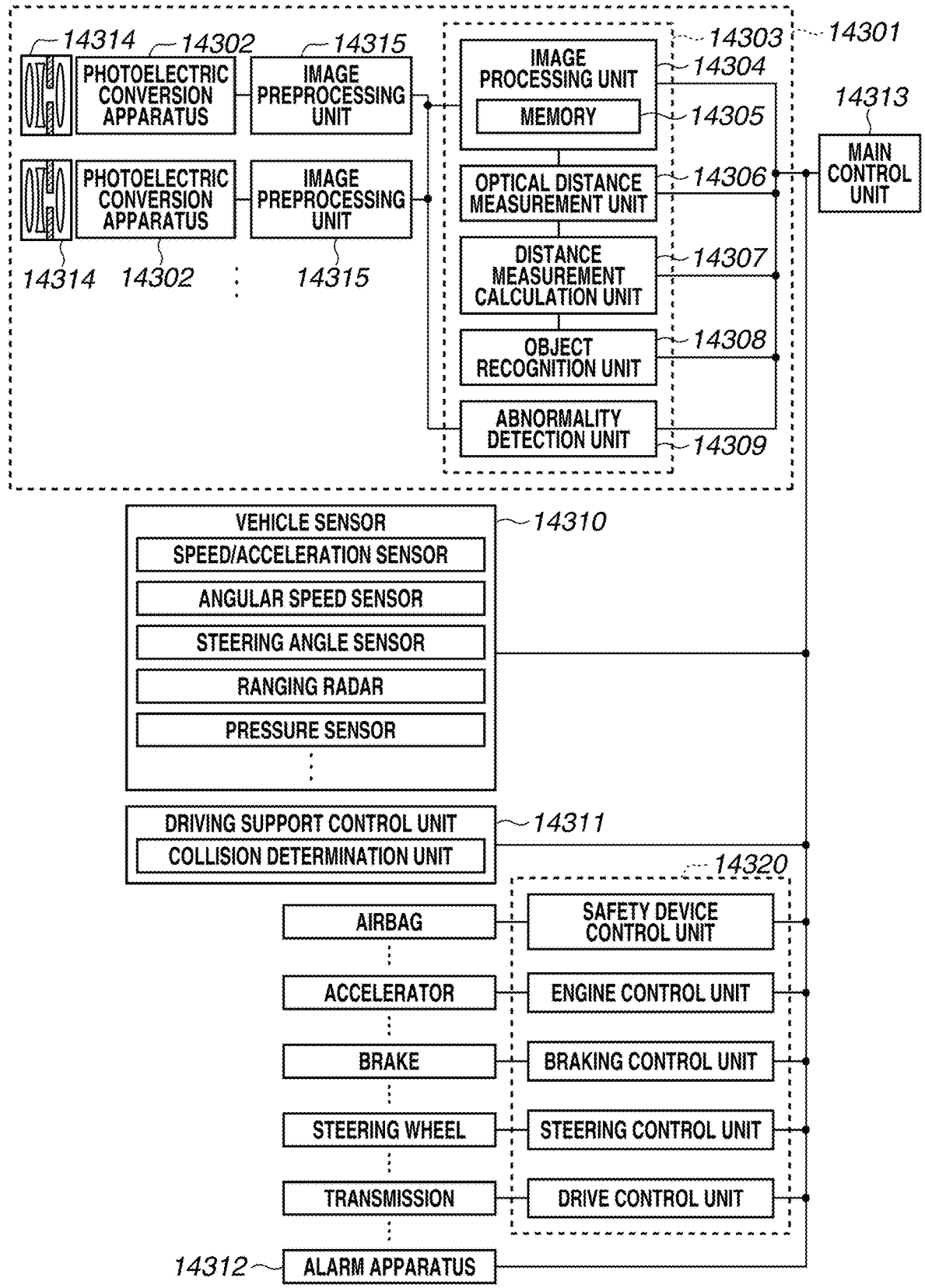
FIG. 45A is a diagram of a photoelectric conversion system and a movable body according to a twenty-first exemplary embodiment.

A photoelectric conversion system and a movable body according to the present exemplary embodiment will be described with reference to FIGS. 45A, 45B, 46A, and 46B. FIGS. 45A and 45B are schematic diagrams illustrating a configuration example of a photoelectric conversion system and a movable body according to a twenty-first exemplary embodiment. In the present exemplary embodiment, an in-vehicle camera will be described as an example of the photoelectric conversion system.

FIGS. 45A and 45B illustrate an example of a vehicle system and a photoelectric conversion system that is installed in the vehicle system and performs image capturing. A photoelectric conversion system 14301 includes photoelectric conversion apparatuses 14302, image preprocessing units 14315, an integrated circuit 14303, and optical systems 14314. The optical system 14314 forms an optical image of a subject on the photoelectric conversion apparatus 14302. The photoelectric conversion apparatus 14302 converts the optical image of the subject that has been formed by the optical system 14314 into an electric signal. The photoelectric conversion apparatus 14302 is the photoelectric conversion apparatus of any of the above-described exemplary embodiments. The image preprocessing unit 14315 performs predetermined signal processing on a signal output from the photoelectric conversion apparatus 14302. The function of the image preprocessing unit 14315 may be incorporated into the photoelectric conversion apparatus 14302. In the photoelectric conversion system 14301, at least two sets each including the optical system 14314, the photoelectric conversion apparatus 14302, and the image preprocessing unit 14315 are disposed, and output from the image preprocessing unit 14315 of each set is input to the integrated circuit 14303.

The integrated circuit 14303 is an integrated circuit that is intended for image capturing systems and includes an image processing unit 14304 including a memory 14305, an optical distance measurement unit 14306, a distance measurement calculation unit 14307, an object recognition unit 14308, and an abnormality detection unit 14309. The image processing unit 14304 performs image processing, such as development processing and defect correction, on an output signal of the image preprocessing unit 14315. The memory 14305 is a primary storage of captured images and stores a defect position of an image capturing pixel. The optical distance measurement unit 14306 performs focusing and distance measurement of a subject. The distance measurement calculation unit 14307 calculates distance measurement information from a plurality of pieces of image data acquired by a plurality of photoelectric conversion apparatuses 14302. The object recognition unit 14308 recognizes a subject, such as a vehicle, a road, a sign, or a person. In response to the abnormality detection unit 14309 detecting an abnormality of the photoelectric conversion apparatus 14302, the abnormality detection unit 14309 issues an alarm indicating the abnormality to a main control unit 14313.

The integrated circuit 14303 may be implemented by dedicatedly-designed hardware, by a software module, or by the combination of these. Alternatively, the integrated circuit 14303 may be implemented by a field programmable gate array (FPGA) or an application specific integrated circuit (ASIC), or by the combination of these.

The main control unit 14313 comprehensively controls operations of the photoelectric conversion system 14301, a vehicle sensor 14310, a control unit 14320, and the like. In a case of a configuration without the main control unit 14313, the photoelectric conversion system 14301, the vehicle sensor 14310, and the control unit 14320 may individually include communication interfaces, and the photoelectric conversion system 14301, the vehicle sensor 14310, and the control unit 14320 may individually perform transmission and reception of control signals via a communication network (for example, controller area network (CAN) standard).

The integrated circuit 14303 has a function of receiving control signals from the main control unit 14313 or transmitting control signals and setting values to the photoelectric conversion apparatus 14302 by a control unit of itself.

The photoelectric conversion system 14301 is connected to the vehicle sensor 14310 and detects an own vehicle running state, such as a vehicle speed, a yaw rate, or a steering angle, and an own vehicle external environment, and states of other vehicles and obstacles. The vehicle sensor 14310 also serves as a distance information acquisition unit that acquires distance information indicating a distance from a target object. The photoelectric conversion system 14301 is also connected to a driving support control unit 14311 that performs various types of driving support, such as automatic steering, automatic circumambulation, and a collision prevention function. In particular, as for a collision determination function, based on detection results of photoelectric conversion system 14301 and the vehicle sensor 14310, collision with another vehicle or an obstacle is estimated and determined. With this configuration, in a case where collision is estimated, avoidance control is performed, and a safety device is activated when collision occurs.

The photoelectric conversion system 14301 is also connected to an alarm apparatus 14312 that issues an alarm based on a determination result obtained by a collision determination unit to a driver. For example, in a case where a determination result obtained by the collision determination unit indicates high collision likelihood, the main control unit 14313 performs vehicle control to avoid collision or reduce damages by braking, releasing an accelerator, or suppressing engine output. The alarm apparatus 14312 issues an alarm to a user by sounding an alarm, displaying warning information on a display unit screen of a car navigation system or a meter panel, or vibrating a seatbelt or a steering wheel.

In the present exemplary embodiment, the photoelectric conversion system 14301 captures an image of the periphery of the vehicle such as the front or the rear, for example. FIG. 45B illustrates an arrangement example of the photoelectric conversion system 14301 that captures an image of the vehicle front.

Two photoelectric conversion apparatuses 14302 are disposed in an anterior part of a vehicle 14300. Specifically, the two photoelectric conversion apparatuses 14302 are line-symmetrically arranged with respect to a symmetrical axis which is equivalent to a center line with respect to a traveling direction or an external form (for example, vehicle width) of the vehicle 14300. This a desirable configuration to acquire distance information between the vehicle 14300 and a subject target object and perform determination of collision likelihood. In addition, the photoelectric conversion apparatuses 14302 are disposed at positions not blocking a viewing field of a driver visually checking an external situation of the vehicle 14300 from a driver's seat. The alarm apparatus 14312 is desirably disposed at a position where the alarm apparatus 14312 easily enter the viewing field of the driver.

In the present exemplary embodiment, the description has been given of the control to avoid a collision with another vehicle, but the photoelectric conversion system 14301 is also applicable to control for autonomous driving to follow another vehicle or for autonomous driving to avoid a deviation from a lane. Furthermore, the photoelectric conversion system 14301 can be applied to a movable body (moving apparatus), such as a vessel, an aircraft, or an industrial robot, for example, aside from a vehicle such as an automobile. Moreover, in addition to a movable body, the photoelectric conversion system 14301 can be applied to a device that extensively uses object recognition, such as an intelligent transport system (ITS).

The photoelectric conversion apparatus according to an exemplary embodiment of the present disclosure may be configured to further acquire various types of information, such as distance information.

Twenty-Second Exemplary Embodiment

Figure 46A:
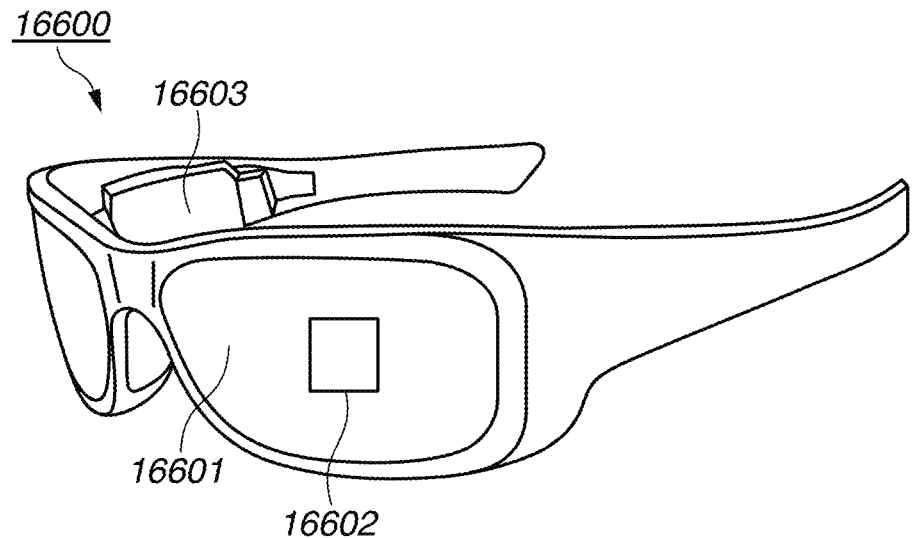
FIG. 46A is a diagram illustrating eyeglasses according to a twenty-second exemplary embodiment.

FIG. 46A illustrates eyeglasses 16600 (smart glasses) as an application example. The eyeglasses 16600 include a photoelectric conversion apparatus 16602. The photoelectric conversion apparatus 16602 is the photoelectric conversion apparatus described in any of the above-described exemplary embodiments. On the back surface side of a lens 16601, a display device including a light emission device, such as an organic light emitting diode (OLED) or an LED, may be disposed. The number of photoelectric conversion apparatuses 16602 may be one or plural. In addition, a plurality of types of photoelectric conversion apparatuses 16602 may be used in combination. An arrangement position of the photoelectric conversion apparatus 16602 is not limited to the position illustrated in FIG. 46A.

The eyeglasses 16600 further include a control apparatus 16603. The control apparatus 16603 functions as a power source that supplies power to the photoelectric conversion apparatus 16602 and the above-described display device. The control apparatus 16603 also controls operations of the photoelectric conversion apparatus 16602 and the display device. In the lens 16601, an optical system for condensing light to the photoelectric conversion apparatus 16602 is formed.

Figure 46B:
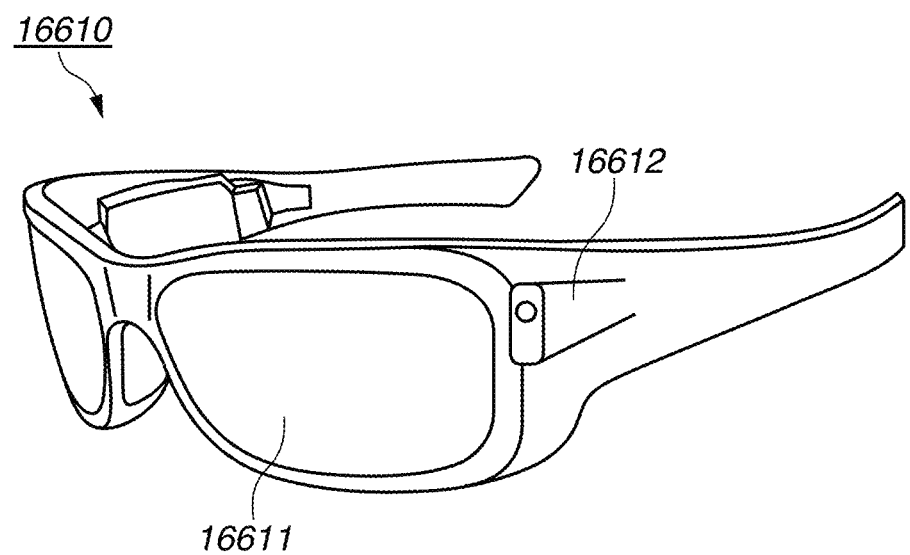
FIG. 46B is a diagram illustrating the eyeglasses according to the twenty-second exemplary embodiment.

FIG. 46B illustrates eyeglasses 16610 (smart glasses) as an application example. The eyeglasses 16610 include a control apparatus 16612, and the control apparatus 16612 is equipped with a photoelectric conversion apparatus equivalent to the photoelectric conversion apparatus 16602, and a display device. In a lens 16611, an optical system for projecting light emitted from the photoelectric conversion apparatus and the display device in the control apparatus 16612 is formed, and an image is projected onto the lens 16611. The control apparatus 16612 functions as a power source that supplies power to the photoelectric conversion apparatus and the display device and controls operations of the photoelectric conversion apparatus and the display device. The control apparatus 16612 may include a line of sight detection unit that detects a line of sight of a wearer (user). Infrared light may be used for the detection of a line of sight. An infrared light emission unit emits infrared light onto an eyeball of a user looking at a displayed image. An imaging unit including a light receiving element detects reflected light of the emitted infrared light that has been reflected from the eyeball, whereby a captured image of the eyeball is obtained. A reduction unit for reducing light from the infrared light emission unit to a display unit in a planar view is disposed so that a decline in image quality is suppressed.

A captured image of an eyeball obtained by the image capturing using infrared light is used to detect a line of sight of the user with respect to a displayed image. Any known method can be applied to the line of sight detection using a captured image of an eyeball. As an example, a line of sight detection method based on a Purkinje image obtained by reflection of emission light on a cornea can be used.

More specifically, a line of sight detection process based on the pupil center corneal reflection method is performed. A line of sight vector representing the direction (rotational angle) of an eyeball is calculated using the pupil center corneal reflection method, based on an image of a pupil and a Purkinje image that are included in a captured image of the eyeball, whereby a line of sight of the user is detected.

The display device of the present exemplary embodiment may include the photoelectric conversion apparatus including a light receiving element, and a displayed image on the display device may be controlled based on line of sight information on the user from the photoelectric conversion apparatus.

Specifically, in the display device, a first field of view region gazed at by the user, and a second field of view region other than the first field of view region are determined based on the line of sight information. The first field of view region and the second field of view region may be determined by a control apparatus of the display device, or the display device may receive the first field of view region and the second field of view region determined by an external control apparatus. In a display region of the display device, a display resolution of the first field of view region may be controlled to be higher than a display resolution of the second field of view region. More specifically, a resolution of the second field of view region may be set lower than a resolution of the first field of view region.

In addition, the display region includes a first display region and a second display region different from the first display region. Based on the line of sight information, a region with high priority may be determined from the first display region and the second display region. The first display region and the second display region may be determined by the control apparatus of the display device, or the display device may receive the first display region and the second display region determined by an external control apparatus. Control may be performed in such a manner that a resolution of a region with high priority is controlled to be higher than a resolution of a region other than the region with high priority. In other words, a resolution of a region with relatively-low priority may be set to a low resolution.

Artificial intelligence (AI) may be used for determination of the first field of view region and the region with high priority. The AI may be a model configured to estimate an angle of a line of sight and a distance from a target object existing at the end of the line of sight, from an image of an eyeball by using training data including an image of the eyeball and a direction in which the eyeball in the image actually gives a gaze. An AI program may be included in the display device, the photoelectric conversion apparatus, or an external apparatus. In a case where an external apparatus includes an AI program, the AI program is transmitted to the display device via communication.

In a case where display control is performed based on line of sight detection, the present disclosure can be suitably applied to smart glasses further including a photoelectric conversion apparatus that captures an image of the outside. The smart glasses can display external information obtained by image capturing, in real time.

Other Exemplary Embodiments

Although the exemplary embodiments have been described above, the present disclosure is not limited to the exemplary embodiments, and various modifications and variations are possible. The exemplary embodiments are mutually applicable. That is, a part of one exemplary embodiment can be replaced with a part of the other exemplary embodiment, and a part of one exemplary embodiment can be added to a part of the other exemplary embodiment. Further, a part of an exemplary embodiment may be deleted.

The present disclosure is not limited to the above-described exemplary embodiments, and various modifications and variations can be made without departing from the spirit and scope of the present disclosure. Accordingly, the following claims are appended to disclose the scope of the present disclosure.

According to an exemplary embodiment of the present disclosure, a specific configuration of a photoelectric conversion apparatus having a structure including three or more layers including avalanche photodiodes can be proposed.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

The invention claimed is:

1. A photoelectric conversion apparatus comprising:
a first substrate including a first semiconductor layer including a plurality of photoelectric conversion units and a first wiring structure;
a second substrate including a second semiconductor layer including a plurality of pixel circuits disposed to respectively correspond to the plurality of photoelectric conversion units, and a second wiring structure; and
a third substrate including a third semiconductor layer including a signal processing circuit configured to process output signals from the plurality of pixel circuits, and a third wiring structure;
wherein the plurality of photoelectric conversion units each includes an avalanche photodiode,
wherein the first substrate and the second substrate are stacked in such a manner that the first wiring structure and the second wiring structure are disposed between the first semiconductor layer and the second semiconductor layer,
wherein the second substrate and the third substrate are stacked in such a manner that the third wiring structure is disposed between the second semiconductor layer and the third semiconductor layer, and
wherein a first through wire penetrating through the third semiconductor layer and a semiconductor element overlapping the first through wire in a planar view are disposed.

2. The photoelectric conversion apparatus according to claim 1, further comprising
a second through wire penetrating through the second semiconductor layer,
wherein the second through wire is a wire configured to electrically connect a wire included in the second wiring structure, and a wire included in the third wiring structure.

3. The photoelectric conversion apparatus according to claim 2, wherein the second through wire is wire penetrating through the third semiconductor layer.

4. The photoelectric conversion apparatus according to claim 2, wherein the second through wire is a wire formed toward the third wiring structure from a surface of the third semiconductor layer that is on a side opposite to a side with the third wiring structure.

5. The photoelectric conversion apparatus according to claim 2, wherein the second through wire is a wire configured to input signals output from the plurality of pixel circuits of the second substrate to the signal processing circuit of the third substrate.

6. The photoelectric conversion apparatus according to claim 2, wherein the second through wire is a wire configured to supply a drive voltage for the plurality of pixel circuits of the second substrate and a drive voltage for the signal processing circuit of the third substrate.

7. The photoelectric conversion apparatus according to claim 1, further comprising:
a third through wire penetrating through the third semiconductor layer and the second semiconductor layer, wherein the third through wire is a wire configured to supply a voltage to a wire included in the second wiring structure.

8. The photoelectric conversion apparatus according to claim 7, further comprising:
a fourth through wire penetrating through the second semiconductor layer,
wherein the fourth through wire is a wire configured to supply a voltage to a wire included in the third wiring structure, and
wherein the third through wire and the fourth through wire are not electrically connected.

9. The photoelectric conversion apparatus according to claim 1, further comprising
a pixel region in which a plurality of pixels including the plurality of photoelectric conversion units are disposed,
wherein the first wiring structure includes a plurality of first bonding portions,
wherein the second wiring structure includes a plurality of second bonding portions,
wherein a plurality of metal bonding portions are formed by respectively bonding the plurality of first bonding portions and the plurality of second bonding portions, and
wherein the plurality of metal bonding portions disposed in the pixel region are disposed to respectively correspond to the plurality of photoelectric conversion units in a planar view.

10. The photoelectric conversion apparatus according to claim 1, further comprising
a pixel region in which a plurality of pixels including the plurality of photoelectric conversion units are disposed, and a peripheral region disposed between the pixel region and a chip end of the photoelectric conversion apparatus,
wherein the first wiring structure includes a plurality of first bonding portions,
wherein the second wiring structure includes a plurality of second bonding portions,
wherein a plurality of metal bonding portions are portions formed by respectively bonding the plurality of first bonding portions and the plurality of second bonding portions, and
wherein the plurality of metal bonding portions are disposed in the peripheral region.

11. The photoelectric conversion apparatus according to claim 1, further comprising
a pixel region in which a plurality of pixels including the plurality of photoelectric conversion units are disposed,
wherein the second wiring structure includes a plurality of third bonding portions,
wherein the third wiring structure includes a plurality of fourth bonding portions, and
wherein a plurality of metal bonding portions are formed by respectively bonding the plurality of third bonding portions and the plurality of fourth bonding portions.

12. The photoelectric conversion apparatus according to claim 11,
wherein at least one of the plurality of third bonding portions electrically connects with a wire of the first wiring structure via a third through wire penetrating through the second semiconductor layer, and
wherein an insulator is disposed between the third through wire and the second semiconductor layer.

13. The photoelectric conversion apparatus according to claim 1, wherein a first connection number as a number of wires connecting a wire of the first wiring structure and a wire of the second wiring structure via bonded surfaces of the first substrate and the second substrate is larger than a second connection number as a number of wires connecting a wire of the second wiring structure and a wire of the third wiring structure via bonded surfaces of the second substrate and the third substrate.

14. The photoelectric conversion apparatus according to claim 13, further comprising:
a pixel region in which the plurality of photoelectric conversion units are disposed,
wherein, in the pixel region, the first connection number is larger than the second connection number.

15. The photoelectric conversion apparatus according to claim 1, further comprising:
a time measurement circuit,
wherein the time measurement circuit is disposed in the second substrate, and the time measurement circuit is shared by the plurality of photoelectric conversion units.

16. The photoelectric conversion apparatus according to claim 15, wherein the time measurement circuit shared by the plurality of photoelectric conversion units and at least part of the plurality of photoelectric conversion units sharing the time measurement circuit are disposed with overlapping in a planar view.

17. The photoelectric conversion apparatus according to claim 1, wherein the semiconductor element is a photoelectric conversion element.

18. The photoelectric conversion apparatus according to claim 1, wherein the semiconductor element is a protection element.

19. A photoelectric conversion system comprising:
the photoelectric conversion apparatus according to claim 1; and
a signal processing unit configured to process a signal output from the photoelectric conversion apparatus.

20. A movable body comprising:
the photoelectric conversion apparatus according to claim 1; and
a distance information acquisition unit configured to acquire distance information on a distance from a target object, from distance measurement information based on a signal from the photoelectric conversion apparatus,
wherein a control unit configured to control the movable body based on the distance information is further disposed.

* * * * *